US012718774B2

(12) United States Patent
Wu et al.

(10) Patent No.: US 12,718,774 B2
(45) **Date of Patent: *Aug. 25, 2026**

(54) DISPLAY SUBSTRATE AND DISPLAY DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Tong Wu, Beijing (CN); Hongli Wang, Beijing (CN); Pan Li, Beijing (CN); Xinxin Wang, Beijing (CN); Li Jia, Beijing (CN); Xinyin Wu, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 19/279,340

(22) Filed: Jul. 24, 2025

(65) Prior Publication Data

US 2025/0349266 A1 Nov. 13, 2025

Related U.S. Application Data

(63) Continuation of application No. 18/728,251, filed as application No. PCT/CN2023/071596 on Jan. 10, 2023, now Pat. No. 12,400,607.

(30) Foreign Application Priority Data

Jan. 11, 2022 (CN) ......................... 202210025026.6

(51) Int. Cl.
*G09G 3/3291* (2016.01)
*H10K 59/121* (2023.01)
(Continued)

(52) U.S. Cl.
CPC ....... *G09G 3/3291* (2013.01); *H10K 59/1216* (2023.02); *H10K 59/122* (2023.02);
(Continued)

(58) Field of Classification Search
CPC .. H10K 59/1216; H10K 59/131; H10K 59/00; H10K 59/122; G09G 3/3291;
(Continued)

(56) References Cited

U.S. PATENT DOCUMENTS 6,459,495 B1 * 10/2002 Silverbrook ......... G06K 7/1417 358/520
2004/0051724 A1 * 3/2004 Elliott .................. G09G 3/2003 345/589
(Continued)

FOREIGN PATENT DOCUMENTS

CN 113257885 A * 8/2021 ........... G09G 3/3225
CN 113728439 A * 11/2021 ......... H10K 59/1315
(Continued)

*Primary Examiner* — Shaheda A Abdin
(74) *Attorney, Agent, or Firm* — LEASON ELLIS LLP

(57) ABSTRACT

Provided are a display substrate and a display device. The display substrate includes: a base substrate and a plurality of sub-pixels on the base substrate; each sub-pixel includes: a pixel circuit including a storage capacitor including a first electrode plate and a second electrode plate; a light-emitting element; and a pixel definition layer. The sub-pixels include a plurality of openings, orthographic projections of the opening and the second electrode plate on the base substrate are overlapped; the second electrode plate includes a first edge and a second edge extending in the first direction; the opening includes a first edge and a second edge extending in the first direction; the first edge of the second electrode plate is closer to the first edge of the opening; the second edge of the second electrode plates is closer to the second edge of the opening.

20 Claims, 31 Drawing Sheets

(51) Int. Cl.
*H10K 59/122* (2023.01)
*H10K 59/131* (2023.01)

(52) U.S. Cl.
CPC ... *H10K 59/131* (2023.02); *G09G 2300/0426* (2013.01); *G09G 2300/0465* (2013.01); *G09G 2300/0842* (2013.01); *G09G 2320/0242* (2013.01); *G09G 2320/028* (2013.01)

(58) Field of Classification Search
CPC ..... G09G 2320/028; G09G 2300/0842; G09G 2300/0465; G09G 2320/0242; G09G 2300/0426
See application file for complete search history.

(56) References Cited

U.S. PATENT DOCUMENTS

| | | | | |
|---|---|---|---|---|
| 2016/0351096 | A1* | 12/2016 | Tani | G09G 3/3233 |
| 2017/0263181 | A1* | 9/2017 | Jinta | G09G 3/3233 |
| 2018/0108319 | A1* | 4/2018 | Zuo | G02F 1/136286 |
| 2022/0036829 | A1* | 2/2022 | Jeong | G09G 3/3275 |
| 2022/0123074 | A1* | 4/2022 | Zhang | G09G 3/3233 |

FOREIGN PATENT DOCUMENTS

| | | | | | |
|---|---|---|---|---|---|
| CN | 114038897 | A | * | 2/2022 | H10K 59/00 |
| KR | 20110096176 | A | * | 8/2011 | G09G 3/3648 |

* cited by examiner

DISPLAY SUBSTRATE AND DISPLAY DEVICE

CROSS-REFERENCE TO RELATED APPLICATIONS

This application is a continuation of U.S. application Ser. No. 18/728,251, filed on Jul. 11, 2024, which is a U.S. National Phase Entry of International Application No. PCT/CN2023/071596 filed on Jan. 10, 2023, designating the United States of America and claiming priority to Chinese patent application No. 202210025026.6 filed on Jan. 11, 2022, the entire disclosures of which are hereby incorporated by reference.

TECHNICAL FIELD

Embodiments of the present disclosure relate to a display substrate and a display device.

BACKGROUND

With the rapid development of science and technology, display mediums have become an important part of people's lives. Organic light-emitting diode (OLED) display medium has excellent color and image quality for its self-luminescence characteristics.

SUMMARY

Embodiments of the present disclosure relate to a display substrate and a display device.

The embodiment of the present disclosure provides a display substrate, including: a base substrate and a plurality of sub-pixels arranged on the base substrate. Each of the plurality of sub-pixels includes: a pixel circuit including a storage capacitor, wherein the storage capacitor includes a first electrode plate and a second electrode plate, the first electrode plate is closer to the base substrate than the second electrode plate; and a light-emitting element including a first electrode, a second electrode, and a light-emitting functional layer between the first electrode and the second electrode, wherein the pixel circuit is configured to drive the light-emitting element. The display substrate further includes a pixel definition layer, the plurality of sub-pixels include a plurality of openings each configured to expose at least a portion of the first electrode, each of the plurality of openings is configured to define a light-emitting area of the sub-pixel, wherein an orthographic projection of the opening on the base substrate is overlapped with an orthographic projection of the second electrode plate on the base substrate, the second electrode plate includes a first edge extending along a first direction and a second edge extending along the first direction, and the opening includes a first edge extending along the first direction and a second edge extending along the first direction, the first edge of the second electrode plate is closer to the first edge of the opening than the second edge of the second electrode plate, and the second edge of the second electrode plate is closer to the second edge of the opening than the first edge of the second electrode plate, the plurality of sub-pixels satisfy the following formula:

$\Delta U = |U02 - U01| \leq k \times |Xb - Xa| / KW$, where k is a color cast influence coefficient, $0.009 \leq k \leq 0.03$, $\Delta U < 0.0020$, Xa is a minimum distance between the first edge of the second electrode plate and the first edge of the opening in a second direction, Xb is a minimum distance between the second edge of the second electrode plate and the second edge of the opening in the second direction, the first direction intersects with the second direction; KW is a maximum size of the opening in the second direction, and U01 is a coordinate distance between a chromaticity coordinate point at a first viewing angle and a chromaticity coordinate point at 0-degree viewing angle, U02 is a coordinate distance between a chromaticity coordinate point at a second viewing angle and the chromaticity coordinate point at 0-degree viewing angle, ΔU is an absolute value of a difference between U02 and U01, wherein the chromaticity coordinate point at 0-degree viewing angle is a chromaticity coordinate point at a normal line where a center of the display substrate is located, and the first viewing angle and the second viewing angle are respectively arranged at two opposite sides of the normal line and have a same included angle with respect to the normal line.

For example, $U02 < 0.020$, $U01 < 0.020$, and $\Delta U < 0.0015$.

For example, the first edge of the opening, the first edge of the second electrode plate, the second edge of the second electrode plate, and the second edge of the opening are arranged in sequence along the second direction, and a minimum distance between the first edge of the second electrode plate and the second edge of the second electrode plate in the second direction is Xc, $Xc/Xa > 1.5$ or $Xc/Xb > 1.5$.

For example, the plurality of sub-pixels include a first sub-pixel, a second sub-pixel, and a third sub-pixel, and the first sub-pixel, the second sub-pixel, and the third sub-pixel are arranged in sequence along the second direction.

For example, the first sub-pixel satisfies the following formula:

$$\Delta U1 = |U2 - U1| \leq k1 \times |X2 - X1| / KW1,$$

where k1 is a coefficient, $0.009 \leq k1 \leq 0.02$, X1 is a minimum distance between the first edge of the second electrode plate of the first sub-pixel and the first edge of the opening of the first sub-pixel in the second direction; X2 is a minimum distance between the second edge of the second electrode plate of the first sub-pixel and the second edge of the opening of the first sub-pixel in the second direction, KW1 is a maximum size of the opening of the first sub-pixel in the second direction, U1 is a coordinate distance between a chromaticity coordinate point at the first viewing angle and a chromaticity coordinate point at 0-degree viewing angle of the first sub-pixel, U2 is a coordinate distance between a chromaticity coordinate point at a second viewing angle and the chromaticity coordinate point at 0-degree viewing angle of the first sub-pixel, ΔU1 is an absolute value of a difference between U2 and U1.

For example, the second sub-pixel satisfies the following formula:

$$\Delta U2 = |U4 - U3| \leq k2 \times |X4 - X3| / KW2,$$

where k2 is a coefficient, $0.004 \leq k2 \leq 0.02$, X3 is a minimum distance between the first edge of the second electrode plate of the second sub-pixel and the first edge of the opening of the second sub-pixel in the second direction; X4 is a minimum distance between the second edge of the second electrode plate of the second sub-pixel and the second edge of the opening of the second sub-pixel in the second direction; KW2 is a maximum size of the opening of the second sub-pixel in the second direction, U3 is a coordinate distance between a chromaticity coordinate point at the first viewing angle and the chromaticity coordinate point at 0-degree viewing angle of the second sub-pixel, U4 is a coordinate distance between a chromaticity coordinate point at the second viewing angle and the chromaticity coordinate point at 0-degree viewing angle of the second sub-pixel, ΔU2 is an absolute value of a difference between U4 and U3.

For example, a ratio of k2 to k1 is smaller than 10 and greater than 0.1.

For example, the third sub-pixel satisfies the following formula:

$$\Delta U3 = |U6 - U5| \leq k3 \times |X6 - X5| / KW3,$$

where k3 is a coefficient, 0.01≤k3<0.03, X5 is a minimum distance between the first edge of the second electrode plate of the third sub-pixel and the first edge of the opening of the third sub-pixel in the second direction; X6 is a minimum distance between the second edge of the second electrode plate of the third sub-pixel and the second edge of the opening of the third sub-pixel in the second direction; KW3 is a maximum size of the opening of the third sub-pixel in the second direction, U5 is a coordinate distance between a chromaticity coordinate point at the first viewing angle and a chromaticity coordinate point at 0-degree viewing angle of the third sub-pixel, U6 is a coordinate distance between a chromaticity coordinate point at the second viewing angle and the chromaticity coordinate point at 0-degree viewing angle of the third sub-pixel, ΔU3 is an absolute value of a difference between U6 and U5.

For example, the display substrate further includes: a data line, wherein the data line is configured to provide a data voltage to the pixel circuit, the display substrate further includes: a conductive structure, wherein the conductive structure includes a first signal line and a signal connection line, the conductive structure is configured to provide a voltage signal to the pixel circuit, and the first signal line extends along the second direction, the signal connection line extends along the first direction, the signal connection line is electrically connected to the first signal line, an orthographic projection of at least one of the signal connection line and the data line on the base substrate is overlapped with an orthographic projection of the opening of at least one sub-pixel of the plurality of sub-pixels on the base substrate.

For example, the signal connection line includes at least one of a portion of a first power line extending along the first direction and a portion of an initialization line extending along the first direction.

For example, the display substrate further includes: a second signal line, wherein the second signal line is configured to provide a voltage signal to the pixel circuit, and the second signal line extends along the second direction, an orthographic projection of the second signal line on the base substrate is overlapped with the orthographic projection of the opening of at least one sub-pixel of the plurality of sub-pixels on the base substrate.

For example, the second signal line includes at least one of a portion of a gate line extending along the second direction and a portion of an initialization signal line extending along the second direction.

For example, an overlapping size of the signal connection line and the opening in the second direction is smaller than 10% of a line width of the signal connection line, or, an overlapping size of the data line and the opening in the second direction is smaller than 10% of a line width of the data line.

For example, the display substrate further includes an insulating layer and a via hole penetrating the insulating layer, wherein the via hole includes a first via hole, a second via hole and a third via hole, the first electrodes of the light-emitting elements of the first sub-pixel, the second sub-pixel, and the third sub-pixel respectively pass through the first via hole, the second via hole and the third via hole to be connected to the pixel circuits of the first sub-pixel, the second sub-pixel, and the third sub-pixel respectively, a distance between the first via hole and the second via hole is KX1, and a distance between the second via hole and the third via hole is KX2, wherein a ratio of KX1 to KX2 is 0.75-1.25.

For example, a distance between a symmetry axis of the via hole extending along the first direction and a symmetry axis of the opening closest to the via hole is smaller than 8 microns, wherein the symmetry axis of the opening extends along the first direction; and a diameter of the via hole is 8-17 microns.

For example, the insulating layer includes a passivation layer and a planarization layer, a material of the passivation layer includes an inorganic insulating material, and a material of the planarization layer includes an organic insulating material, and a thickness of the planarization layer is 3-7 microns.

For example, the display substrate satisfies the following formula:

1/k=F1(CW/KW)−F2(DV/KW)+F3(DW/KW), where F1 is a capacitance influence coefficient, F2 is a via hole offset influence coefficient, F3 is a signal line influence coefficient, CW is a maximum size of the second electrode plate of the storage capacitor in the second direction, CW/KW is the proportion of the storage capacitance occupied in the opening, DV is a distance between a symmetry axis of the via hole extending along the first direction and a symmetry axis of the opening closest to the via hole, the symmetry axis of the opening extending along the first direction, DW is a line width of the signal line, and the signal line includes the signal connection line.

For example, the display substrate satisfies the following formula: 1/T=k×(CW−DV+DW)/KW, 1/T is an influence coefficient of color cast alleviation, the first sub-pixel satisfies 1/T1=k1×(CW−DV+DW)/KW, the second sub-pixel satisfies 1/T2=k2×(CW−DV+DW)/KW, the third sub-pixel satisfies 1/T3=k3×(CW−DV+DW)/KW, wherein 1/T1<0.009, 1/T2<0.019, and 1/T3<0.019.

For example, 1/T1<0.009, 1/T2<0.014, and 1/T3<0.019.

For example, 1/T1<0.008, 1/T2<0.003, and 1/T3<0.016.

For example, 0.2<Tx/Ty<6, where Tx is one of T1, T2, and T3, and Ty is one of T1, T2, and T3.

For example, the first sub-pixel satisfies 1/T11=k11×(CW−DV+DW)/KW at an O viewing angle and a −O viewing angle; the first sub-pixel satisfies 1/T12=k12×(CW−DV+DW)/KW at a P viewing angle and a −P viewing angle; 1/T11<0.009, 1/T12<0.008.

For example, |1/T12−1/T11|<0.001.

For example, the second sub-pixel satisfies 1/T21=k21×(CW−DV+DW)/KW at an O viewing angle and a −O viewing angle; the second sub-pixel satisfies 1/T22=k22×(CW−DV+DW)/KW at a P viewing angle and a −P viewing angle; 1/T21<0.014, 1/T22<0.004.

For example, |1/T22−1/T21|<0.010.

For example, 1/T21<0.009, 1/T22<0.003.

For example, the third sub-pixel satisfies 1/T31=k31×(CW−DV+DW)/KW at an O viewing angle and a −O viewing angle; the third sub-pixel satisfies 1/T32=k32×(CW−DV+DW)/KW at a P viewing angle and a −P viewing angle; 1/T31<0.016, 1/T32<0.019.

For example, |1/T32−1/T31|<0.003.

For example, 1/T31<0.012, 1/T32<0.014.

For example, the signal connection line includes a first part, a second part, and a third part, and the first part and the third part are connected by the second part, the first part and the third part are located at a first conductive pattern layer, and the second part is located at a second conductive pattern layer.

For example, the first conductive pattern layer is closer to the base substrate than the second conductive pattern layer.

For example, a width of the second part of the signal connection line in the second direction is greater than a width of one of the first part and the third part of the signal connection line in the second direction.

For example, at least one of the first part and the third part of the signal connection line is not coincident with a centerline of the second part of the signal connection line, wherein the centerline extends in the first direction.

For example, the pixel definition layer includes a plurality of first definition portions and a plurality of second definition portions, the plurality of second definition portions are arranged along the second direction, the second definition portions extend along the first direction, the plurality of first definition portions are arranged in multiple groups, and each group of first definition portions is located between two adjacent second definition portions, the first definition portions extend along the second direction, the first definition portions in each group of first definition portions are arranged along the first direction, and a maximum height of the first definition portion relative to the planarization layer is smaller than a maximum height of the second definition portion relative to the planarization layer, the base substrate includes a display area and a peripheral area located at at least one side of the display area, and an orthographic projection of a part of the data line located in the display area on the base substrate is within an orthographic projection of the second definition portion on the base substrate.

For example, the display substrate includes a second conductive pattern layer and a third conductive pattern layer, wherein the data line includes a portion located on the second conductive pattern layer, and the third conductive pattern layer further includes a first conductive part and a second conductive part, the second conductive pattern layer further includes a third conductive part and a fourth conductive part, the first conductive part and the third conductive part are overlapped with each other in a direction perpendicular to the base substrate and are located at one side of the second definition portion, and the second conductive part and the fourth conductive part are overlapped with each other in the direction perpendicular to the base substrate and are located at the other side of the second definition portion, centerlines of the first conductive part and the third conductive part along the first direction are not coincident, and centerlines of the second conductive part and the fourth conductive part along the first direction are not coincident.

For example, the first conductive part includes a main body portion and slope portions located at two sides of the main body portion, and an orthographic projection of one end of the third conductive part close to the second definition portion on the base substrate is within an orthographic projection of the main body portion of the first conductive part on the base substrate.

For example, the third conductive part includes a main body portion and slope portions located at two sides of the main body portion, and a slope angle of the slope portion of the third conductive part is greater than a slope angle of the slope portion of the first conductive part.

For example, the main body portion of the third conductive part includes a first main body portion and a second main body portion, and an orthographic projection of the first main body portion on the base substrate is overlapped with an orthographic projection of the first conductive part on the base substrate, an orthographic projection of the second main body portion on the base substrate and the orthographic projection of the first conductive part on the base substrate are not overlapped with each other, a distance from a surface of the second main body portion facing away from the base substrate to the base substrate is smaller than a distance from a surface of the first main body portion facing away from the base substrate to the base substrate.

For example, at least one of the third conductive part and the fourth conductive part includes a first sublayer, a second sublayer and a third sublayer, the first sublayer, the second sublayer, and the third sublayer are stacked, and the first sublayer is closer to the base substrate than the third sublayer to the base substrate, and the second sublayer is retracted relative to the first sublayer and the third sublayer.

For example, the display substrate includes a plurality of fan-out lines, wherein the base substrate includes a display area and a peripheral area located at at least one side of the display area, and the data line is connected to one of the plurality of fan-out lines, and the plurality of fan-out lines gradually converge in a direction from a position close to a connection position of the data line and the fan-out line to a position away from the connection position of the data line and the fan-out line, the plurality of fan-out lines extend from the display area to the peripheral area, the plurality of fan-out lines are located in a layer different from that of the data line, and the plurality of fan-out lines are closer to the base substrate than a part of the data line.

For example, the display substrate satisfies the following formula: $1/k=T'(CW-DV+DW)/KW+e^{F4(DH/PH)}$, where T' is a coefficient, and T' is greater than and equal to 20 and smaller than 70, F4 is a coefficient, and F4 is greater than 6 and smaller than 30, where DH is a thickness of the data line, and PH is a thickness of the planarization layer.

For example, the first sub-pixel satisfies $1/k1=T'(CW-DV+DW)/KW+e^{Fa(DH/PH)}$, the second sub-pixel satisfies $1/k2=T'(CW-DV+DW)/KW+e^{Fb(DH/PH)}$, the third sub-pixel satisfies $1/k3=T'(CW-DV+DW)/KW+e^{Fc(DH/PH)}$, 20≤T'≤30, Fa<27, Fb<26, Fc<23.

For example, T'=20, 10<Fa<24.

For example, T'=20, 10<Fb<23.

For example, T'=20, 8<Fc<19.

For example, 0.09<DH/PH<0.16, 20≤T'≤25.

For example, 0.17<DH/PH<0.38, 25≤T'≤30.

For example, the display substrate further includes a data line, a first gate line, a second gate line, a third gate line, a first power line, a first initialization line and a second initialization line, wherein the data line is configured to provide a data voltage to the pixel circuit, the first gate line is configured to provide a scan signal to the pixel circuit, the second gate line is configured to provide a first reset control signal to the pixel circuit, the third gate line is configured to provide a second reset control signal to the pixel circuit, the first power line is configured to provide a first voltage signal to the pixel circuit, the first initialization line is configured to provide a first initialization signal to the pixel circuit, the second initialization line is configured to provide a second initialization signal to the pixel circuit, and the pixel circuit further includes a driving transistor, a data writing transistor, a first reset transistor, and a second reset transistor; a first electrode of the data writing transistor is connected to the data line, a gate of the data writing transistor is connected to the first gate line, and a second electrode of the data writing transistor is connected to a gate of the driving transistor; a first electrode of the first reset transistor is connected to the first initialization line, a second electrode of the first reset transistor is connected to the gate of the driving transistor, and a gate of the first reset transistor is connected to the second gate line; a first electrode of the second reset transistor is connected to the second initialization line, a second electrode of the second reset transistor is connected to the first electrode of the light-emitting element, and a gate of the second reset transistor is connected to the third gate line; the first power line includes a first power signal line extending along the second direction and a first power connection line extending along the first direction, the first power signal line and the first power connection line are connected with each other; the first initialization line includes a first initialization signal line extending along the second direction and a first initialization connection line extending along the first direction, the first initialization signal line and the first initialization connection line are connected with each other; the second initialization line includes a second initialization signal line extending along the second direction and a second initialization connection line extending along the first direction, the second initialization signal line and the second initialization connection line are connected with each other; an orthographic projection of at least one of the first power connection line, the first initialization connection line, and the second initialization connection line on the base substrate is overlapped with the orthographic projection of the opening of the sub-pixel on the base substrate.

The embodiment of the present disclosure further provides a display substrate, including: a base substrate and a plurality of sub-pixels arranged on the base substrate, wherein the plurality of sub-pixels include a plurality of first sub-pixels (R) and a plurality of second sub-pixels (G), and the plurality of sub-pixels are arranged along a first direction or along a second direction, the first direction and the second direction intersect with each other; an active semiconductor layer located on a side of the base substrate; a first conductive pattern layer located at a side of the active semiconductor layer away from the base substrate; a second conductive pattern layer located at a side of the first conductive pattern layer away from the base substrate; a first insulating layer located at a side of the second conductive pattern layer away from the base substrate; and a second insulating layer located at a side of the first insulating layer away from the base substrate, wherein the second conductive pattern layer includes a plurality of conductive elements, and the plurality of conductive elements include a first conductive element corresponding to the first sub-pixel and a second conductive element corresponding to the second sub-pixel; the second insulating layer includes a plurality of openings configured to define effective light-emitting areas of the sub-pixels, and the openings include a first opening corresponding to the first sub-pixel and a second opening corresponding to the second sub-pixel, and the first opening and the second opening have different areas; the first sub-pixels satisfy the following relationship: $\Delta U1=|U2-U1|<k1\times|X2-X1|/KW1$, where k1 is a coefficient, $0.009\leq k1\leq 0.02$, and X1 is a minimum distance between a first edge of the first conductive element of the first sub-pixel and a first edge of the opening corresponding to the first sub-pixel in the second direction; X2 is a minimum distance between a second edge of the first conductive element of the first sub-pixel and a second edge of the opening corresponding to the first sub-pixel in the second direction, KW1 is a maximum size of the opening corresponding to the first sub-pixel in the second direction, U1 is a coordinate distance between a chromaticity coordinate point at a first viewing angle and a chromaticity coordinate point at 0-degree viewing angle of the first sub-pixel, U2 is a coordinate distance between a chromaticity coordinate point at a second viewing angle and the chromaticity coordinate point at 0-degree viewing angle of the first sub-pixel, ΔU1 is an absolute value of a difference between U2 and U1; the second sub-pixels satisfy the following relationship: $\Delta U2=|U4-U3|<k2\times|X4-X3|/KW2$, wherein k2 is a coefficient, $0.004\leq k2\leq 0.02$, and X3 is a minimum distance between a first edge of the second conductive element of the second sub-pixel and a first edge of the opening corresponding to the second sub-pixel in the second direction; X4 is a minimum distance between a second edge of the second conductive element of the second sub-pixel and a second edge of the opening corresponding to the second sub-pixel in the second direction; KW2 is a maximum size of the opening corresponding to the second sub-pixel in the second direction, U3 is a coordinate distance between a chromaticity coordinate point at the first viewing angle and a chromaticity coordinate point at 0-degree viewing angle of the second sub-pixel, U4 is a coordinate distance between a chromaticity coordinate point at the second viewing angle and the chromaticity coordinate point at 0-degree viewing angle of the second sub-pixel, ΔU2 is an absolute value of a difference between U4 and U3; $0.1<k2/k1<10$.

The embodiment of the present disclosure further provides a display substrate, including: a base substrate and a plurality of sub-pixels on the base substrate, the plurality of sub-pixels include a plurality of first sub-pixels (R) and a plurality of second sub-pixels (G), wherein the first sub-pixels include a first pixel circuit, the first pixel circuit includes a first conductive element, the second sub-pixels include a second pixel circuit, the second pixel circuit includes a second conductive element, and the plurality of sub-pixels are arranged along a first direction or along a second direction, the first direction and the second direction intersect with each other; a pixel definition layer including a plurality of openings configured to expose at least a portion of a first electrode, wherein the plurality of openings are configured to define light-emitting areas of the sub-pixels; the openings include a first opening corresponding to the first sub-pixel and a second opening corresponding to the second sub-pixel, and the first opening and the second opening have different areas; the first sub-pixels satisfy the following relationship: $\Delta U1=|U2-U1|<k1\times|X2-X1|/KW1$, where k1 is a coefficient, $0.009\leq k1\leq 0.02$, and X1 is a minimum distance between a first edge of the first conductive element of the first sub-pixel and a first edge of the opening corresponding to the first sub-pixel in the second direction; X2 is a minimum distance between a second edge of the first conductive element of the first sub-pixel and a second edge of the opening corresponding to the first sub-pixel in the second direction, KW1 is a maximum size of the opening corresponding to the first sub-pixel in the second direction, U1 is a coordinate distance between a chromaticity coordinate point at a first viewing angle and a chromaticity coordinate point at 0-degree viewing angle of the first sub-pixel, U2 is a coordinate distance between a chromaticity coordinate point at a second viewing angle and the chromaticity coordinate point at 0-degree viewing angle of the first sub-pixel, and ΔU1 is an absolute value of a difference between U2 and U1; the second sub-pixels satisfy the following relationship: $\Delta U2=|U4-U3|<k2\times|X4-X3|/KW2$, where k2 is a coefficient, $0.004\leq k2\leq 0.02$, and X3 is a minimum distance between a first edge of the second conductive element of the second sub-pixel and a first edge of the opening corresponding to the second sub-pixel in the second direction; X4 is a minimum distance between a second edge of the second conductive element of the second sub-pixel and a second edge of the opening corresponding to the second sub-pixel in the second direction; KW2 is a maximum size of the opening corresponding to the second sub-pixel in the second direction, U3 is a coordinate distance between a chromaticity coordinate point at the first viewing angle and a chromaticity coordinate point at 0-degree viewing angle of the second sub-pixel, U4 is a coordinate distance between a chromaticity coordinate point at the second viewing angle and the chromaticity coordinate point at 0-degree viewing angle of the second sub-pixel, ΔU2 is an absolute value of a difference between U4 and U3; $0.1<k2/k1<10$.

The embodiment of the present disclosure further provides a display device, including any display substrate described above.

BRIEF DESCRIPTION OF DRAWINGS

In order to illustrate the technical solutions of the embodiments of the present disclosure more clearly, the accompanying drawings of the embodiments will be briefly introduced below. Apparently, the accompanying drawings in the following description only relate to some embodiments of the present disclosure, and are not intended to constitute any limitation to the present disclosure.

DETAILED DESCRIPTION

Figure 1:
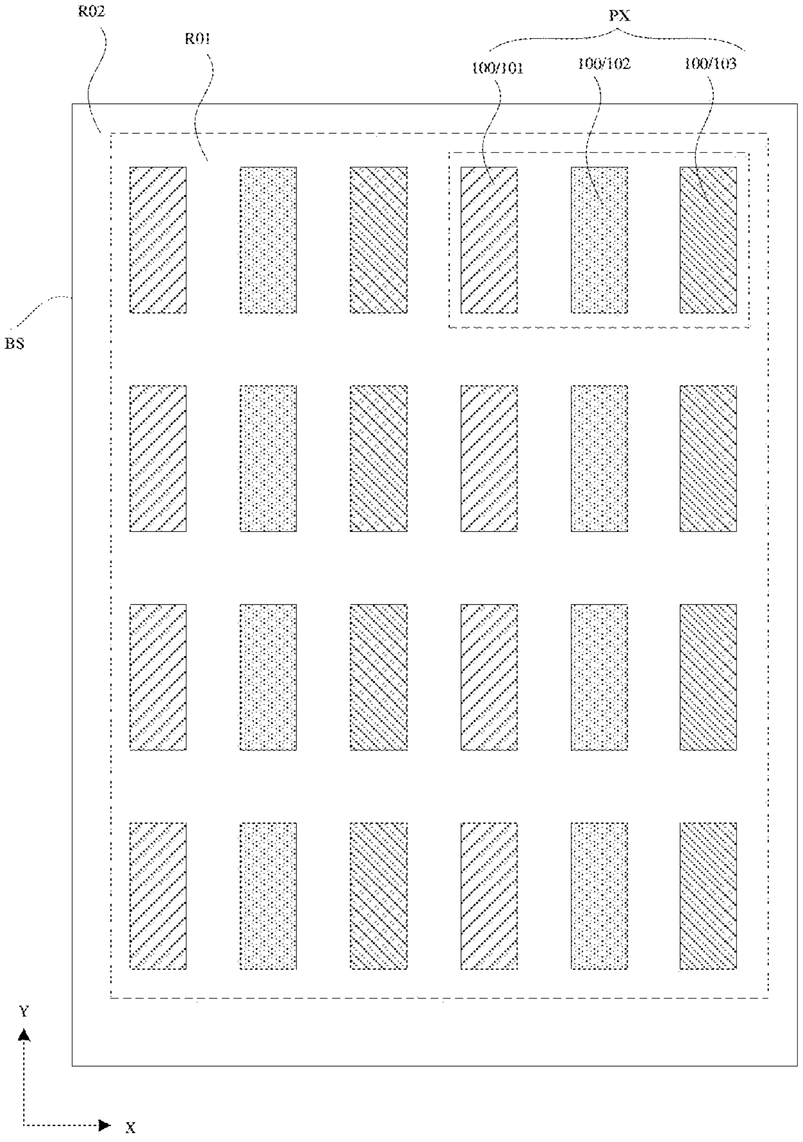
FIG. 1 is a schematic diagram of pixel arrangement of a display substrate.

To make the objective(s), technical solutions and advantages of the embodiments of the present disclosure more definitely, the technical solutions of the embodiments of the present disclosure will be described in a clearly and fully understandable way in conjunction with the accompany drawings. It is apparent that the described embodiments are just a part but not all of the embodiments of the present disclosure. Based on the described embodiments herein, a person of ordinary skill in the art can obtain, without any creative work, other embodiment(s), which should be within the scope of the present disclosure.

Unless otherwise defined, all the technical and scientific terms used herein have the same meanings as commonly understood by one of ordinary skill in the art to which the present disclosure belongs. The terms "first", "second" or the like, which are used in the present disclosure, are not intended to indicate any sequence, amount or importance, but to distinguish various components. The terms "comprise", "comprising", "include", "including" or the like, are intended to specify that the elements or the objects stated before these terms encompass the elements or the objects and equivalents thereof listed after these terms, but do not preclude other elements or objects. The terms "connecting", "connected", or the like, are not limited to a physical connection or mechanical connection, but may also include an electrical connection, directly or indirectly. Terms such as "above", "below", "left" and "right" are only used to indicate relative position relationship, and when the position of the object which is described is changed, the relative position relationship may be changed accordingly.

In a common organic light-emitting diode (OLED) display, an evaporation process is required to fabricate an organic light-emitting layer, in which the process conditions are strict and it's difficult to achieve a large area.

The use of inkjet printing to fabricate OLED light-emitting material layers is the best way to achieve low-cost OLED production and enable OLED to participate in the mid-to-high-end market competition. Inkjet printing is an efficient process, with less material waste and higher speed as compared with the evaporation process.

When forming light-emitting functional layers of an organic light-emitting diode by inkjet printing, it mainly uses a solvent to dissolve an organic material to form a solution (ink), and then directly prints the solution (ink) on a surface of a base substrate to form light-emitting functional layers of sub-pixels, such as red (R), green (G), and blue (B) sub-pixels. Inkjet printing OLED technology has obvious advantages over evaporation technology in terms of manufacturing process, yield and cost. For example, the light-emitting functional layer includes a light-emitting layer (light-emitting material layer), and the light-emitting functional layer may further include at least one of a hole injection layer, a hole transport layer, an electron transport layer, and an electron injection layer. The organic light-emitting functional layer can be selected as required. At least one film layer in the light-emitting functional layer can be produced by the inkjet printing process.

Due to the high molecular weight of polymers, solution processing such as spin coating or printing is mainly used to form films, and inkjet printing technology is the best way for preparing light-emitting polymer solutions. In recent years, a lot of efforts have been made to improve the pixel resolution, the uniformity of the films, and the service life of the display screen, etc., and the research on the formation of optoelectronic materials by inkjet printing has become more and more active. For example, the hole transport layer, hole injection layer, light-emitting layer, and other film layers of the display screen all can be prepared by inkjet printing technology, which lays a foundation for manufacturing the display screen by full printing process.

When the inkjet printing process is used to form the film layer in the light-emitting functional layer, the requirements for the flatness of the light-emitting functional layer are relatively high. The flatter the light-emitting functional layer in each sub-pixel is, the more the color cast can be reduced or avoided, and the better the display effect of the display substrate will be. In order to obtain a flat light-emitting functional layer, the structure of the display substrate can be adjusted.

FIG. 1 is a schematic diagram of pixel arrangement of a display substrate. As shown in FIG. 1, the display substrate includes a plurality of sub-pixels 100 on the base substrate, and the plurality of sub-pixels 100 are arranged in an array. As shown in FIG. 1, the plurality of sub-pixels 100 are arranged in an array along a first direction Y and a second direction X. Embodiments of the present disclosure are described with reference to the case where the plurality of sub-pixels 100 are arranged in an array as shown in FIG. 1 by way of example, but the arrangement of the plurality of sub-pixels 100 is not limited to that as shown in FIG. 1.

As shown in FIG. 1, the display panel includes a plurality of pixels PX, and each pixel PX includes a plurality of sub-pixels 100. As shown in FIG. 1, the plurality of sub-pixels 100 include first sub-pixels 101, second sub-pixels 102, and third sub-pixels 103. As shown in FIG. 1, each pixel PX includes one first sub-pixel 101, one second sub-pixel 102, and one third sub-pixel 103. The first sub-pixel 101, the second sub-pixel 102, and the third sub-pixel 103 have different luminescent colors; the sub-pixels in the same column are sub-pixels of the same color; and in the same row of sub-pixels, a plurality of pixels PX are arranged in sequence. Embodiments of the present disclosure are described with reference to the case where the first direction Y is the column direction and the second direction X is the row direction, by way of example. In some other embodiments, the first direction Y may be a column direction, and the second direction X may be a row direction.

Embodiments of the present disclosure are described with reference to the case where the first sub-pixel 101 is a sub-pixel emitting red light, the second sub-pixel 102 is a sub-pixel emitting green light, and the third sub-pixel 103 is a sub-pixel emitting blue light, by way of example.

As shown in FIG. 1, the base substrate BS includes a display area R01 and a peripheral area R02 located at at least one side of the display area R01. FIG. 1 illustrates the case where the peripheral area R02 surrounds the display area R01 by way of example.

Figure 2:
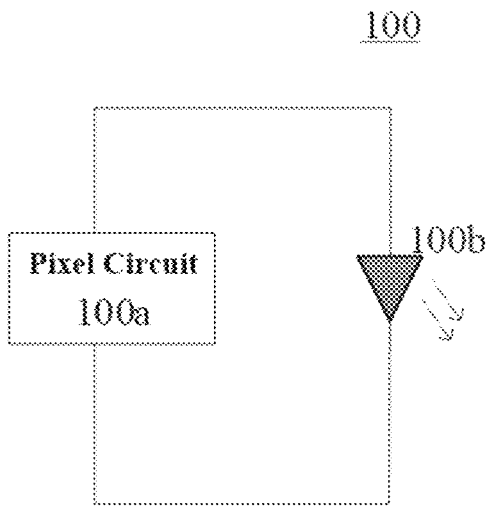
FIG. 2 is a schematic diagram of a pixel circuit in a display substrate, which drives a light-emitting element to emit light.

FIG. 2 is a schematic diagram of a pixel circuit in a display substrate which drives a light-emitting element to emit light. As shown in FIG. 2, each sub-pixel 100 includes a pixel circuit 100*a* and a light-emitting element 100*b*, the pixel circuit 100*a* is connected to the light-emitting element 100*b*, and the pixel circuit 100*a* is configured to drive the light-emitting element 100*b*. For example, the pixel circuit 100*a* is configured to drive the light-emitting element 100*b* to emit light. The light-emitting element 100*b* includes a light-emitting area. The pixel arrangement shown in FIG. 1 refers to the arrangement positions of the light-emitting areas of the light-emitting elements 100*b* in the sub-pixels 100.

Figure 3:
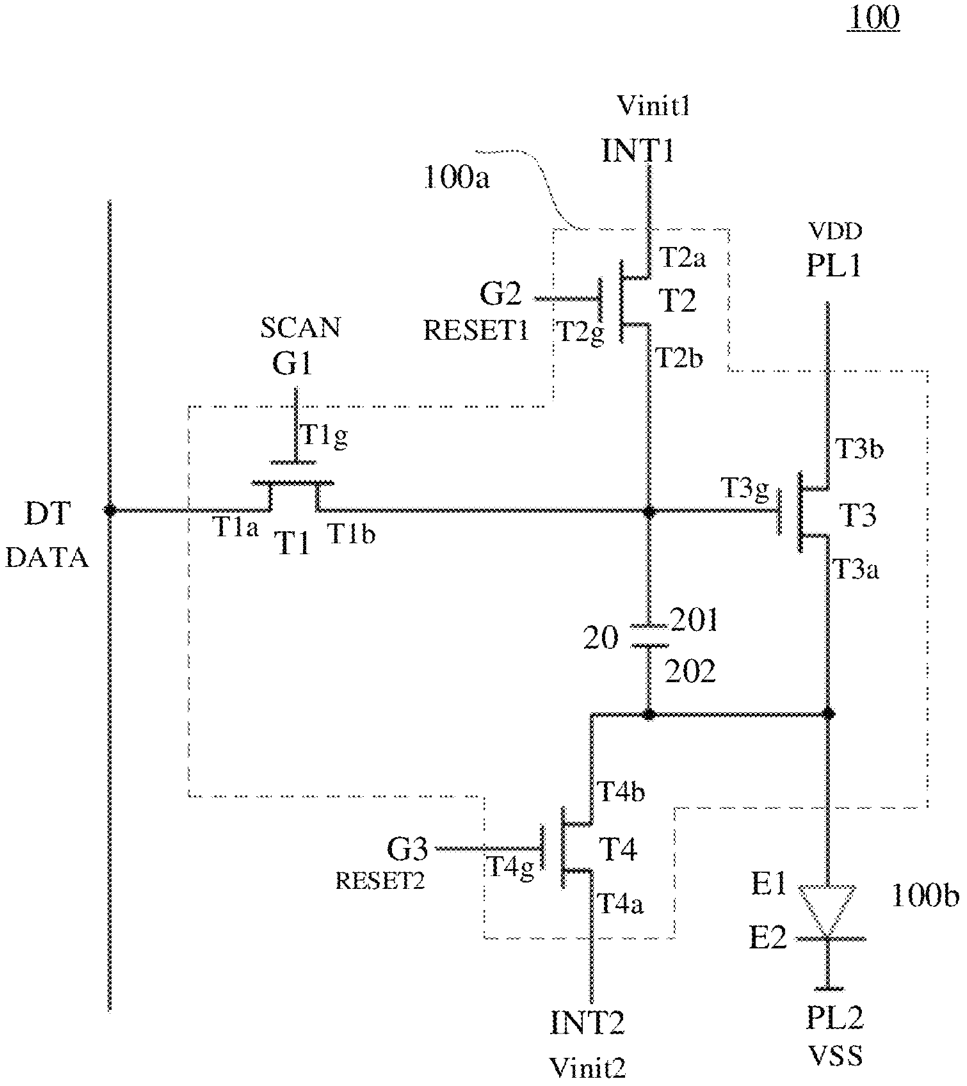
FIG. 3 is a schematic diagram of a pixel circuit and a light-emitting element in a sub-pixel.
Figure 4:
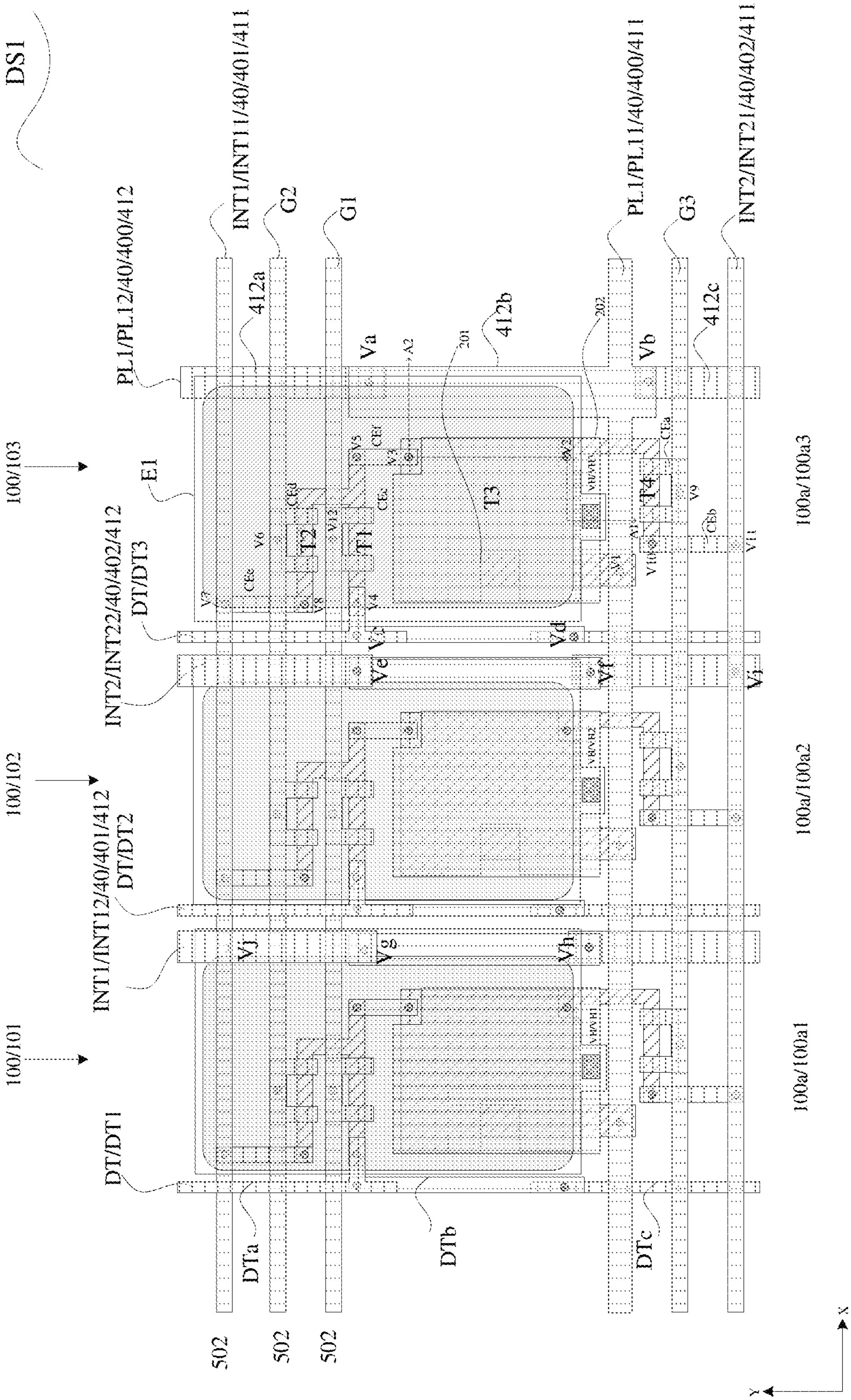
FIG. 4 is a layout diagram of a display substrate provided by an embodiment of the present disclosure.
Figure 5:
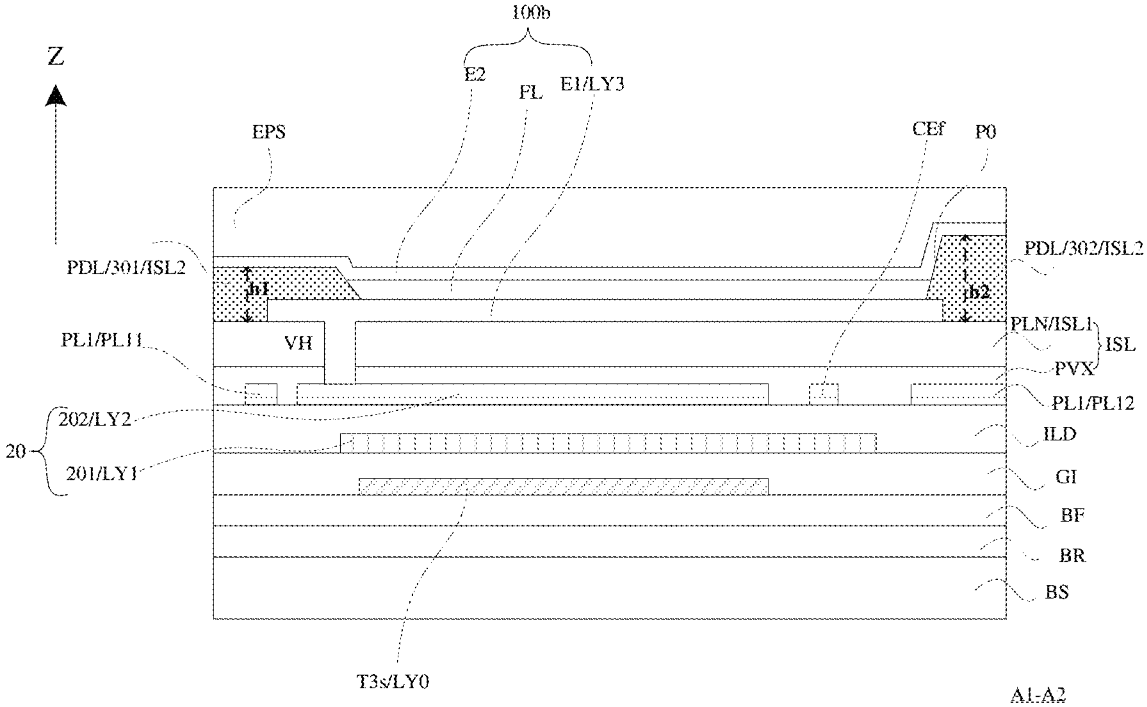
FIG. 5 is a cross-sectional view along line A1-A2 of FIG. 4.

FIG. 3 is a schematic diagram of a pixel circuit and a light-emitting element in a sub-pixel. FIG. 4 is a layout diagram of a display substrate provided by an embodiment of the present disclosure. FIG. 4 shows a display substrate DS1. FIG. 5 is a cross-sectional view along line A1-A2 of FIG. 4. FIGS. 6A to 6G are plan views of a single layer of the display substrate in FIG. 4. FIGS. 7A to 7D are plan views of part of stacks of the display substrate in FIG. 4.

As shown in FIGS. 3 and 4, in the sub-pixel 100, the pixel circuit 100*a* includes a data writing transistor T1, a reset transistor T2, a driving transistor T3, a reset transistor T4, and a storage capacitor 20, and the light-emitting element 100*b* is connected to the driving transistor T3. The reset transistor T2 is configured to reset the gate T3*g* of the driving transistor T3, and the reset transistor T4 is configured to reset the first electrode E1 of the light-emitting element 100*b*. As shown in FIG. 3 and FIG. 4, the storage capacitor 20 includes a first electrode plate 201 and a second electrode plate 202.

As shown in FIG. 3 and FIG. 4, the display panel includes a gate line G1, a gate line G2, a gate line G3, data lines DT, a first power line PL1, a second power line PL2, an initialization signal line INT1, an initialization signal line INT2 and the like. The gate line G2 and the gate line G3 may also be referred to as a reset control signal line RST. For example, the first power line PL1 is configured to provide the sub-pixel 100 with a constant first voltage signal VDD, the second power line PL2 is configured to provide the sub-pixel 100 with a constant second voltage signal VSS, and the first voltage signal VDD is greater than the second voltage signal VSS. The gate line G1 is configured to provide a scan signal SCAN to the sub-pixel 100, the gate line G2 is configured to provide a reset control signal RESET1 to the sub-pixel 100, the gate line G3 is configured to provide a reset control signal RESET2 to the sub-pixel 100, and the data line DT is configured to provide a data signal (data voltage) DATA to the sub-pixel 100. The initialization signal line INT1 is configured to provide a first initialization signal Vinit to the sub-pixel 100. The initialization signal line INT2 is configured to provide a second initialization signal Vinit2 to the sub-pixel 100. For example, the first initialization signal Vinit1 and the second initialization signal Vinit2 are constant voltage signals, the magnitude of which may be, for example, between the first voltage signal VDD and the second voltage signal VSS, but not limited thereto. For example, the first initialization signal Vinit1 and the second initialization signal Vinit2 may be both smaller than or equal to the second voltage signal VSS. For example, in some embodiments of the present disclosure, the first initialization signal line INT1 and the second initialization signal line INT2 are connected, and both are configured to provide the initialization signal Vinit to the sub-pixel 100; that is, the initialization signal line INT1 and the initialization signal line INT2 are both referred to as the initialization signal line INT, and both the first initialization signal Vinit1 and the second initialization signal Vinit2 are equal to Vinit, but not limited thereto. In some other embodiments, the first initialization signal line INT1 and the second initialization signal line INT2 are insulated from each other to provide different initialization signals.

As shown in FIG. 3 and FIG. 4, the driving transistor T3 is electrically connected to the light-emitting element 100*b*, and outputs a driving current under the control of signals, such as the scan signal SCAN, the data signal DATA, the first voltage signal VDD, and the second voltage signal VSS, to drive the light-emitting element 100*b* to emit light.

For example, the light-emitting element 100*b* includes an organic light-emitting diode (OLED), and the light-emitting element 100*b* emits red light, green light, blue light, or white light, etc., when the light-emitting element 100*b* is driven by its corresponding pixel circuit 100*a*.

As shown in FIG. 3 and FIG. 4, the first electrode E1 of the light-emitting element 100*b* is connected to the first electrode T3*a* of the driving transistor T3, the second electrode E2 of the light-emitting element 100*b* is connected to the second power line PL2, and the second electrode T3*b* of the driving transistor T3 is connected to the first power line PL1, the gate T3*g* of the driving transistor T3 is connected to the second electrode T1*b* of the data writing transistor T1, the first electrode T1*a* of the data writing transistor T1 is connected to the data line DT, and the gate T1*g* of the data writing transistor T1 is connected to the gate line G1.

As shown in FIG. 3 and FIG. 4, the gate T3*g* of the driving transistor T3 is connected to the first electrode plate 201 of the storage capacitor 20, and the second electrode plate 202 of the storage capacitor 20 is connected to the first electrode T3*a* of the driving transistor T3. The first electrode plate 201 of the storage capacitor 20 is also connected to the second electrode T1*b* of the data writing transistor T1.

As shown in FIG. 3 and FIG. 4, the first electrode T2*a* of the reset transistor T2 is connected to the initialization line INT1, the second electrode T2*b* of the reset transistor T2 is connected to the gate T3*g* of the driving transistor T3, and the gate T2*g* of the reset transistor T2 is connected to the gate line G2.

As shown in FIG. 3 and FIG. 4, the first electrode T4*a* of the reset transistor T4 is connected to the initialization line INT2, the second electrode T4*b* of the reset transistor T4 is connected to the first electrode E1 of the light-emitting element 100*b*, and the gate T4*g* of the reset transistor T4 is connected to the gate line G3.

As shown in FIG. 5, the display substrate includes a base substrate BS, as well as a barrier layer BR and a buffer layer BF located on the base substrate BS. As shown in FIG. 5, an active semiconductor layer LY0 is arranged on the buffer layer BF, a gate insulating layer G1 is located on the active semiconductor layer LY0, a first conductive pattern layer LY1 is located on the gate insulating layer G1, an interlayer insulating layer ILD is located on the first conductive pattern layer LY1, a second conductive pattern layer LY2 is located on the interlayer insulating layer ILD, an insulating layer ISL is located on the second conductive pattern layer LY2, and a first electrode layer LY3 is located on the insulating layer ISL. FIG. 5 also shows a channel T3*s* of the driving transistor T3 in the active semiconductor layer LY0.

As shown in FIG. 4 and FIG. 5, the display substrate further includes a pixel definition layer PDL, the sub-pixels 100 include a plurality of openings P0, each opening P0 is configured to expose at least a part of the first electrode E1, and the openings P0 are configured to define the light-emitting areas of the sub-pixels 100.

For example, a slope angle of a portion of the pixel definition layer PDL that defines the opening P0 is 40-65 degrees.

In an embodiment of the present disclosure, a plan view shows a first direction Y and a second direction X, and a cross-sectional view shows a third direction Z. Both the first direction Y and the second direction X are directions parallel to a main surface of the base substrate BS. The third direction Z is a direction perpendicular to the main surface of the base substrate BS. For example, the first direction Y and the second direction X intersect with each other. Embodiments of the present disclosure are described with reference to the case where the first direction Y and the second direction X are perpendicular to each other by way of example. As shown in FIG. 5, the main surface of the base substrate BS is the surface of the base substrate BS on which various elements are formed. As shown in FIG. 5, the upper surface of the base substrate BS is the main surface of the base substrate BS.

For example, as shown in FIG. 4, the plurality of sub-pixels 100 include a first sub-pixel 101, a second sub-pixel 102, and a third sub-pixel 103, and the first sub-pixel 101, the second sub-pixel 102, and the third sub-pixel 103 are arranged in sequence along the second direction X. Of course, the sub-pixels in one pixel may also be arranged in other ways.

Figure 6A:
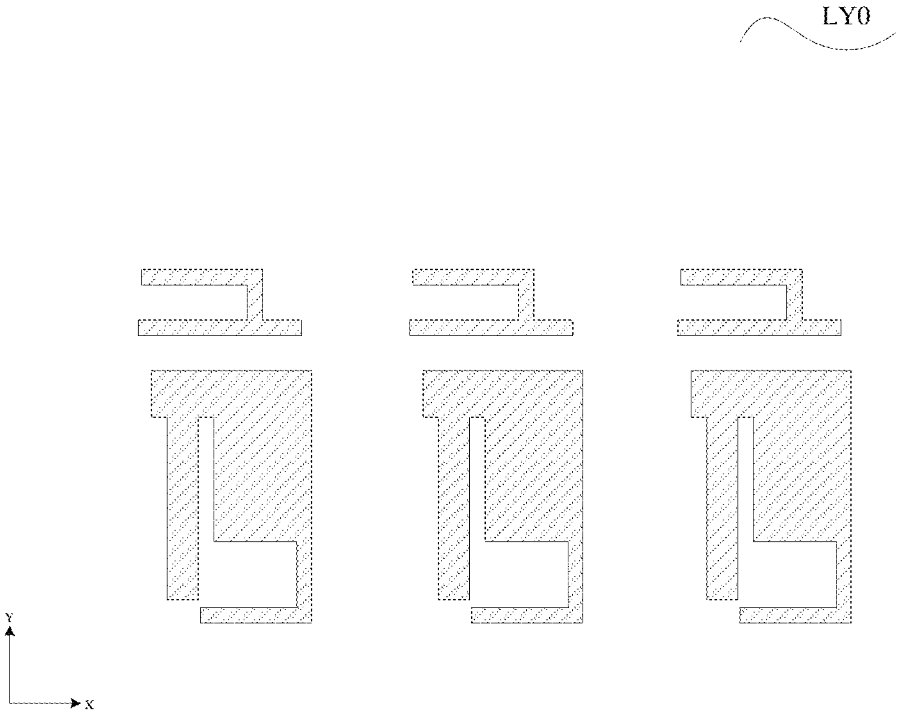
FIGS. 6A to 6G are plan views of a single layer of the display substrate in FIG. 4.
Figure 6B:
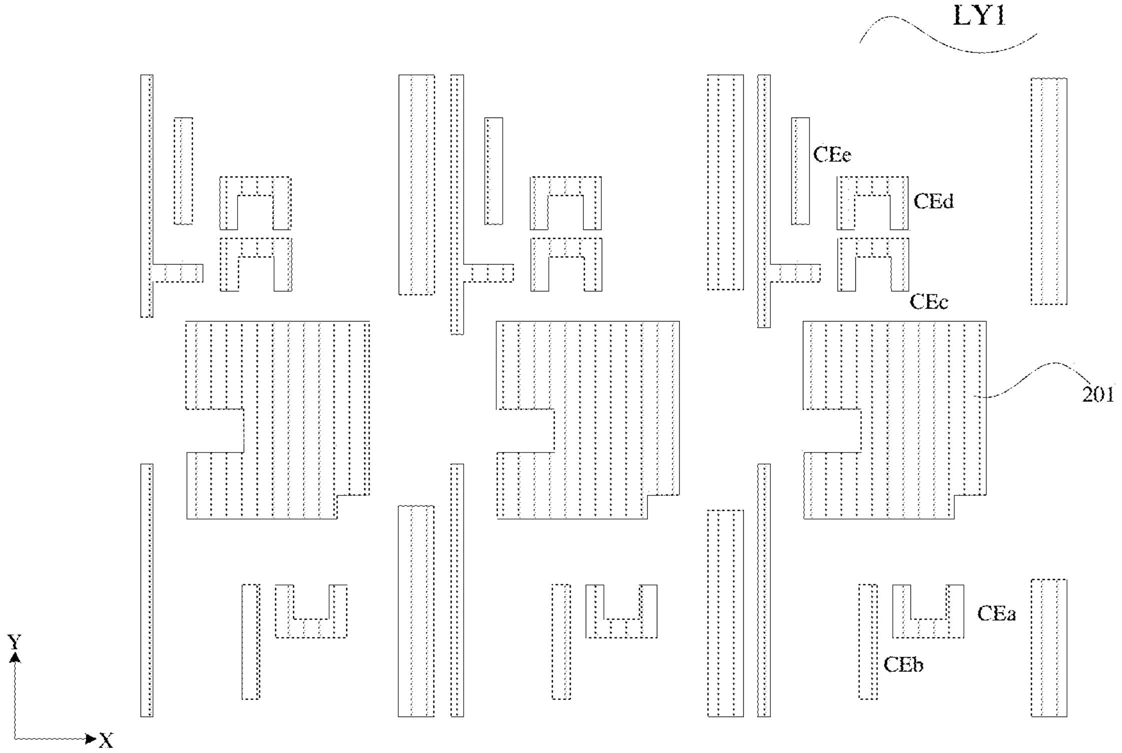
Figure 6C:
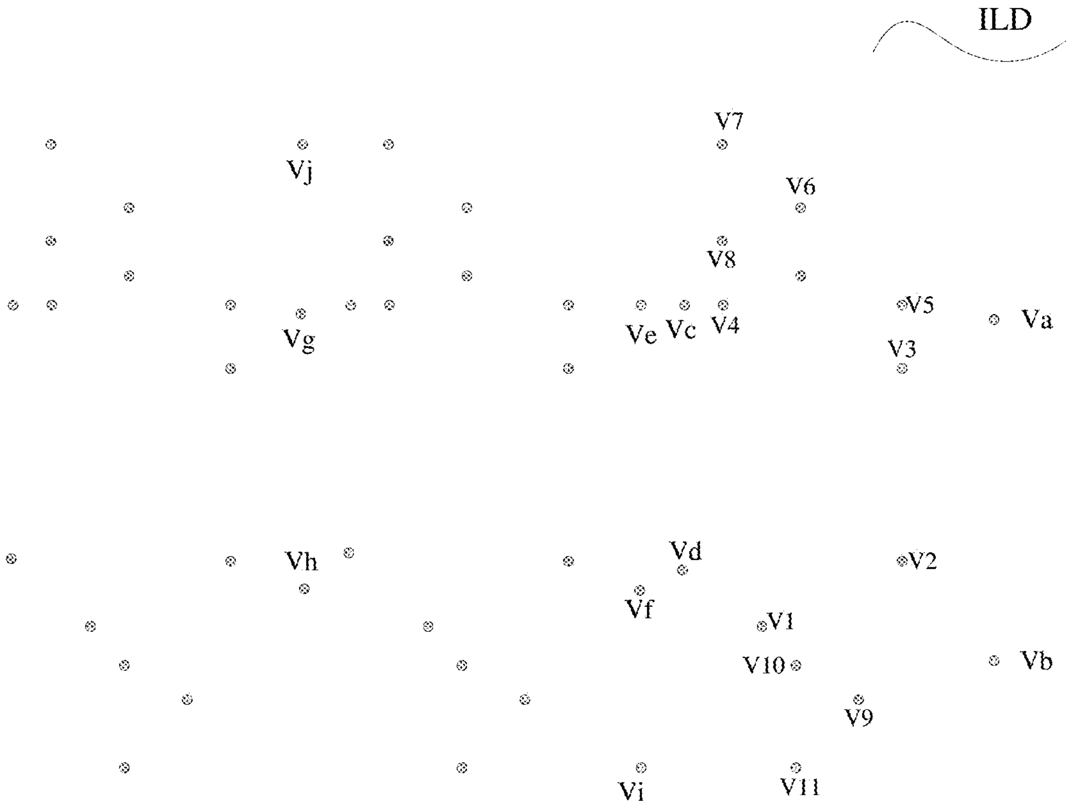
Figure 6D:
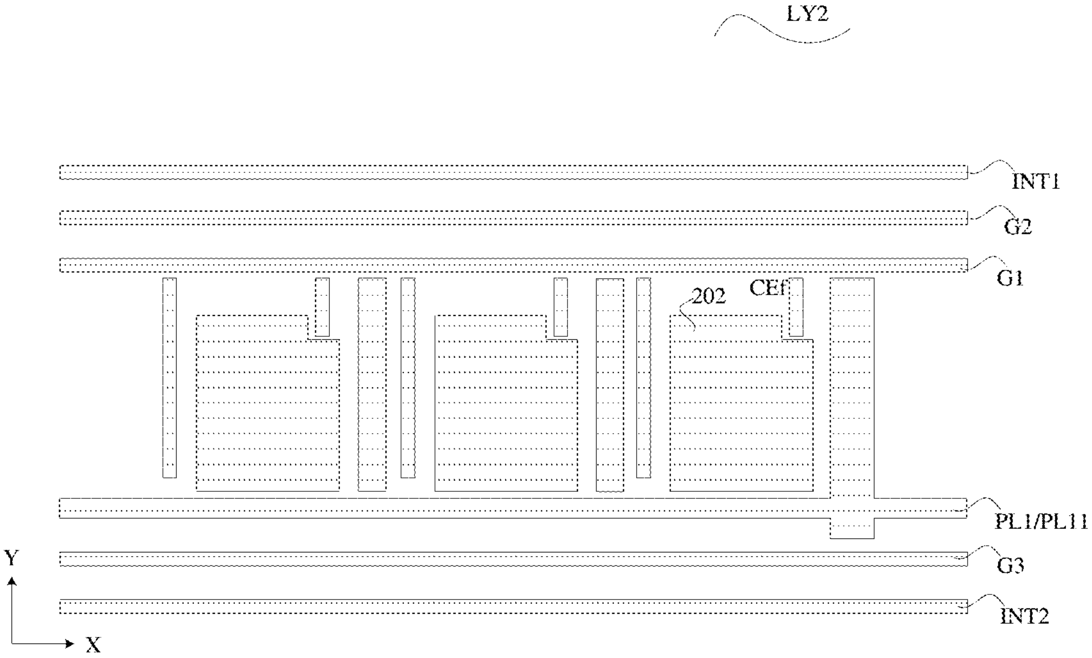
Figure 6E:
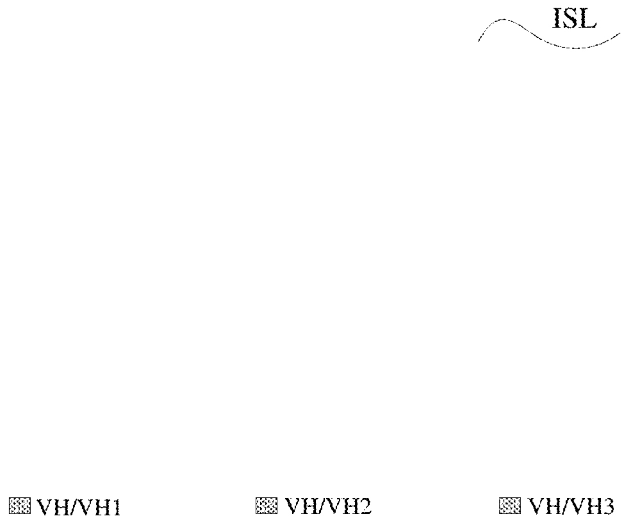
Figure 6F:
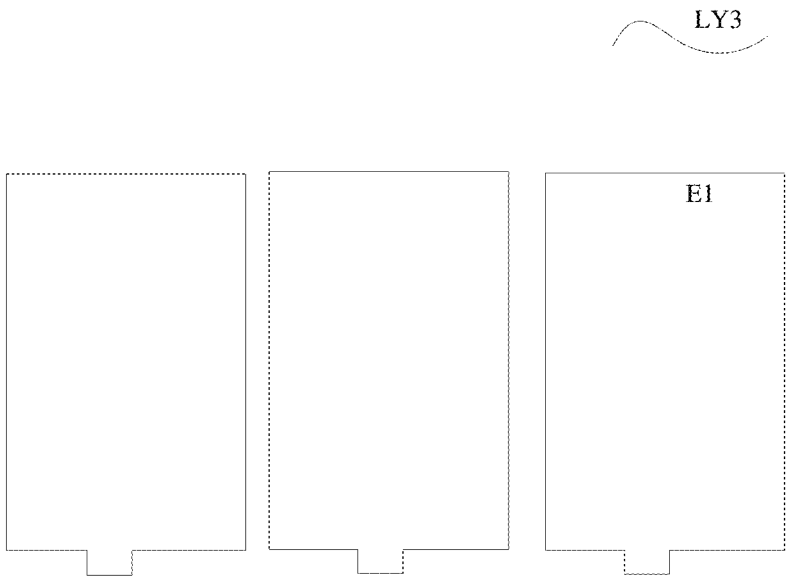
Figure 6G:
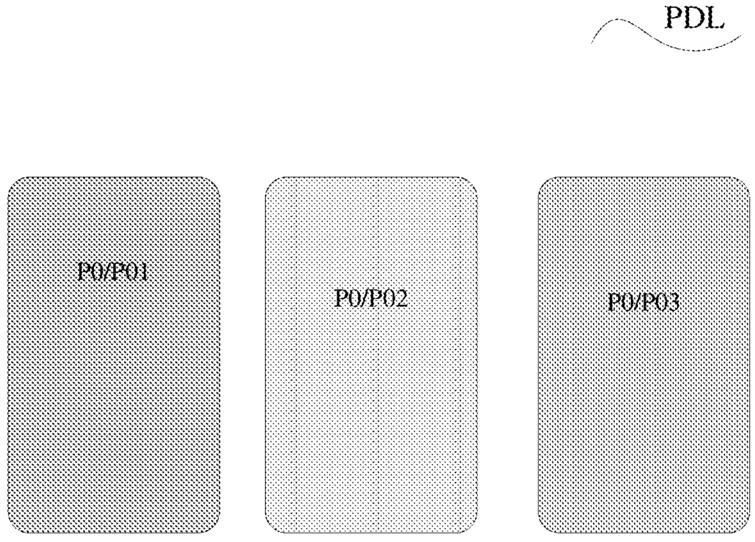

FIG. 6G shows the opening P01 of the first sub-pixel 101, the opening P02 of the second sub-pixel 102, and the opening P03 of the third sub-pixel 103. In some embodiments, the opening P01 may be referred to as a first opening P01, the opening P02 may be referred to as a second opening P02, and the opening P03 may be referred to as a third opening P03.

FIG. 6A shows the active semiconductor layer LY0. The active semiconductor layer LY0 includes polysilicon, but it is not limited thereto.

FIG. 6B shows the first conductive pattern layer LY1. As shown in FIG. 6B, the first conductive pattern layer LY1 includes a first electrode plate 201, a connection electrode CEa, a connection electrode CEb, a connection electrode CEc, a connection electrode CEd, and a connection electrode CEe.

FIG. 6C shows the interlayer insulating layer ILD, which is illustrated as the via holes in the interlayer insulating layer ILD. FIG. 6C shows via holes V1 to V12, and via holes Va to Vh.

FIG. 6D shows the second conductive pattern layer LY2. As shown in FIG. 6D, the second conductive pattern layer LY2 includes a second electrode plate 202 and a connection electrode CEf.

FIG. 6E shows the insulating layer ISL, which is illustrated as the via holes in the insulating layer ISL. As shown in FIG. 6E, the via holes VH include a first via hole VH1, a second via hole VH2, and a third via hole VH3.

FIG. 6F shows the first electrode layer LY3 of the light-emitting element. FIG. 6F shows three first electrodes E1.

FIG. 6G shows the pixel definition layer PDL, which is illustrated as an opening P0 in the pixel definition layer PDL. When an inkjet printing process is used to fabricate at least one film layer in the light-emitting functional layer FL of the display substrate, the film layer fabricated by inkjet printing is located in the opening P0 of the pixel definition layer PDL.

As shown in FIG. 3, FIG. 4, FIG. 6A to FIG. 6G, and FIG. 7A to FIG. 7D, the connection electrode CEa is connected to the gate line G3 through the via hole V9, and serves as the gate of the reset transistor T4.

As shown in FIG. 3, FIG. 4, FIG. 6A to FIG. 6G, and FIG. 7A to FIG. 7D, one end of the connection electrode CEb is connected to the initialization line INT2 through the via hole V11, and the other end of the connection electrode CEb is connected to the first electrode T4*a* of the reset transistor T4 through the via hole V10.

As shown in FIG. 3, FIG. 4, FIG. 6A to FIG. 6G, and FIG. 7A to FIG. 7D, the connection electrode CEc is connected to the gate line G1 through the via hole V12, and serves as the gate of the data writing transistor T1.

As shown in FIG. 3, FIG. 4, FIG. 6A to FIG. 6G, and FIG. 7A to FIG. 7D, the connection electrode CEd is connected to the gate line G2 through the via hole V6, and serves as the gate of the reset transistor T2.

As shown in FIG. 3, FIG. 4, FIG. 6A to FIG. 6G, and FIG. 7A to FIG. 7D, one end of the connection electrode CEe is connected to the initialization line INT1 through the via hole V7, and the other end of the connection electrode CEe is connected to the first electrode T2*a* of the reset transistor T2 through the via hole V8.

As shown in FIG. 3, FIG. 4, FIG. 6A to FIG. 6G, and FIG. 7A to FIG. 7D, one end of the connection electrode CEf is connected to the first electrode plate 201 through the via hole V3, and the other end of the connection electrode CEf is connected to the second electrode T2*b* of the data writing transistor T1 through the via hole V5.

As shown in FIG. 3, FIG. 4, FIG. 6A to FIG. 6G, and FIG. 7A to FIG. 7D, the second electrode plate 202 is connected to the second electrode T4 *b* of the reset transistor T4 through the via hole V2. The second electrode T4*b* of the reset transistor T4 also serves as the first electrode T3*a* of the driving transistor T3.

As shown in FIG. 3, FIG. 4, FIG. 6A to FIG. 6G, and FIG. 7A to FIG. 7D, the data line DT is connected to the first electrode T1*a* of the data writing transistor T1 through the via hole V4.

Figure 7A:
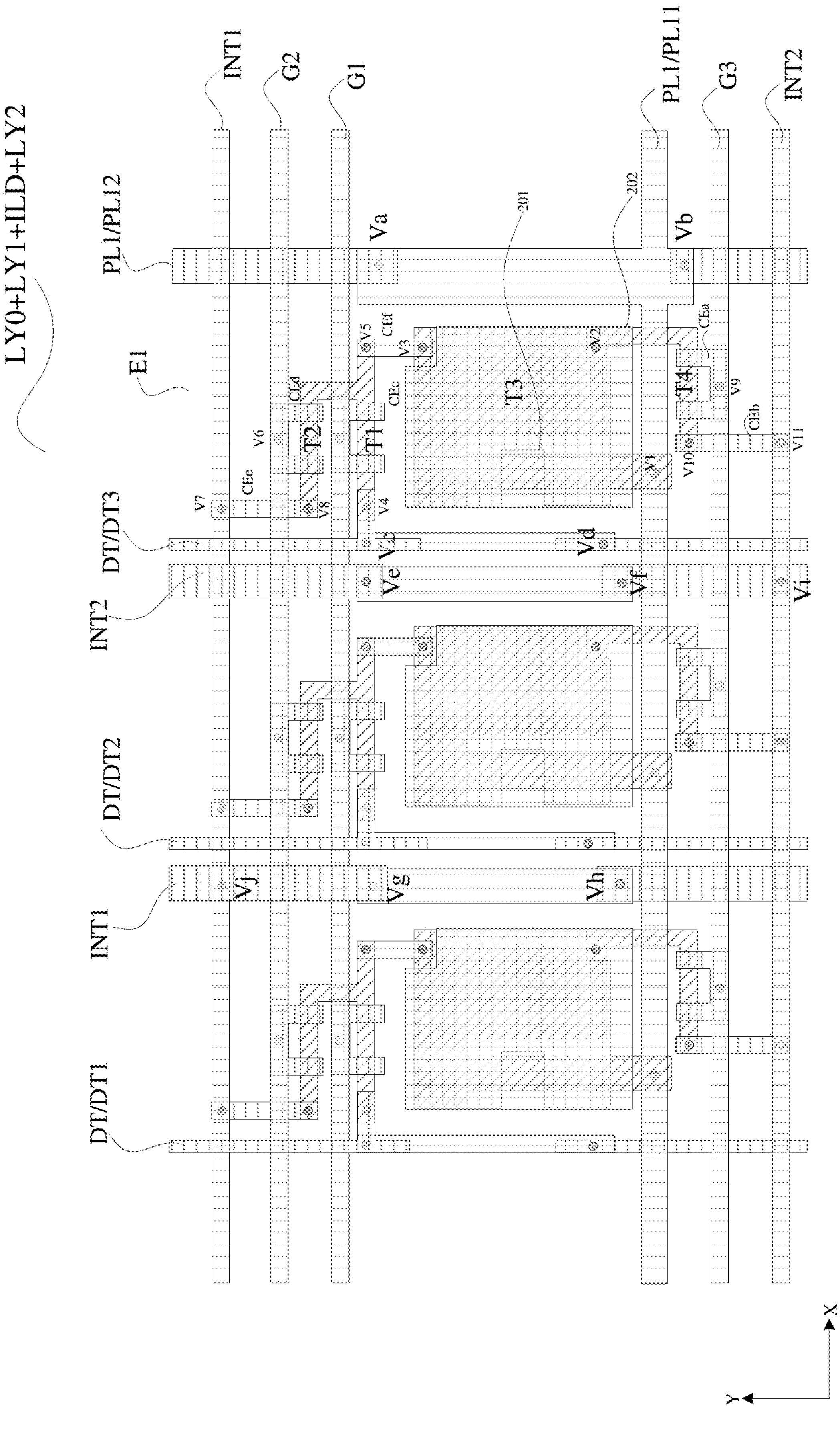
FIGS. 7A to 7D are plan views of part of stacks of the display substrate in FIG. 4.
Figure 7B:
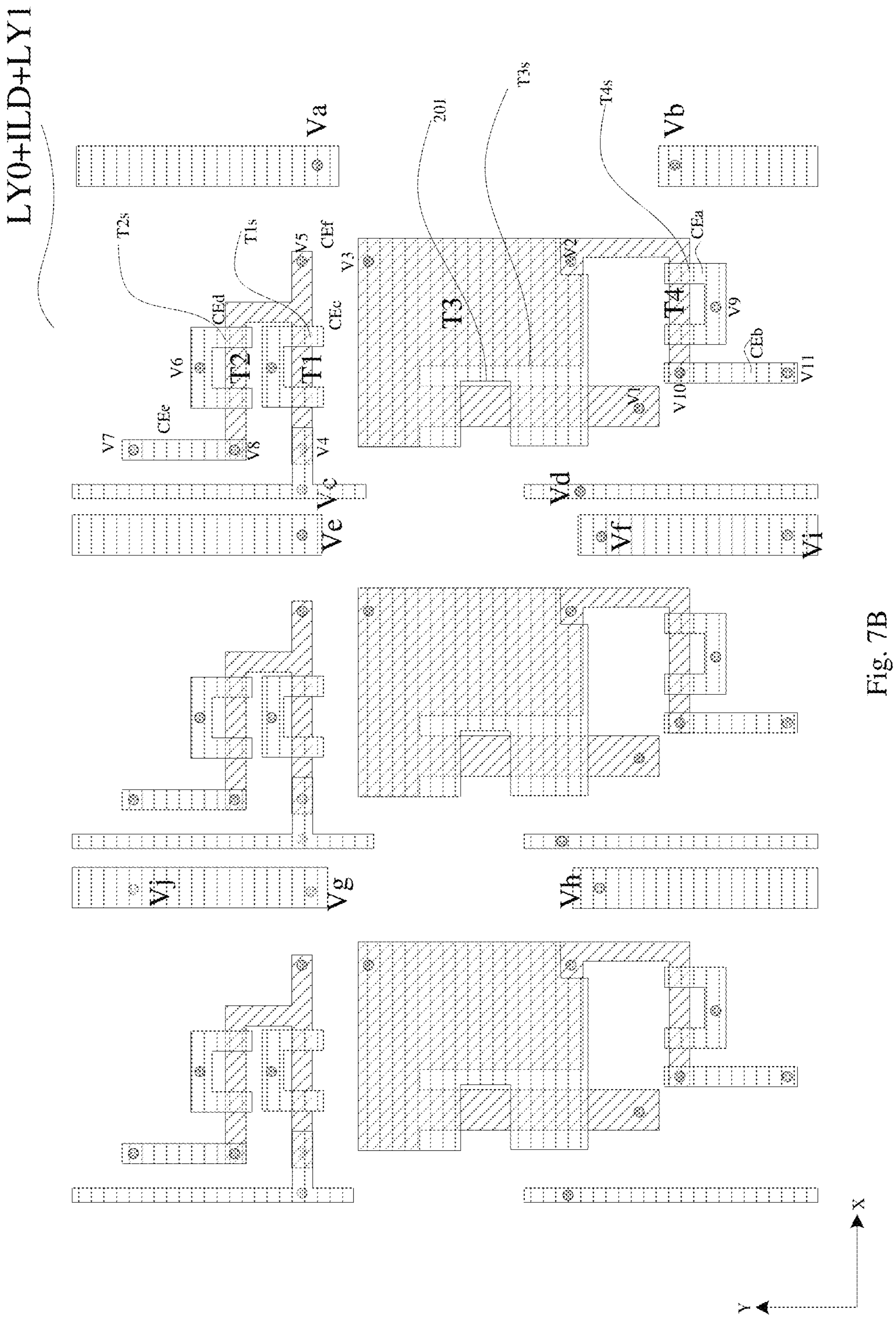
Figure 7C:
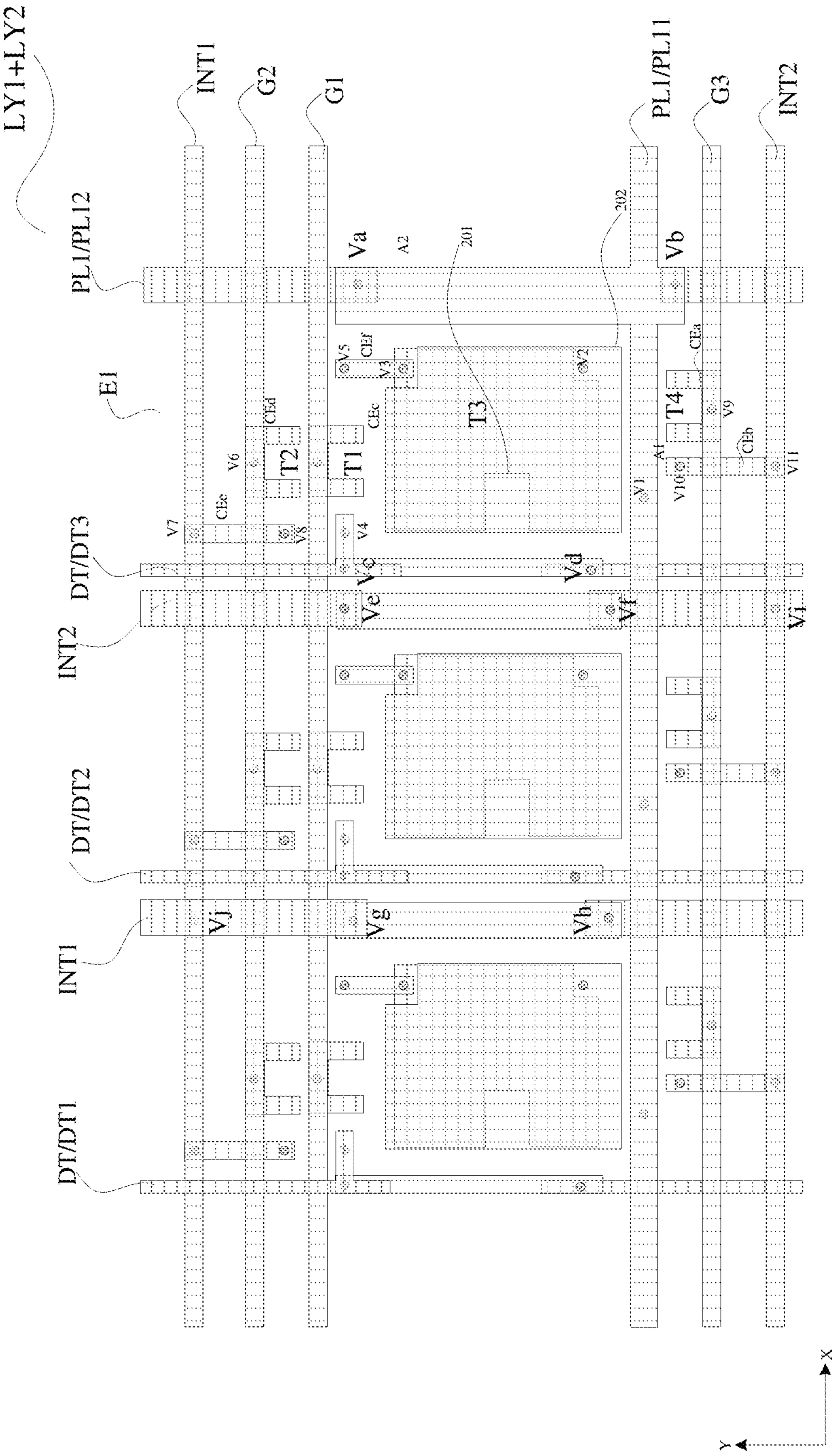
Figure 7D:
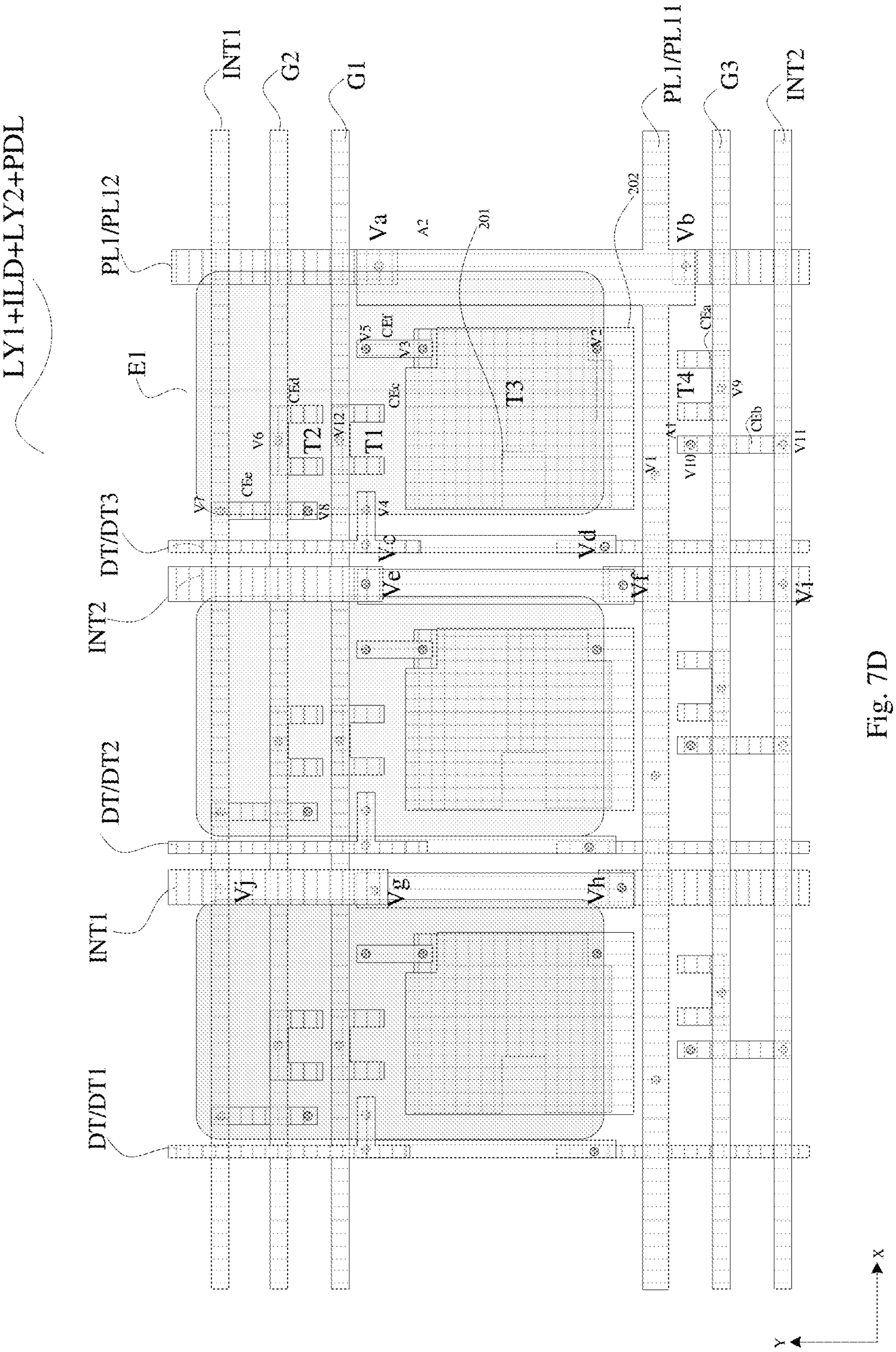

FIG. 7B shows a channel T1*s* of the data writing transistor T1, a channel T2*s* of the reset transistor T2, a channel T3*s* of the driving transistor T3, and a channel T4*s* of the reset transistor T4.

In an embodiment of the present disclosure, the elements located in the second conductive pattern layer LY2 can be connected to the elements located in the first conductive pattern layer LY1 and the elements located in the active semiconductor layer LY0 through via holes, and the elements located in the first conductive pattern layer LY1 and elements in the active semiconductor layer LY0 may be connected through elements located in the second conductive pattern layer LY2.

For example, the insulating layer penetrated by a via hole may be determined according to the condition of the insulating layer between two conductive pattern layers connected through the via hole.

According to the display substrate DS1 provided by some embodiments of the present disclosure, the active semiconductor layer LY0, the first conductive pattern layer LY1, and the second conductive pattern layer LY2 are used to form the pixel circuit 100*a*, so as to simplify the manufacturing process and reduce the thickness of the display substrate. The initialization line INT1, the initialization line INT2, and/or the first power line PL1 may be referred to as a conductive structure 40, the conductive structure 40 includes a first signal line 411 and a signal connection line 412, and the conductive structure 40 is configured to provide a voltage signal to the sub-pixel 100, the first signal line 411 extends along the second direction X, the signal connection line 412 extends along the first direction Y, and the signal connection line 412 is electrically connected to the first signal line 411.

As shown in FIG. 4, the conductive structure 40 adopts a mesh structure and includes portions extending along the first direction Y (i.e., the signal connection lines 412) and portions extending along the second direction X (i.e., the first signal lines 411).

As shown in FIG. 4, the conductive structure 40 includes a conductive structure 400, a conductive structure 401, and a conductive structure 402. As shown in FIG. 4, the first power line PL1 can be referred to a conductive structure 400, the initialization line INT1 can be referred to a conductive structure 401, and the initialization line INT2 can be referred to a conductive structure 402.

As shown in FIG. 4, the first power line PL1 includes a first power signal line PL11 extending along the second direction X and a first power connection line PL12 extending along the first direction Y, the first power signal line PL11 and the first power connection line PL12 are connected with each other.

As shown in FIG. 4, the initialization line INT1 includes an initialization signal line INT11 extending along the second direction X and an initialization connection line INT12 extending along the first direction Y, and the initialization signal line INT11 is connected to the initialization connection line INT12. As shown in FIG. 4, the initialization signal line INT11 and the initialization connection line INT12 are connected through a via hole Vj.

As shown in FIG. 4, the initialization line INT2 includes an initialization signal line INT21 extending along the second direction X and an initialization connection line INT22 extending along the first direction Y, and the initialization signal line INT21 is connected to the initialization connection line INT22. As shown in FIG. 4, the initialization signal line INT21 and the initialization connection line INT22 are connected through a via hole Vi.

As shown in FIG. 4, two conductive pattern layers are used to form the first power line PL1, the initialization line INT1, the initialization line INT2, and the capacitor 20 of the pixel circuit 100*a*. Parts of the first power line PL1, the initialization line INT1, and the initialization line INT2 extending along the first direction Y are all formed in segments. Parts of the first power line PL1, the initialization line INT1, and the initialization line INT2 extending along the second direction X are all located on the second conductive pattern layer LY2.

For example, as shown in FIG. 4, the signal connection line 412 includes a first part 412*a*, a second part 412*b* and a third part 412*c*, the first part 412*a* and the third part 412*c* are connected through the second part 412*b*, the first part 412*a* and the third part 412*c* are located in the first conductive pattern layer LY1, the second part 412*b* is located in the second conductive pattern layer LY2. The signal connection lines 412 include at least one of the first power connection line PL12, the initialization connection line INT12, and the initialization connection line INT22.

As shown in FIG. 4, the first part and the second part of the first power connection line PL12 are connected through the via hole Va, and the second part and the third part of the first power connection line PL12 are connected through the via hole Vb.

As shown in FIG. 4, the first part DTa and the second part DTb of the data line DT are connected through the via hole Vc, and the second part DTb and the third part DTc of the data line DT are connected through the via hole Vd.

As shown in FIG. 4, the first part and the second part of the initialization connection line INT22 are connected through the via hole Ve, and the second part and the third part of the initialization connection line INT22 are connected through the via hole Vf.

As shown in FIG. 4, the first part and the second part of the initialization connection line INT12 are connected through the via hole Vg, and the second part and the third part of the initialization connection line INT12 are connected through the via hole Vh.

For example, as shown in FIG. 4, the data line DT extends along the first direction Y, and the data line DT is also formed in segments. The data line DT includes a first part DTa, a second part DTb and a third part DTc. The first part DTa and the third part DTc are connected through the second part DTb, the first part DTa and the third part DTc are located in the first conductive pattern layer LY1, and the second part DTb is located in the second conductive pattern layer LY2.

Figure 8:
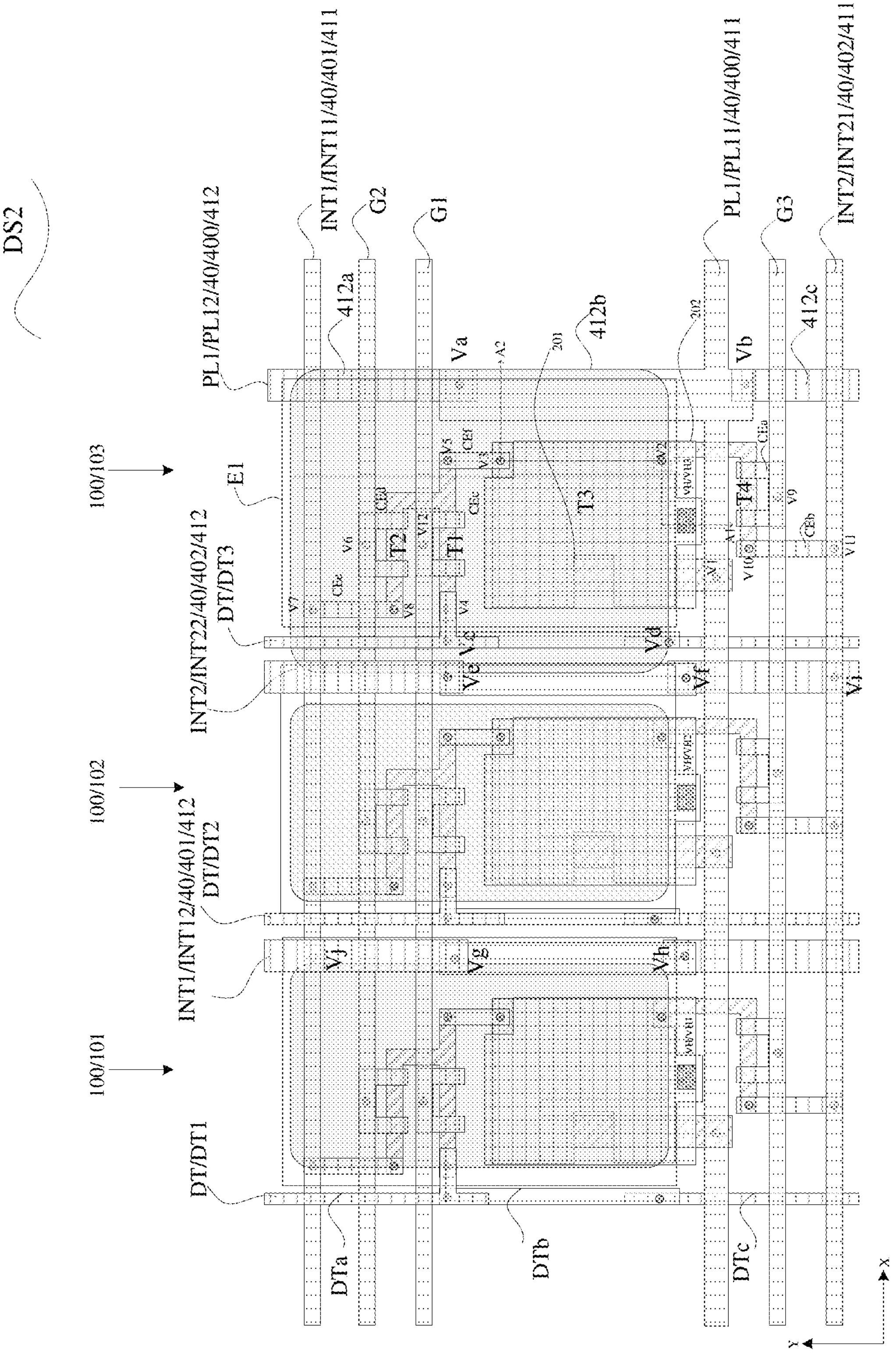
FIG. 8 is a layout diagram of a display substrate provided by an embodiment of the present disclosure.

FIG. 8 is a layout diagram of a display substrate according to an embodiment of the present disclosure. FIG. 8 shows the display substrate DS2.

Compared with the display substrate DS1 shown in FIG. 4, the size of the opening P0 of the pixel definition layer PDL is adjusted in the display substrate DS2 shown in FIG. 8. As shown in FIG. 8, the size of the opening P0 of the third sub-pixel 103 along the second direction X is greater than the size of the opening P0 of the second sub-pixel 102 along the second direction X, and is greater than the size of the opening P0 of the first sub-pixel 101 along the second direction X. As shown in FIG. 8, the size of the opening P0 of the third sub-pixel 103 along the second direction X is greater than the size of the opening P0 of the first sub-pixel 101 along the second direction X, and the size of the opening P0 of the first sub-pixel 101 along the second direction X is greater than the size of the opening P0 of the second sub-pixel 102 along the second direction X.

Compared with the display substrate DS1 shown in FIG. 4, the size of the opening P0 of the second sub-pixel 102 along the second direction X is adjusted in the display substrate DS2 shown in FIG. 8, so as to increase the size of the opening P0 of the third sub-pixel 103 along the second direction X.

As shown in FIG. 8, an orthographic projection of the opening P0 of the second sub-pixel 102 on the base substrate and an orthographic projection the second part of the initialization line INT1 (the part of the initialization connection line INT12 located in the second conductive pattern layer LY2) on the base substrate are not overlapped with each other, and the orthographic projection of the opening P0 of the second sub-pixel 102 on the base substrate and an orthographic projection of the second part of the initialization line INT2 (the part of the initialization connection line INT22 located in the second conductive pattern layer LY2) on the base substrate are not overlapped with each other.

Compared with the display substrate DS1 shown in FIG. 4, in the display substrate DS2 shown in FIG. 8, in the second direction X, the two opposite edges of the opening P0 of the third sub-pixel 103 respectively expand leftwards and rightwards. For example, in the second direction X, one of the two opposite edges of the opening P0 of the third sub-pixel 103 exceeds the data line that provides data signal to the third sub-pixel 103, and the other one of the two opposite edges of the opening P0 of the third sub-pixel 103 exceeds the first power connection line PL12 overlapped by the third sub-pixel 103, or the other one of the two opposite edges of the opening P0 of the third sub-pixel 103 is flushed with the first power connection line PL12 overlapped by the third sub-pixel 103. Of course, in some other embodiments, the other one of the two opposite edges of the opening P0 of the third sub-pixel 103 is overlapped with the first power connection line PL12 which is overlapped with the third sub-pixel 103. In this way, it is beneficial to reducing the color cast at the left and right viewing angles of the display substrate.

As shown in FIG. 4 and FIG. 8, the data lines DT include a data line DT1, a data line DT2, and a data line DT3. The data line DT1 provides a data signal for the first sub-pixel 101, the data line DT2 provides a data signal for the second sub-pixel 102, and the data line DT3 provides a data signal for the third sub-pixel 103.

Figure 9A:
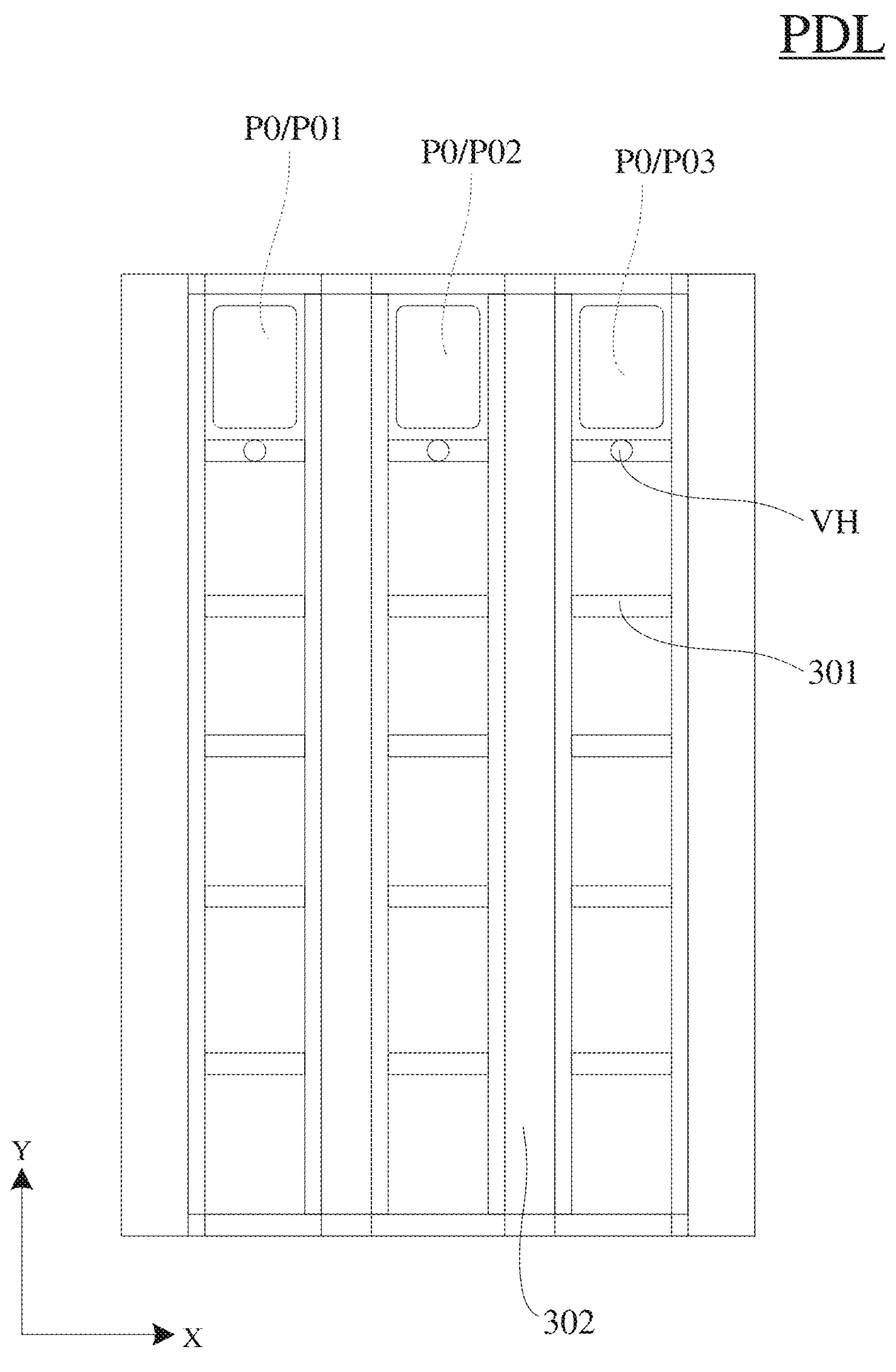
FIG. 9A is a plan view of a pixel definition layer in a display substrate provided by an embodiment of the present disclosure.
Figure 9B:
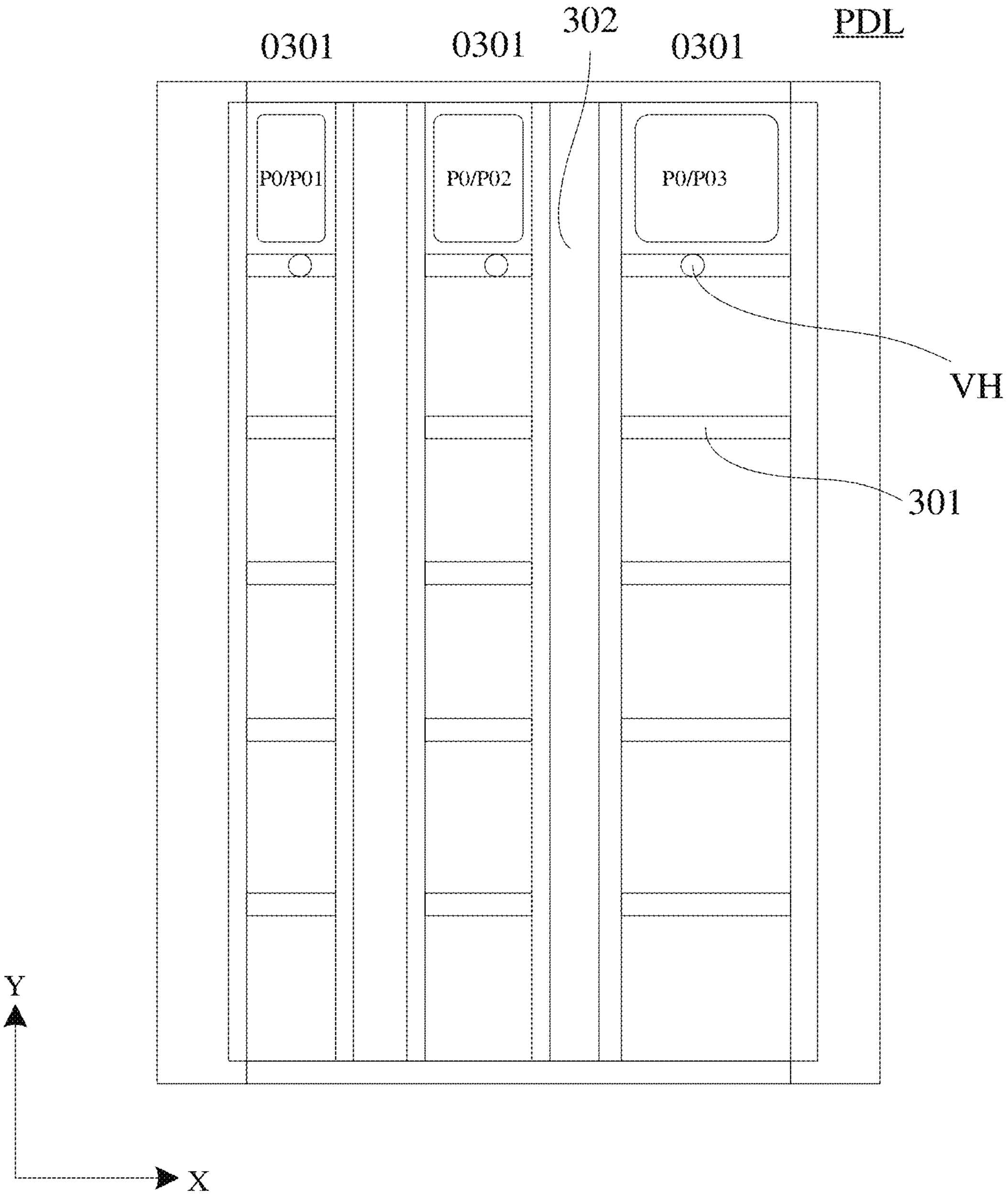
FIG. 9B is a plan view of a pixel definition layer in a display substrate provided by an embodiment of the present disclosure.

FIG. 9A is a plan view of a pixel definition layer in a display substrate provided by an embodiment of the present disclosure. FIG. 9B is a plan view of a pixel definition layer in a display substrate provided by an embodiment of the present disclosure. For example, as shown in FIG. 9A and FIG. 9B, the pixel definition layer PDL includes a plurality of first definition portions 301 and a plurality of second definition portions 302; the plurality of second definition portions 302 are arranged along the second direction X, and the second definition portions 302 extend along the first direction Y; and the plurality of first definition portions 301 are arranged in a plurality of groups 0301, and each group of first definition portions 301 is located between two adjacent second definition portions 302, and the first definition portions 301 extend along the second direction X, and the first definition portions 301 in each group are arranged along the first direction Y.

As shown in FIG. 5, FIG. 9A, and FIG. 9B, the maximum height h1 from the first definition portion 301 to the planarization layer is smaller than the maximum height h2 from the second definition portion 302 to the planarization layer.

Figure 10:
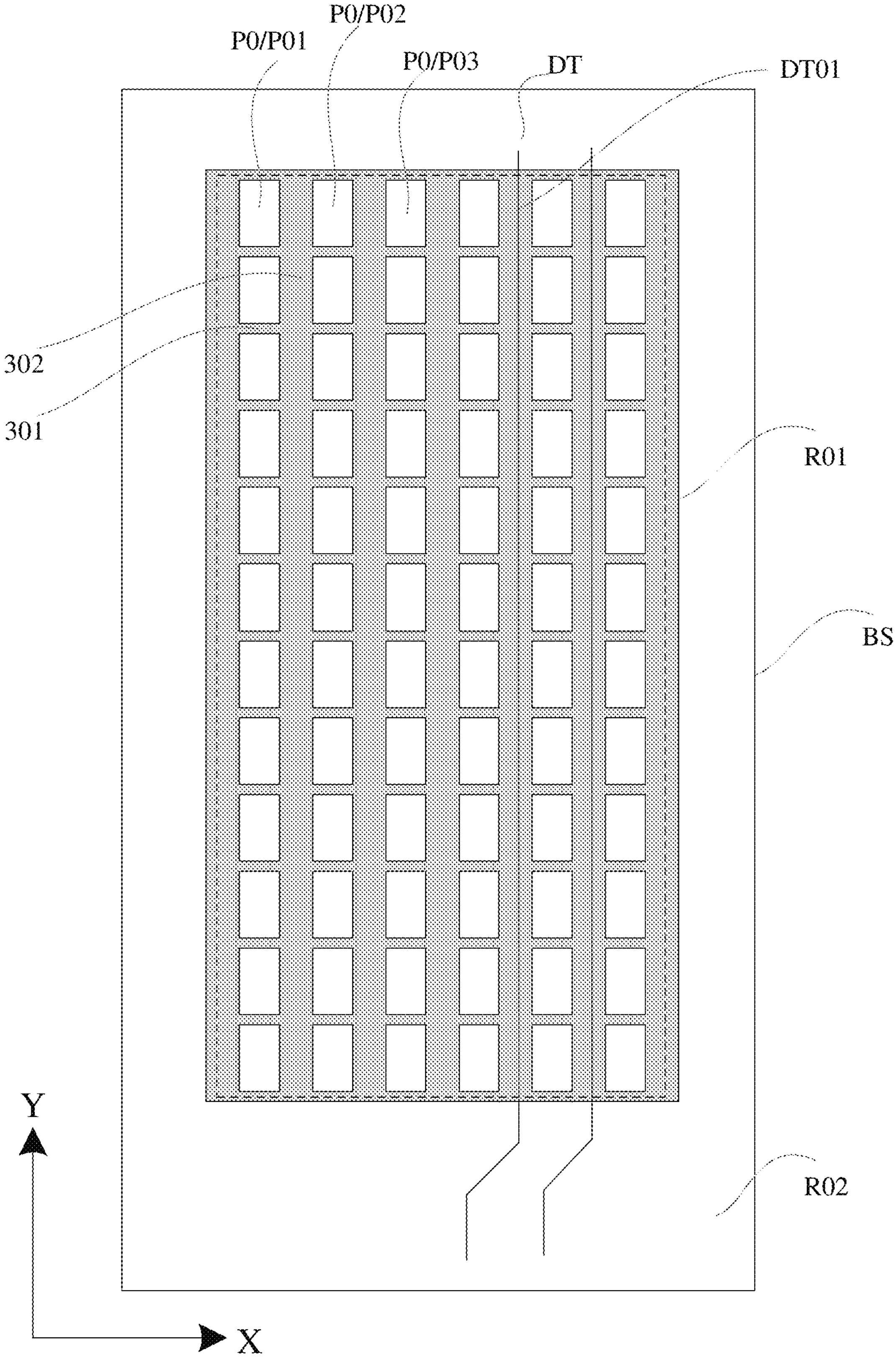
FIG. 10 is a schematic diagram of a display substrate provided by an embodiment of the present disclosure.

FIG. 10 is a schematic diagram of a display substrate provided by an embodiment of the present disclosure. As shown in FIG. 10, the base substrate BS includes a display area R01 and a peripheral area R02 located at at least one side of the display area R01. As shown in FIG. 10, the orthographic projection of the portion DT01 of the data line DT located in the display area R01 on the base substrate BS is within the orthographic projection of the second definition portion 302 on the base substrate BS. As shown in FIG. 10, the orthographic projection of the display area R01 on the base substrate BS is overlapped with the orthographic projection of the pixel definition layer PDL on the base substrate BS. The orthographic projection of the opening P0 of the pixel definition layer PDL on the base substrate BS falls within the orthographic projection of the display area R01 on the base substrate BS.

FIG. 10 shows only two data lines DT. For example, the second definition portion 302 may correspond to one data line, but it is not limited thereto.

In the embodiment of the present disclosure, the pixel circuit is not limited to that shown in FIG. 3, other suitable pixel circuits can be used, and the layout of the display substrate is not limited to those shown in FIG. 4 and FIG. 8. Other layouts can be used, or other layouts based on those shown in FIG. 4 and FIG. 8 after adjustment can be used. For example, the positions of the initialization connection line INT12 of the initialization line INT1 and the initialization connection line INT22 of the initialization line INT2 in FIG. 4 can be exchanged with each other.

As shown in FIG. 4 and FIG. 5, according to an embodiment of the present disclosure, a display substrate is provided, and the display substrate includes a base substrate BS and a plurality of sub-pixels 100 arranged on the base substrate BS.

For example, as shown in FIG. 4 and FIG. 5, the sub-pixel 100 includes: a pixel circuit 100*a*, the pixel circuit 100*a* includes a storage capacitor 20, a first electrode plate 201 is closer to the base substrate BS than a second electrode plate 202; and a light-emitting element 100*b*, the light-emitting element 100*b* includes a first electrode E1, a second electrode E2, and a light-emitting functional layer FL located between the first electrode E1 and the second electrode E2, and the pixel circuit 100*a* is configured to drive the light-emitting element 100*b*.

Figure 11:
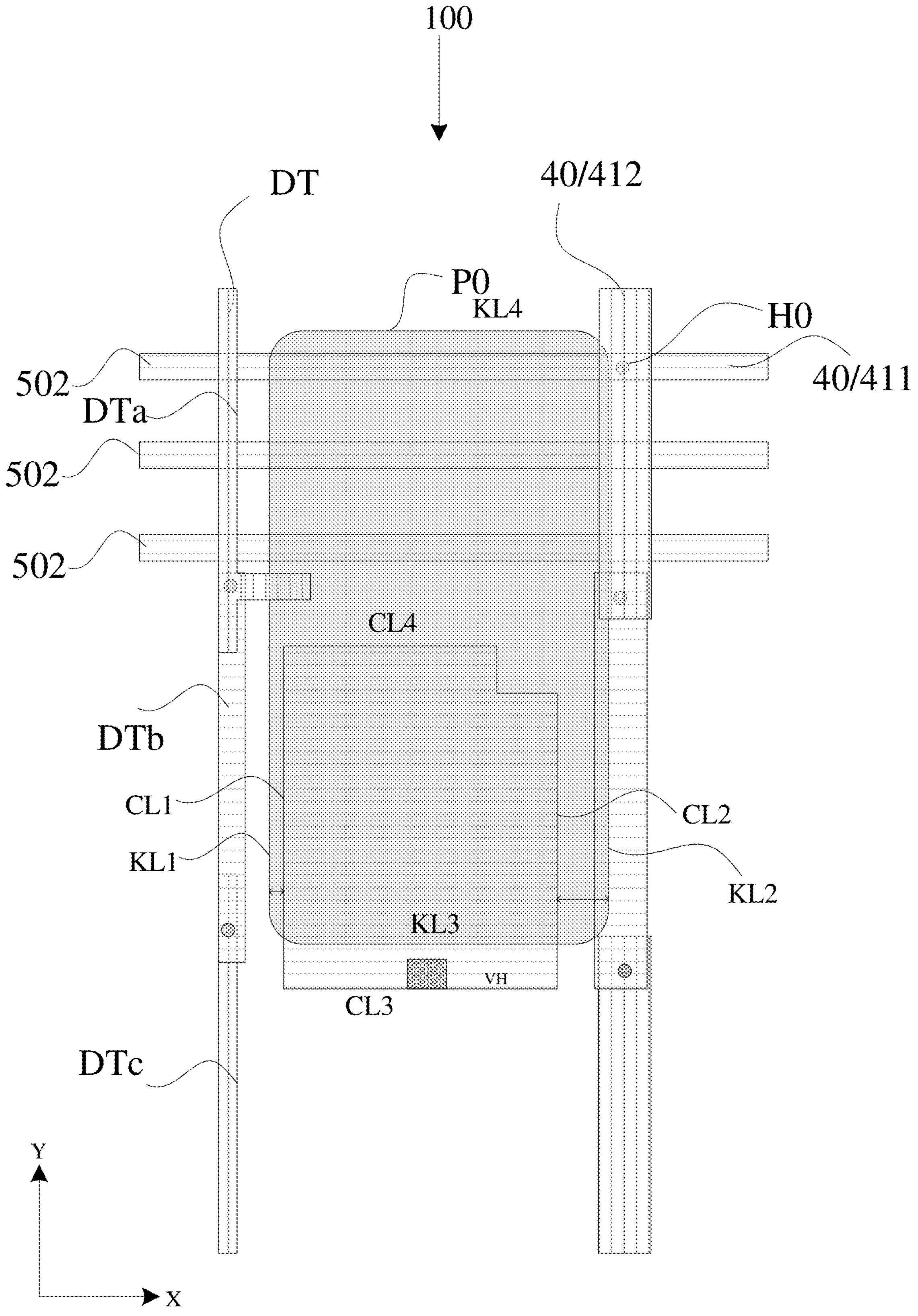
FIG. 11 is a plan view of a display substrate provided by an embodiment of the present disclosure.

FIG. 11 is a plan view of a display substrate provided by an embodiment of the present disclosure. For example, as shown in FIG. 11, the orthographic projection of the opening P0 on the base substrate BS is overlapped with the orthographic projection of the second electrode plate 202 on the base substrate BS.

For example, as shown in FIG. 11, the second electrode plate 202 includes a first edge CL1 extending along the first direction Y and a second edge CL2 extending along the first direction Y, and the opening P0 includes a first edge KL1 extending along the first direction Y and a second edge KL2 extending along the first direction Y, the first edge CL1 of the second electrode plate 202 is closer to the first edge KL1 of the opening P0 than the second edge CL2 of the second electrode plate 202, the second edge CL2 of the second electrode plate 202 is closer to the second edge KL2 of the opening P0 than the first edge CL1 of the second electrode plate 202.

For example, as shown in FIG. 11, the second electrode plate 202 further includes a third edge CL3 extending along the second direction X and a fourth edge CL4 extending along the second direction X, and the opening P0 includes a third edge KL3 extending along the second direction X and a fourth edge KL4 extending along the second direction X.

As shown in FIG. 11, the orthographic projection of the third edge CL3 on the base substrate is located outside the orthographic projection of the opening P0 on the base substrate.

As shown in FIG. 11, the orthographic projection of the fourth edge CL4 on the base substrate is located within the orthographic projection of the opening P0 on the base substrate.

As shown in FIG. 11, the first edge CL1 and the second edge CL2 are arranged opposite to each other, and the third edge CL3 is respectively connected to the first edge CL1 and the second edge CL2 through rounded corners. The third edge CL3 and the fourth edge CL4 are arranged opposite to each other, and the fourth edge CL4 is respectively connected to the first edge CL1 and the second edge CL2 through rounded corners. Of course, in some other embodiments, adjacent edges of the opening may not be connected by the rounded corners.

Figure 12:
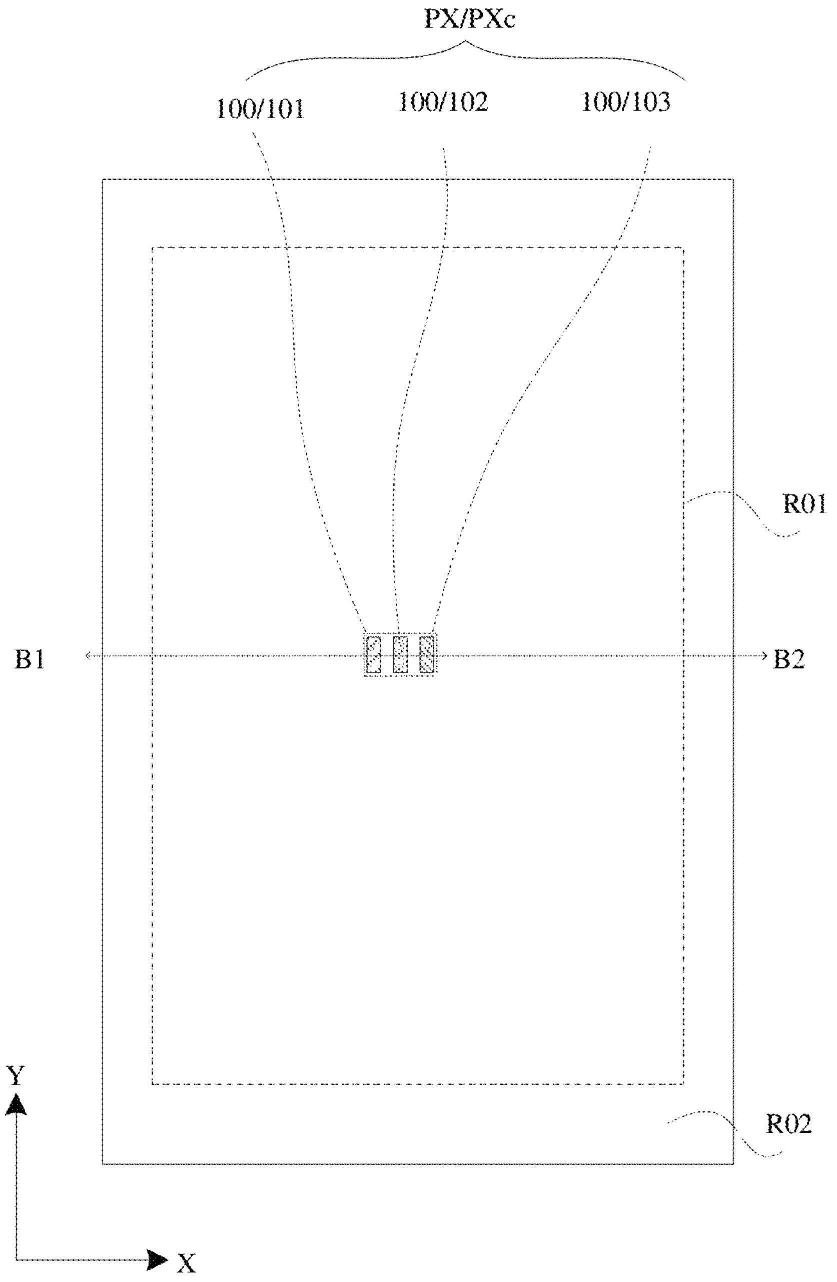
FIG. 12 is a schematic diagram of a central point pixel of a display substrate provided by an embodiment of the present disclosure.
Figure 13:
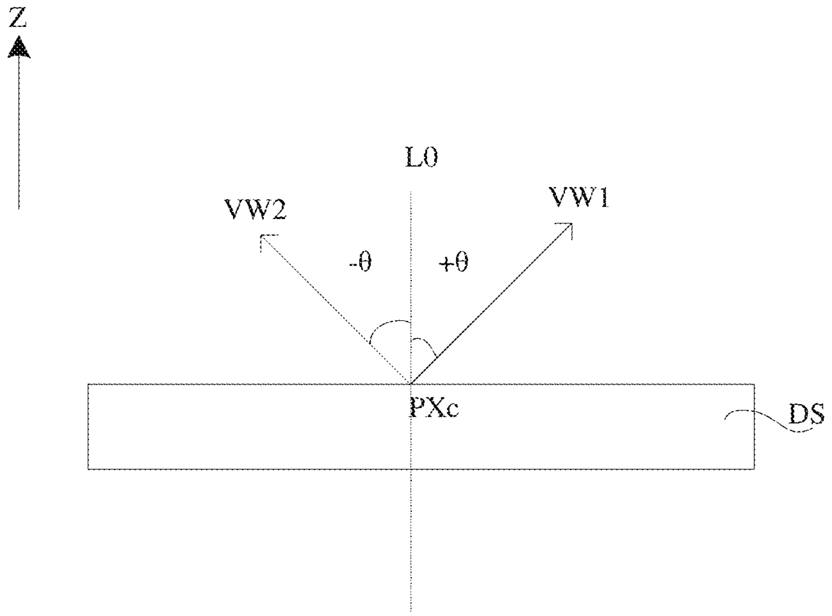
FIG. 13 is a cross-sectional view along line B1-B2 of FIG. 12.
Figure 14:
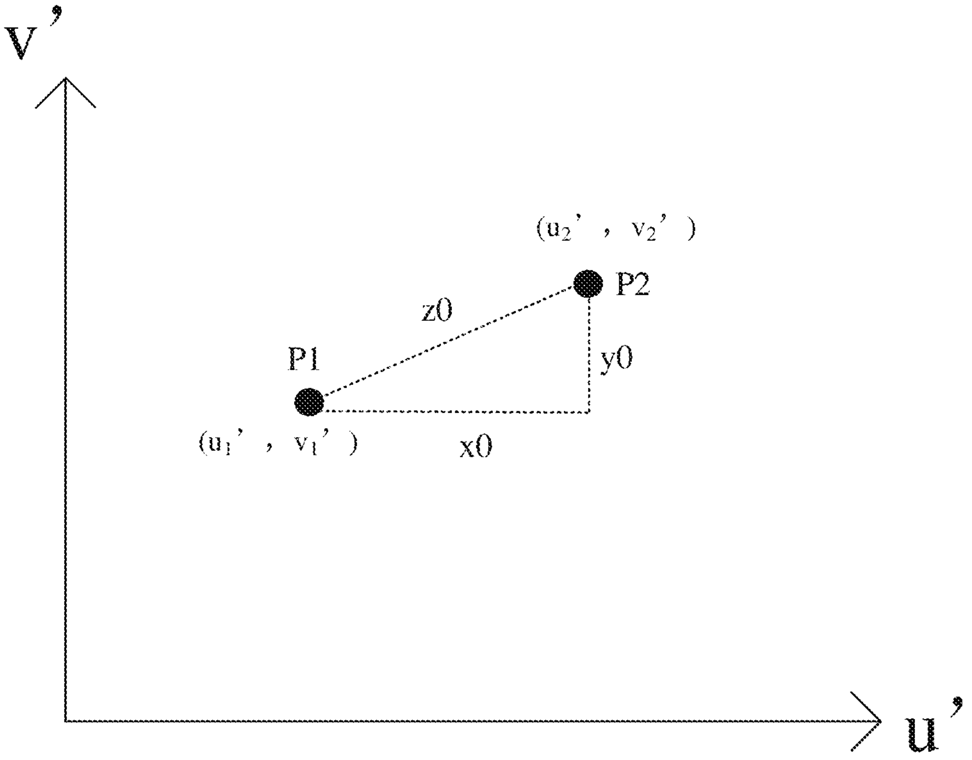
FIG. 14 is a schematic diagram showing coordinate distances of chromaticity coordinate points at two different viewing angles of a display substrate.

FIG. 12 is a schematic diagram of a central point pixel of a display substrate provided by an embodiment of the present disclosure. FIG. 13 is a cross-sectional view along line B1-B2 of FIG. 12. FIG. 14 is a schematic diagram showing coordinate distances of chromaticity coordinate points at two different viewing angles of the display substrate.

FIG. 12 shows the central point pixel PXc. For example, the central point pixel PXc is a pixel PX located at a center point of the display area R01.

For example, a non-contact spectrometer, such as (PR630, 730; CS2000, 2000A) can be used in a dark room (having an illuminance below 11×) to carry out random inspection of the display panel (display substrate) to be tested (by selecting more than 10 pieces of panels or substrates, with the worst data). The test point is the central point pixel of the display panel. The u' and v' coordinates of this point in the 1976UV chromaticity coordinate system of four colors RBGW are read. Measurements are carried out at nine viewing angles of 0°, ±15°, ±30°, ±45°, and ±60°. The u' value and v' value at each viewing angle are obtained by measurement. The color cast at a viewing angle of −60 degrees is illustrated as below by way of example:

$$\Delta u'v' = \sqrt{(u'_2 - u'_1)^2 + (v'_2 - v'_1)^2},$$

where u2' and v2' are the chromaticity coordinates at a viewing angle of −60 degrees (also referred to as −60-degrees viewing angle), and u1' and v1' are the chromaticity coordinates at a viewing angle of 0 degree (also referred to as 0-degree viewing angle).

These values are substituted into the formula to get Δu'v' at −60 degrees, and then get Δu'v' at 60 degrees in a similar way. By optimizing the structure of the display substrate, the difference between the two values of the four colors (RGBW) can be smaller than 0.0015, and the value of Δu'v' at each viewing angle is smaller than 0.025. The first sub-pixel 101 is a sub-pixel that emits red light, the second sub-pixel 102 is a sub-pixel that emits green light, and the third sub-pixel 103 is a sub-pixel that emits blue light. When measuring the color cast of the white light, the first sub-pixel 101, the second sub-pixel 102, and the third sub-pixel 103 of the central point pixel PXc are all turned on.

A uniform color space CIE1976 is converted from CIE1931XYZ.

The calculation formula of the CIE1976Luv includes:

$$\begin{cases} u' = \dfrac{4X}{X + 15Y + 3Z} \\ v' = \dfrac{9Y}{X + 15Y + 3Z} \end{cases}$$

In the formula, u', v' are the chromaticity coordinates of the color sample, and X, Y, Z are the tristimulus values of the sample.

It should be noted that the color cast measuring methods are not limited to that in the above description, and the measuring instruments as adopted are not limited to the examples mentioned above, either. The same measuring instrument can be used to measure the chromaticity coordinates at different viewing angles, and the coordinate distance between the chromaticity coordinate point at each viewing angle and the chromaticity coordinate point at 0-degree viewing angle can be obtained.

The embodiments of the present disclosure are described with reference to the case where the color cast of the central point pixel PXc is measured by way of example. Of course, the color cast of each sub-pixel in other suitable pixels can also be measured.

FIG. 14 shows the coordinate distance between the chromaticity coordinate point P2 and the chromaticity coordinate point P1. As shown in FIG. 14, x0 is the coordinate distance between the abscissa of the chromaticity coordinate point P2 and the abscissa of the chromaticity coordinate point P1, y0 is the coordinate distance between the ordinate of the chromaticity coordinate point P2 and the ordinate of the chromaticity coordinate point P1, and z0 is the coordinate distance between the chromaticity coordinate point P2 and the chromaticity coordinate point P1.

For example, the coordinate distance between chromaticity coordinate points at two viewing angles refers to the square root of the sum of, the square of the difference between the abscissas of the two chromaticity coordinate points, and, the square of the difference between the ordinates of the two chromaticity coordinate points.

For example, as shown in FIG. 11, the sub-pixel 100 satisfies the following formula:

$$\Delta U = |U02 - U01| \leq k \times |Xb - Xa| / KW,$$

where k is the color cast influence coefficient, 0.009≤k≤0.03, ΔU<0.0020, Xa is the minimum distance between the first edge CL1 of the second electrode plate 202 and the first edge KL1 of the opening P0 in the second direction X, Xb is the minimum distance between the second edge CL2 of the second electrode plate 202 and the second edge KL2 of the opening P0 in the second direction X, and the first direction Y intersects with the second direction X; KW is the maximum size of the opening P0 in the second direction X, U01 is the coordinate distance between the chromaticity coordinate point at the first viewing angle and the chromaticity coordinate point at 0-degree viewing angle, U02 is the coordinate distance between the chromaticity coordinate point at the second viewing angle and the chromaticity coordinate point at 0-degree viewing angle, ΔU is the absolute value of a difference between U02 and U01; the chromaticity coordinate point at 0-degree viewing angle is the chromaticity coordinate point at the normal line where the center of the display substrate is located, the first viewing angle and the second viewing angle are respectively located at two opposite sides of the normal line and have the same included angle with respect to the normal line.

FIG. 13 shows the normal line L0 on which the center of the display substrate lies, the normal line L0 is parallel to the third direction Z. FIG. 13 shows a first viewing angle VW1 and a second viewing angle VW2. The included angle between the first viewing angle VW1 and the normal line L0 is +θ, and the included angle between the second viewing angle VW2 and the normal line L0 is −θ. At the positive viewing angle θ, the angle from the normal line L0 to the positive viewing angle is a clockwise rotation angle θ; and at the negative viewing angle −θ, the angle from the normal line L0 to the negative viewing angle is a counterclockwise rotation angle θ.

The situations shown in FIG. 12 and FIG. 13 are applied to the measurement of color cast at the left and right viewing angles. When measuring the color cast at the up and down viewing angles, the first viewing angle VW1 and the second viewing angle VW2 are located at two sides of the normal line L0 in the first direction Y.

For example, U02<0.020, U01 is smaller than 0.020, and ΔU<0.0015.

For example, the first edge KL1 of the opening P0, the first edge CL1 of the second electrode plate 202, the second edge CL2 of the second electrode plate 202, and the second edge KL2 of the opening P0 are arranged in sequence along the second direction X. The minimum distance between the first edge CL1 of the second electrode plate 202 and the second edge CL2 of the second electrode plate 202 in the second direction X is Xc, where Xc/Xa>1.5 or Xc/Xb is greater than 1.5.

For example, the first sub-pixel 101 satisfies the following formula:

$$\Delta U1 = |U2 - U1| \leq k1 \times |X2 - X1| / KW1,$$

where k1 is a coefficient, 0.009≤k1<0.02, X1 is the minimum distance between the first edge CL1 of the second electrode plate 202 of the first sub-pixel 101 and the first edge KL1 of the opening P0 of the first sub-pixel 101 in the second direction X; X2 is the minimum distance between the second edge CL2 of the second electrode plate 202 of the first sub-pixel 101 and the second edge KL2 of the opening P0 of the first sub-pixel 101 in the second direction X, and KW1 is the maximum size of the opening P0 of the first sub-pixel 101 in the second direction X, U1 is the coordinate distance between the chromaticity coordinate point at the first viewing angle and the chromaticity coordinate point at 0-degree viewing angle of the first sub-pixel 101, U2 is the coordinate distance between the chromaticity coordinate point at the second viewing angle and the chromaticity coordinate point at 0-degree viewing angle of the first sub-pixel 101, and ΔU1 is the absolute value of a difference between U2 and U1.

For example, the second sub-pixel 102 satisfies the following formula:

$$\Delta U2 = |U4 - U3| \leq k2 \times |X4 - X3| / KW2,$$

where k2 is a coefficient, $0.004 \leq k2 \leq 0.02$, X3 is the minimum distance between the first edge CL1 of the second electrode plate 202 of the second sub-pixel 102 and the first edge KL1 of the opening P0 of the second sub-pixel 102 in the second direction X; X4 is the minimum distance between the second edge CL2 of the second electrode plate 202 of the second sub-pixel 102 and the second edge KL2 of the opening P0 of the second sub-pixel 102 in the second direction X; KW2 is the maximum size of the opening P0 of the second sub-pixel 102 in the second direction X, U3 is the coordinate distance between the chromaticity coordinate point at the first viewing angle and the chromaticity coordinate point at 0-degree viewing angle of the second sub-pixel 102, U4 is the coordinate distance between the chromaticity coordinate point at the second viewing angle and the chromaticity coordinate point at 0-degree viewing angle of the second sub-pixel 102, and ΔU2 is the absolute value of a difference between U4 and U3.

For example, the ratio of k2 to k1 is smaller than 10 and greater than 0.1.

For example, the third sub-pixel 103 satisfies the following formula:

$$\Delta U3 = |U6 - U5| \leq k3 \times |X6 - X5| / KW3,$$

where k3 is a coefficient, $0.01 \leq k3 < 0.03$, X5 is the minimum distance between the first edge CL1 of the second electrode plate 202 of the third sub-pixel 103 and the first edge KL1 of the opening P0 of the third sub-pixel 103 in the second direction X; X6 is the minimum distance between the second edge CL2 of the second electrode plate 202 of the third sub-pixel 103 and the second edge KL2 of the opening P0 in the second direction X; KW3 is the maximum size of the opening P0 of third sub-pixel 103 in the second direction X, U5 is the coordinate distance between the chromaticity coordinate point at the first viewing angle and the chromaticity coordinate point at 0-degree viewing angle of the third sub-pixel 103, and U6 is the coordinate distance between the chromaticity coordinate point at the second viewing angle and the chromaticity coordinate point at 0-degree viewing angle of the third sub-pixel 103, ΔU3 is the absolute value of a difference between U6 and U5.

For example, as shown in FIG. 11, the display substrate further includes: a data line DT configured to provide a data voltage to the sub-pixel 100, the orthographic projection of at least one of the signal connection line 412 and the data line DT on the base substrate BS is overlapped with the orthographic projection of the opening P0 of at least one sub-pixel of the plurality of sub-pixels 100 on the base substrate BS. In FIG. 11, the orthographic projection of the signal connection line 412 on the base substrate BS is overlapped with the orthographic projection of the opening P0 of the sub-pixel 100 on the base substrate BS. Referring to FIG. 8, for the third sub-pixel 103, the orthographic projection of the data line DT (data line DT3) on the base substrate BS is overlapped with the orthographic projection of the opening P0 of the sub-pixel 100 on the base substrate BS.

During inkjet printing, the flatter the bottom surface (i.e., the first electrode E1 of the light-emitting element) of the opening P0 of the sub-pixel 100 is, the more the color cast can be reduced or avoided, and the better the display effect of the display substrate will be.

The part of the data line DT or the signal connection line 412 that is located directly below the opening P0 can function for flattening, so as to improve the display quality.

For example, the signal connection line 412 includes at least one of a portion of the first power line PL1 extending along the first direction Y and a portion of the initialization line extending along the first direction Y.

For example, as shown in FIG. 11, the signal connection line 412 is connected to the first signal line 411 through a via hole HO.

For example, as shown in FIG. 4 and FIG. 11, in order to flatten the bottom surface of the opening P0 of the sub-pixel 100, the display substrate further includes: a second signal line 502 configured to provide a voltage signal to the sub-pixel 100. The second signal line 502 extends along the second direction X, and the orthographic projection of the second signal line 502 on the base substrate BS is overlapped with the orthographic projection of the opening P0 of at least one sub-pixel in the plurality of sub-pixels 100 on the base substrate BS. In this way, it is beneficial for the longitudinal leveling of the ink during inkjet printing, and the color cast at the up and down viewing angles can be reduced.

For example, referring to FIGS. 4 and 8, the second signal line 502 includes at least one of the gate line G1, the gate line G2, and a portion of the initialization signal line INT1 extending along the second direction X.

For example, referring to FIG. 4 and FIG. 11, in order to improve the PPI and also reduce or avoid color cast, the overlapping size of the signal connection line 412 and the opening P0 in the second direction X is smaller than 10% of the line width of the signal connection line 412, or, the overlapping size of the data line DT and the opening P0 in the second direction X is smaller than 10% of the line width of the data line DT. The line width of a wire refers to a size of the wire in a direction perpendicular to the extending direction of the wire.

For example, as shown in FIG. 4, in a plan view, the size of the portion where the opening P0 of the first sub-pixel 101 overlaps with the initialization connection line INT12 in the second direction X is smaller than 10% of the line width of the initialization connection line INT12.

For example, as shown in FIG. 4, in a plan view, the size of the portion where the opening P0 of the second sub-pixel 102 overlaps with the initialization connection line INT22 in the second direction X is smaller than 10% of the line width of the initialization connection line INT22.

For example, referring to FIG. 5, the display substrate further includes an insulating layer ISL and a via hole VH penetrating the insulating layer ISL, and the via hole VH includes a first via hole VH1, a second via hole VH2, and a third via hole VH3. Referring to FIG. 4 and FIG. 8, the first electrodes E1 of the light-emitting elements 100*b* of the first sub-pixel 101, the second sub-pixel 102, and the third sub-pixel 103 are respectively connected to the pixel circuits 100*a* of the first sub-pixel 101, the second sub-pixel 102, and the third sub-pixel 103 through the first via hole VH1, the second via hole VH2, and the third via hole VH3 respectively.

In the drawings of the embodiments of the present disclosure, description is given with reference to the case where the orthographic projection of the opening P0 of the sub-pixel on the base substrate is not overlapped with the orthographic projection of the via hole VH on the base substrate, by way of example. However, in some other embodiments, the orthographic projection of the opening P0 of the sub-pixel on the base substrate may be overlapped with the orthographic projection of the via hole VH on the base substrate.

For example, in the embodiments of the present disclosure, by means of the design of the film layers at the backplane, such as the design of the elements in the second conductive pattern layer, it can be adapted to the openings having different sizes of the sub-pixels to improve the flatness of the light-emitting functional layer, thereby reducing the color cast at the left and right viewing angles of the display substrate.

Since sub-pixels emitting light of different colors have different luminous efficiencies, the color cast can be reduced and the display quality can be improved by adjusting the size of the openings of the sub-pixels, by adjusting the size of the second electrode plates of the capacitors, and by allowing the openings to be overlapped with the signal lines.

Figure 15A:
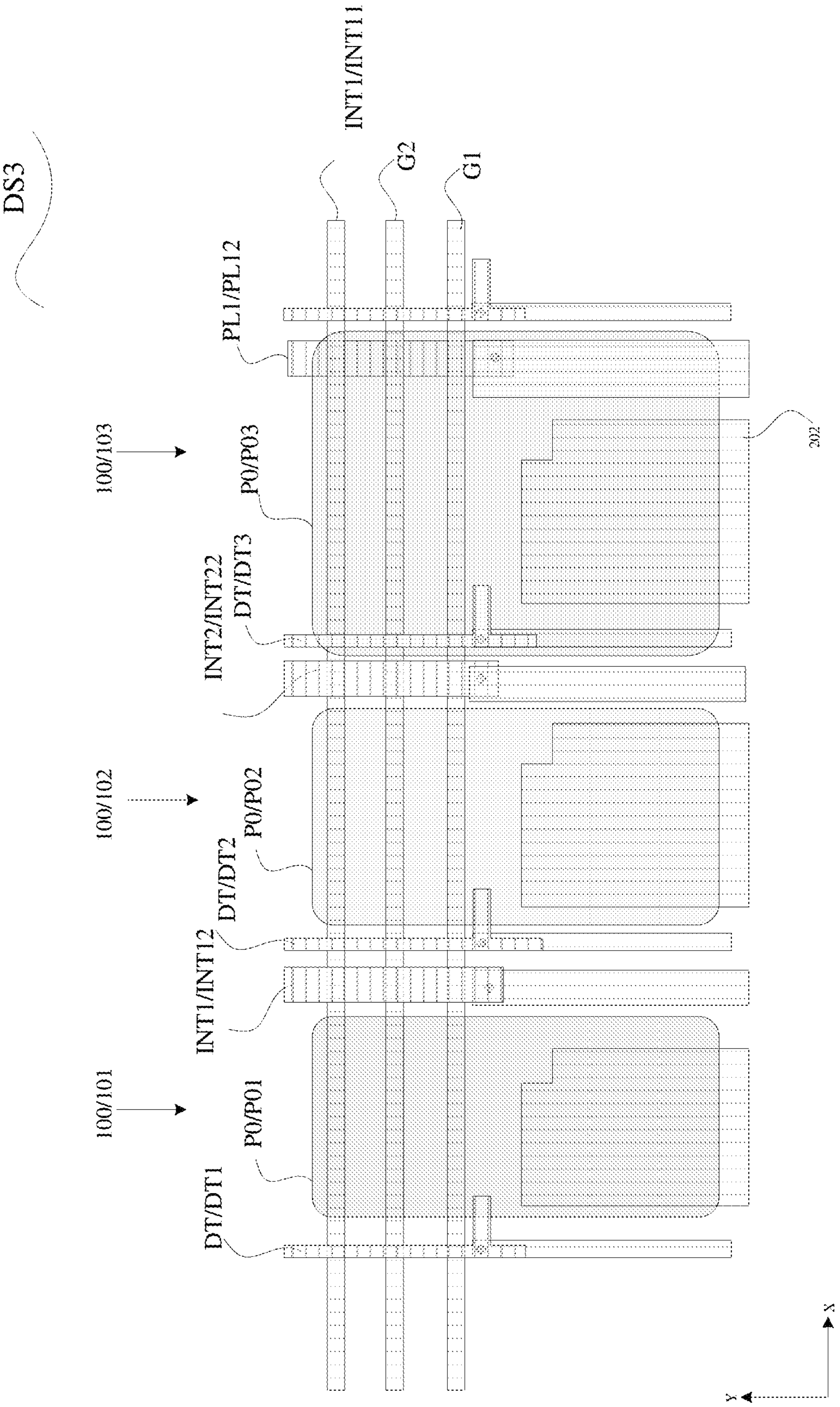
FIG. 15A is a schematic diagram of a display substrate provided by an embodiment of the present disclosure.

FIG. 15A is a schematic diagram of a display substrate provided by an embodiment of the present disclosure. FIG. 15A shows the display substrate DS3. As shown in FIG. 15A, in the display substrate DS3, the size of the second electrode plate 202 of the first sub-pixel 101 in the second direction X is decreased, so that the size of the second electrode plate 202 of the first sub-pixel 101 in the second direction X is smaller than the size of the second electrode plate 202 of the second sub-pixel 102 in the second direction X and is smaller than the size of the second electrode plate 202 of the third sub-pixel 103 in the second direction X. For example, the size of the second electrode plate 202 of the second sub-pixel 102 in the second direction X may be equal to or smaller than the size of the second electrode plate 202 of the third sub-pixel 103 in the second direction X.

As shown in FIG. 15A, in the display substrate DS3, the size of the opening P0 of the first sub-pixel 101 in the second direction X is decreased, so that the size of the opening P0 (opening P01) of the first sub-pixel 101 in the second direction X is smaller than the size of the opening P0 (opening P02) of the second sub-pixel 102 in the second direction X and is smaller than the size of the opening P0 (opening P03) of the third sub-pixel 103 in the second direction X.

As shown in FIG. 15A, the opening P01, the opening P02, and the opening P03 have different areas. That is, the opening P0 of the first sub-pixel 101, the opening P0 of the second sub-pixel 102, and the opening P0 of the third sub-pixel 103 have different areas.

For example, the area of the opening P03 is greater than the area of the opening P01, and the area of the opening P01 is greater than the area of the opening P02, but not limited thereto.

As shown in FIG. 15A, in the display substrate DS3, the opening P0 of the first sub-pixel 101 and the horizontal size of the capacitor 20 are both reduced, the horizontal size of the opening P0 of the third sub-pixel 101 is increased, and the third sub-pixel 101 is flattened at left and right sides thereof with the aid of signal lines.

Referring to FIG. 4 and FIG. 15A, the orthographic projection of the opening P0 of the third sub-pixel 101 on the base substrate is overlapped with the orthographic projection of the data line DT on the base substrate, and is overlapped with the orthographic projection of the first power line PL1 on the base substrate.

As shown in FIG. 15A, the left sides and right sides of the opening P0 of the first sub-pixel 101 and the opening P0 of the second sub-pixel 101 are not flattened by the signal line. In some other embodiments, the size of the opening P0 can also be adjusted so that the orthographic projection of the opening P0 of the second sub-pixel 102 on the base substrate is overlapped with the orthographic projection of the initialization signal line INT2 (initialization signal connection line INT22) on the base substrate; and/or, the orthographic projection of the opening P0 of the first sub-pixel 101 on the base substrate is overlapped with the orthographic projection of the initialization signal line INT1 (initialization signal connection line INT12) on the base substrate, so that one side of the opening P0 of the second sub-pixel 102 and one side of the opening P0 of the first sub-pixel 101 are flattened by the signal line (as shown in FIG. 4).

Figure 15B:
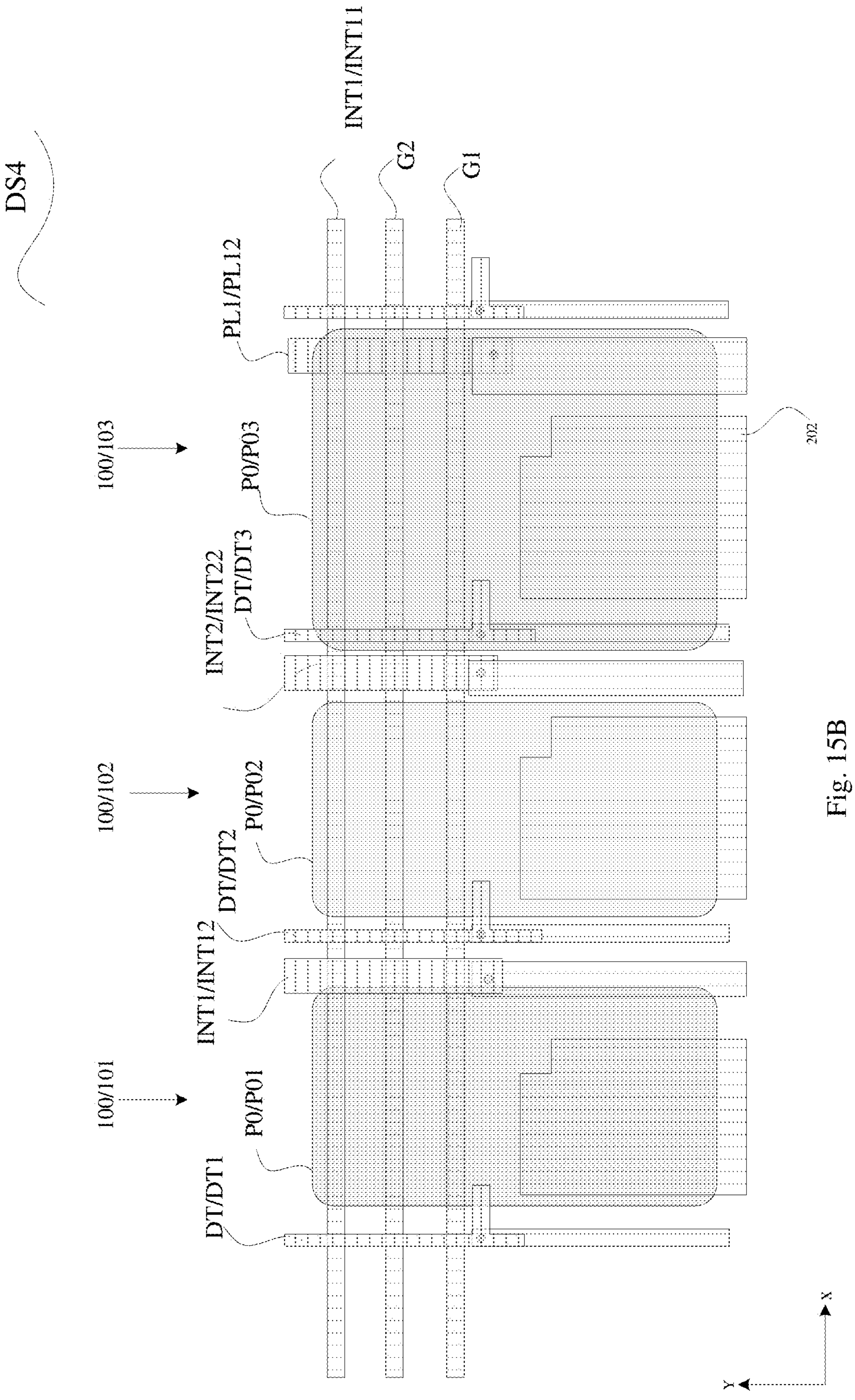
FIG. 15B is a schematic diagram of a display substrate provided by an embodiment of the present disclosure.

FIG. 15B is a schematic diagram of a display substrate provided by an embodiment of the present disclosure. FIG. 15B shows the display substrate DS4. As shown in FIG. 15B, in the display substrate DS4, in order to improve the PPI, the orthographic projection of the opening P0 of the first sub-pixel 101 on the base substrate is overlapped with the orthographic projection of the initialization signal line INT1 (initialization signal connection line INT12) on the base substrate. The size of the overlapping portion of the opening P0 of the first sub-pixel 101 and the initialization connection line INT12 in the second direction X is smaller than 10% of the line width of the initialization connection line INT12.

For example, in the embodiments of the present disclosure, by means of the design of the film layers at the backplane, such as the design of the via hole VH used to connect the first electrode of the light-emitting element and the pixel circuit, it can be adapted to the openings having different sizes of the sub-pixels to improve the flatness of the light-emitting functional layer, thereby reducing the color cast at the left and right viewing angles of the display substrate.

Figure 16:
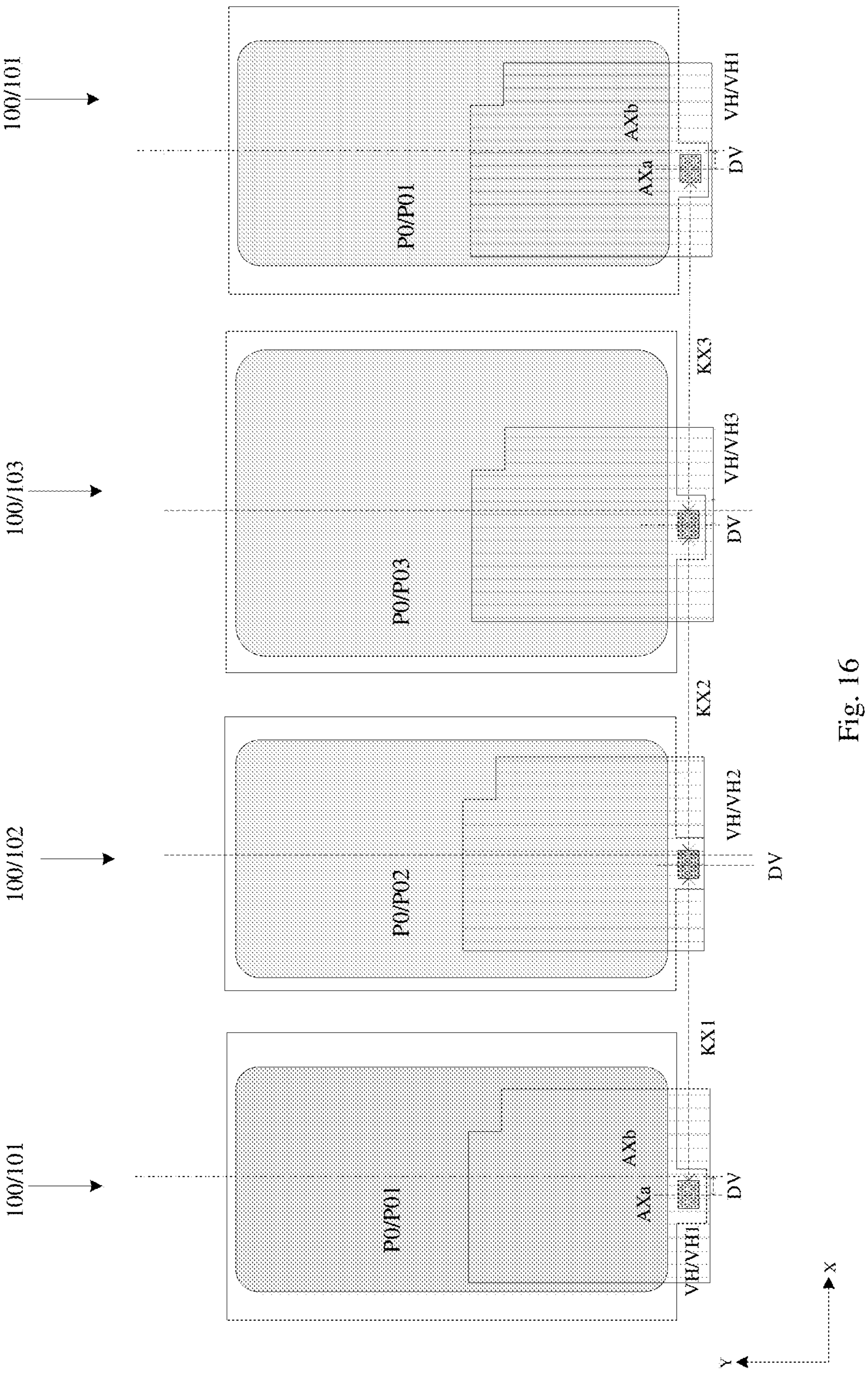
FIG. 16 is a schematic diagram of a display substrate provided by an embodiment of the present disclosure.

FIG. 16 is a schematic diagram of a display substrate provided by an embodiment of the present disclosure. As shown in FIG. 16, the distance between the first via hole VH1 and the second via hole VH2 is KX1, and the distance between the second via hole VH2 and the third via hole VH3 is KX2, wherein the ratio of KX1 to KX2 is 0.75-1.25.

For example, the ratio of KX1 to KX2 is not 1, which can ensure the uniformity of the etching process and can reduce the color cast of the display substrate. After the opening of the third sub-pixel 103 is widened horizontally, the opening of the first sub-pixel 101 and the opening of the second sub-pixel 102 are properly adjusted to make KX1 and KX2 unequal.

As shown in FIG. 16, the distance between the third via hole VH3 and the first via hole VH1 is KX3, wherein the ratio of KX2 to KX3 is 0.75-1.25.

For example, the distance KX3 is not equal to the distance KX1, and the distance KX3 is not equal to the distance KX2.

For example, as shown in FIG. 16, the distance DV between the symmetry axis AXa of the via hole VH extending along the first direction Y and the symmetry axis AXb, extending along the first direction Y, of the opening P0 closest to the via hole VH is smaller than 8 microns, and the diameter of the via hole VH is 8-17 microns. The distance DV is the offset design of the via hole VH. For example, the thickness of the planarization layer PLN is 3-7 micros. For example, by controlling the thickness of the planarization layer, the diameter of the via hole VH and the distance DV, it can reduce the color cast.

For example, in the embodiments of the present disclosure, the thickness of an element refers to the size of the element in a direction perpendicular to the base substrate.

For example, as shown in FIG. 16, the orthographic projection of the via hole VH on the base substrate is not overlapped with the orthographic projection of the opening P0 on the base substrate. The via hole VH and the opening P0 closest to the via hole VH are spaced apart from each other in the first direction Y.

For example, as shown in FIG. 16, the size of the opening P0 of the first sub-pixel 101 in the second direction X is 28-36 microns, and the size of the opening P0 of the second sub-pixel 102 in the second direction X is 30-38 microns, and the size of the opening P0 of the third sub-pixel 103 in the second direction X is 68-74 microns.

Referring to FIG. 9A, the via hole VH is located on the symmetry axis of the opening P0 extending along the first direction Y. That is, the via hole VH is not offset.

Referring to FIG. 9B, the via hole VH is not located on the symmetry axis of the opening P0 extending in the first direction Y. That is, the via VH is designed with an offset. The via hole VH in FIG. 16 is also designed with an offset.

For example, in the embodiments of the present disclosure, by means of the design of the film layers at the backplane, such as the design of the elements in the second conductive pattern layer and the design of the via hole VH used to connect the first electrode of the light-emitting element and the pixel circuit, it can be adapted to the openings having different sizes of the sub-pixels to improve the flatness of the light-emitting functional layer, thereby reducing the color cast at the left and right viewing angles of the display substrate.

For example, referring to FIG. 5, the insulating layer ISL includes a passivation layer PVX and a planarization layer PLN, the material of the passivation layer PVX includes an inorganic insulating material, and the material of the planarization layer PLN includes an organic insulating material. For example, the thickness of the planarization layer PLN is 3-7 microns.

For example, the display substrate satisfies the following formula:

$$1/k = F1(CW/KW) - F2(DV/KW) + F3(DW/KW),$$

where F1 is the capacitance influence coefficient, F2 is the via hole offset influence coefficient, F3 is the signal line influence coefficient, CW is the maximum size of the second electrode plate 202 of the storage capacitor 20 in the second direction X, and CW/KW is the proportion of the storage capacitance 20 occupied in the opening P0, DV is the distance between the symmetry axis of the via hole extending along the first direction Y and the symmetry axis, extending along the first direction Y, of the opening P0 closest to the via hole, and DW is the line width of the signal line; the signal line includes the signal connection line 412. For example, as shown in FIG. 4, the signal connection line 412 includes one of a portion of the first power line PL1 extending along the first direction Y, a portion of the first initialization line INT1 extending along the first direction Y, and a portion of the second initialization line INT2 extending along the first direction Y. That is, the signal connection line 412 includes one of the first power connection line PL12, the first initialization connection line INT12, and the second initialization connection line INT22.

Figure 17:
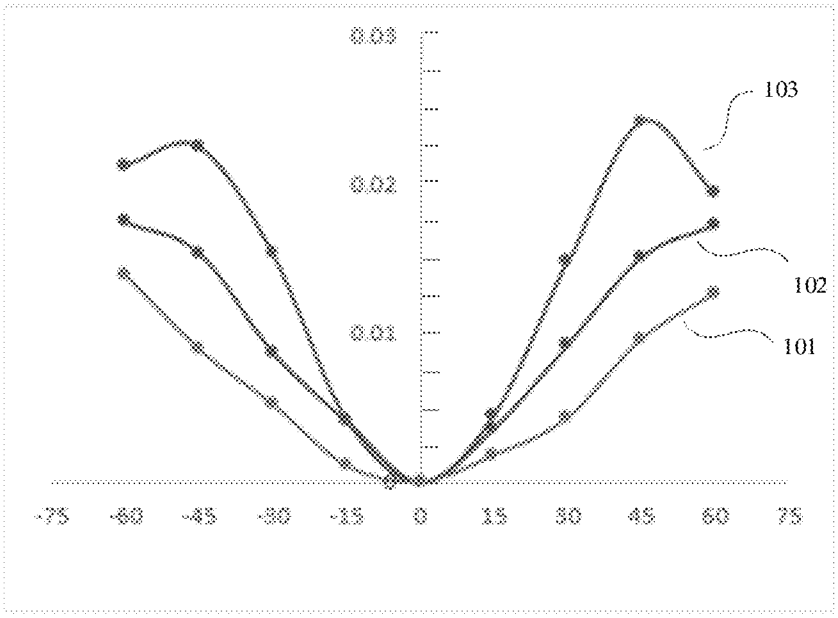
FIG. 17 is a schematic diagram illustrating the issue of color cast of a display substrate provided by an embodiment of the present disclosure.

FIG. 17 is a schematic diagram illustrating color cast of a display substrate provided by an embodiment of the present disclosure. As shown in FIG. 17, compared with the smaller viewing angle, the color cast of the display substrate is more serious at a larger viewing angle; the color cast of the third sub-pixel is greater than the color cast of the second sub-pixel, and the color cast of the second sub-pixel is greater than the color cast of the first sub-pixel. In the embodiments of the present disclosure, by means of the design of the backplane, the color cast of the display substrate is reduced at larger viewing angles such that $U02<0.020$, $U01<0.020$, and $\Delta U<0.0015$, which reduces the color cast and improves the display quality.

The display substrate provided by the embodiments of the present disclosure can reduce the color cast at left and right viewing angles to be smaller than 0.015, and in this case, Tis greater than 70. In addition, in the display substrate provided by the embodiments of the present disclosure, the opening of the sub-pixel is made to be overlapped with the signal connection line (by designing the position of the vertical wiring), so that the problem of color cast of the second sub-pixel (green sub-pixel) is significantly alleviated, and the deviation at the left and right viewing angle of 60 degrees is only 0.0041.

For example, the flattening effect of the structure below the openings of the sub-pixels that is act on the openings is realized by at least one of the following ways: the adjustment of the position relationship between the electrode plate of the capacitor close to the opening of the sub-pixel and the opening, the offset design of the position of the via hole for connecting the first electrode of the light-emitting element and the pixel circuit, and the overlapping arrangement of the signal line and the opening of the sub-pixel; in this way, the flatness of the light-emitting functional layer is improved, and the color cast is reduced or avoided. Furthermore, for example, at least one of the above-mentioned designs can be used to reduce or avoid the color cast at the left and right viewing angles.

For example, the display substrate satisfies the following formula:

$1/T=k\times(CW-DV+DW)/KW$, where $1/T$ is the influence coefficient of color cast alleviation, the first sub-pixel 101 satisfies $1/T1=k1\times(CW-DV+DW)/KW$, the second sub-pixel 102 satisfies $1/T2=k2\times(CW-DV+DW)/KW$, and the third sub-pixel 103 satisfies $1/T3=k3\times(CW-DV+DW)/KW$, wherein $1/T1<0.019$, $1/T2<0.019$, and $1/T3<0.019$.

For example, after increasing the horizontal size of the opening of the third sub-pixel, the size of the capacitor is not increased, but the part of the first power line PL1 extending along the first direction Y (the second part of the first power connection line PL12) is widened; under the condition that the via hole VH is located on the center line as much as possible, the left and right sides of the opening of the third sub-pixel are respectively flattened by using signal lines, so that $1/T3<0.019$, and the color cast of the third sub-pixel at the 45-degree viewing angle and the 60-degree viewing angle is smaller than 0.025.

For example, the ratio of every two of the second electrode plate 202 of the storage capacitor 20 of the first sub-pixel 101, the second electrode plate 202 of the storage capacitor 20 of the second sub-pixel 102, and the second electrode plate 202 of the storage capacitor 20 of the third sub-pixel 103 is in the range of 0.8 to 1.2.

For example, $1/T1<0.009$, $1/T2<0.014$, $1/T3<0.019$.

For example, $1/T1<0.008$, $1/T2<0.003$, $1/T3<0.016$.

For example, for the third sub-pixel, under the condition that the via hole VH is located on the center line as much as possible, and that the left and right sides of the opening of the third sub-pixel are respectively flattened by using signal lines, the width of the electrode plate of the storage capacitor of the third sub-pixel can be further enlarged, to make $1/T3<0.016$, so that the color cast is smaller than 0.023.

For 1/T2, since the deviation of the via hole VH from the symmetry axis (central axis) of the opening P0 of the second sub-pixel 102 in the first direction Y is about 0.5 microns, and the opening P0 of the second sub-pixel 102 has a minimum size (horizontal size) in the second direction X, for example, the value of CW/KW of the second sub-pixel is greater than the value of CW/KW of the first sub-pixel, and the value of CW/KW of the first sub-pixel is greater than the value of CW/KW of the third sub-pixel. For example, $X4-X3$ is smaller than $X6-X5$, $X6-X5$ is smaller than $X2-X1$, so that the color cast of the second sub-pixel is only 0.0004 and 0.0002 at the viewing angle of 45 degrees and the viewing angle of 60 degrees, respectively. KW is the maximum size of the opening P0 in the second direction X, CW is the maximum size of the second electrode plate 202 of the storage capacitor 20 in the second direction X, and CW/KW is the proportion of the storage capacitor 20 occupied in the opening P0.

For example, $1/T1<0.008$, $1/T2<0.010$, $1/T3<0.013$.

For example, the width of the first electrode plate and the second electrode plate of the storage capacitor of the third sub-pixel can be further enlarged, that is, the size of the second electrode plate of the storage capacitor of the third sub-pixel in the second direction X can be increased. For example, the ratio of the size of the second electrode plate of the storage capacitor of the third sub-pixel in the second direction X to the size of the second electrode plate of the storage capacitor of the first sub-pixel or the second sub-pixel in the second direction X is greater than 1.4, and the value of CW/KW of the second sub-pixel, the value of CW/KW of the first sub-pixel, and the value of CW/KW of the third sub-pixel are all between 0.8 and 1.2. The color cast of the first sub-pixel 101, the color cast of the second sub-pixel 102, and the color cast of the third sub-pixel 103 are all taken into consideration, to avoid expanding the difference between 1/T1, 1/T2, and 1/T3.

For example, $0.2<Tx/Ty<6$, where Tx is one of T1, T2, T3, and Ty is one of T1, T2, T3.

For example, $1<Tx/Ty<6$, Tx is one of T1, T2, T3, and Ty is one of the other two of T1, T2, T3.

For example, $4<Tx/Ty<6$, Tx is one of T1, T2, T3, and Ty is one of the other two of T1, T2, T3.

For example, at the O viewing angle and −O viewing angle, the first sub-pixel 101 satisfies $1/T11=k11\times(CW-DV+DW)/KW$; at the P viewing angle and −P viewing angle, the first sub-pixel 101 satisfies $1/T12=k12\times(CW-DV+DW)/KW$, $1/T11<0.009$, $1/T12<0.008$. Furthermore, for example, $1/T11<0.007$, $1/T12<0.006$. In some embodiments, $1/T11<0.005$, $1/T12<0.004$.

For example, $|1/T12-1/T11|<0.001$. Furthermore, for example, $|1/T12-1/T11|<0.0005$.

For example, at the O viewing angle and −O viewing angle, the second sub-pixel 102 satisfies $1/T21=k21\times(CW-DV+DW)/KW$; at the P viewing angle and −P viewing angle, the second sub-pixel 102 satisfies $1/T22=k22\times(CW-DV+DW)/KW$, $1/T21<0.014$, $1/T22<0.004$.

For example, $|1/T22-1/T21|<0.010$. Furthermore, for example, $|1/T22-1/T21|<0.005$.

For example, $1/T21<0.010$, $1/T22<0.004$. For example, $1/T21<0.009$, $1/T22<0.003$. In some embodiments, $1/T21<0.008$, $1/T22<0.002$. Furthermore, for example, $1/T21<0.005$, $1/T22<0.005$.

For example, at the O viewing angle and −O viewing angle, the third sub-pixel 103 satisfies $1/T31=k31\times(CW-DV+DW)/KW$; at the P viewing angle and −P viewing angle, the third sub-pixel 103 satisfies $1/T32=k32\times(CW-DV+DW)/KW$, $1/T31<0.016$, $1/T32<0.019$. Furthermore, for example, $1/T31<0.010$, $1/T32<0.015$. In some embodiments, $1/T31<0.008$, $1/T32<0.010$.

For example, $|1/T32-1/T31|<0.003$. Furthermore, for example, $|1/T32-1/T31|<0.0015$.

For example, $1/T31<0.012$, $1/T32<0.014$.

For example, in some embodiments, the O viewing angle and the −O viewing angle are respectively 60-degree viewing angle and −60-degree viewing angle, and the P viewing angle and −P viewing angle are respectively 45-degree viewing angle and −45-degree viewing angle.

For example, as shown in FIG. 5, the first conductive pattern layer LY1 is closer to the base substrate BS than the second conductive pattern layer LY2.

Since the slope angle of the elements in the first conductive pattern layer LY1 is smaller than the slope angle of the elements in the second conductive pattern layer LY2, the elements in the second conductive pattern layer LY2 are three stacked sublayers of Ti—Al—Ti with the middle sublayer being retracted inwardly, the increase of the exposed area of the middle sublayer (Al layer) will generate aluminum protrusions and cause poor adhesion with the passivation layer PVX. The poor adhesion between the elements in the second conductive pattern layer LY2 and the passivation layer PVX can be improved by offsetting the centers of the elements in different conductive pattern layers.

Figure 18:
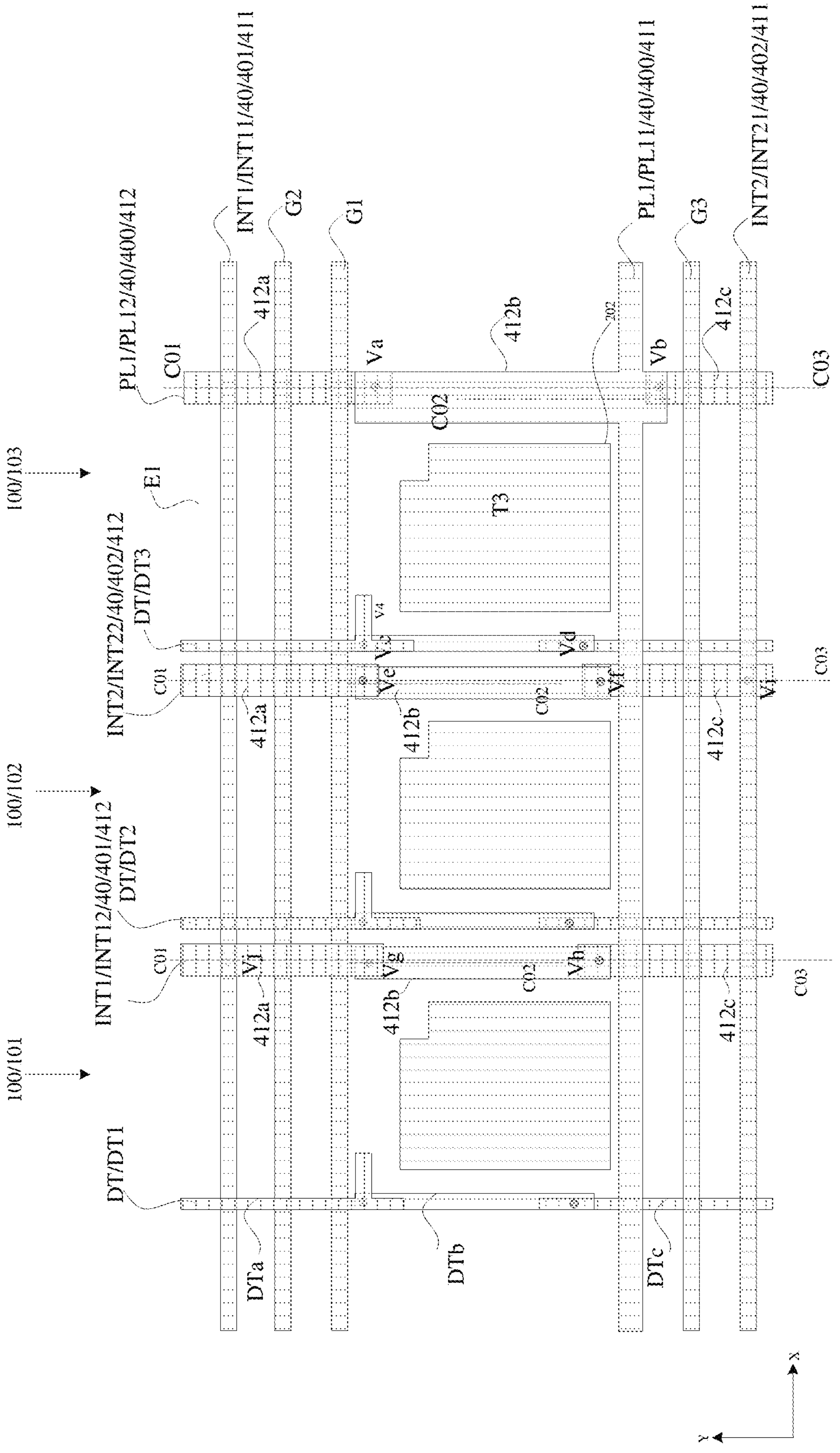
FIG. 18 is a schematic diagram of a conductive structure in the display substrate shown in FIG. 4.

FIG. 18 is a schematic diagram of the conductive structure in the display substrate shown in FIG. 4. For example, as shown in FIG. 4 and FIG. 18, the width of the second part 412*b* of the signal connection line 412 in the second direction X is greater than the width of one of the first part 412*a* and the third part 412*c* of the signal connection line 412 in the second direction X. For example, the widths of the first part 412*a* and the third part 412*c* in the second direction X may be the same, but are not limited thereto.

Figure 19:
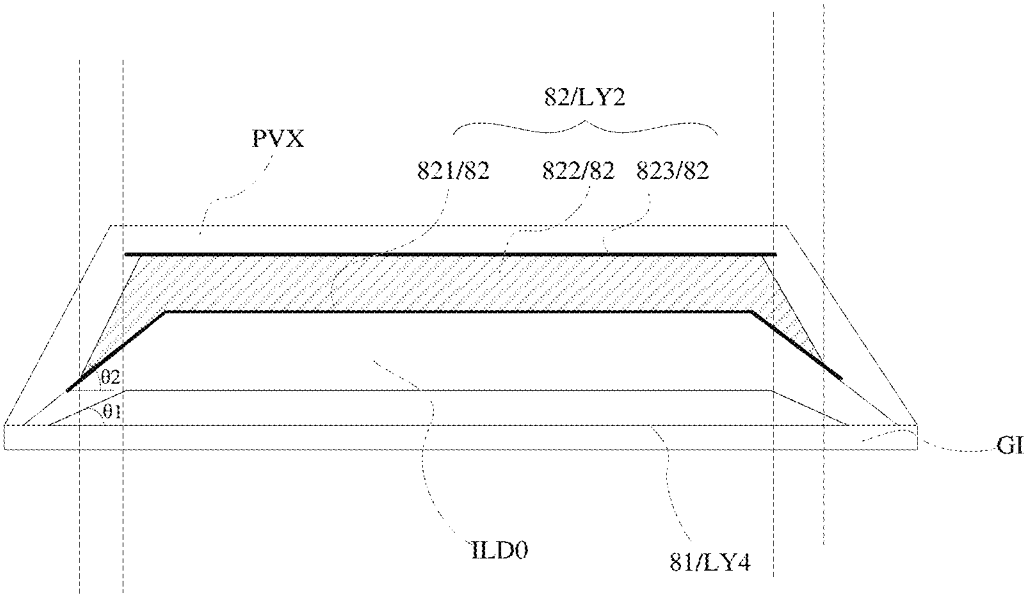
FIG. 19 is a schematic diagram of a display substrate.

For example, as shown in FIG. 4 and FIG. 18, at least one of the first part 412*a* and the third part 412*c* of the signal connection line 412 is not coincident with the centerline of the second part 412*b* of the signal connection line 412 along the first direction Y. FIG. 18 shows the centerline C01 of the first part 412*a* along the first direction Y, the centerline C02 of the second part 412*b* along the first direction Y, and the centerline C03 of the third part 412*c* along the first direction Y. As shown in FIG. 18, the centerline C01 of the first part 412*a* along the first direction Y is not coincident with the centerline C02 of the second part 412*b* along the first direction Y. and the centerline C03 of the third part 412*c* along the first direction Y is not coincident with the centerline C02 of the second part 412*b* along the first direction Y. That is, the signal line formed in segments adopts a center offset design between different parts. FIG. 19 is a schematic diagram of a display substrate. As shown in FIG. 19, in order to reduce the resistance, a third conductive pattern layer LY4 can be arranged between the first conductive pattern layer LY1 and the second conductive pattern layer LY2, so as to reduce the resistance of at least one of the initialization signal line INT1, the initialization signal line INT2 and the first power line PL1. The material of the third conductive pattern layer LY4 may be the same as the material of the first conductive pattern layer LY1, so that the slope angle $\theta 1$ of the elements in the third conductive pattern layer LY4 is smaller than the slope angle $\theta 2$ of the elements in the second conductive pattern layer LY2. Since the elements in the second conductive pattern layer LY2 are three stacked sub-layers Ti—Al—Ti with the middle sub-layer being contracted inwardly, the increase of the exposed area of the middle sub-layer (Al layer) will generate aluminum protrusions and cause poor adhesion with the passivation layer PVX. The poor adhesion between the elements in the second conductive pattern layer LY2 and the passivation layer PVX can be improved by offsetting the centers of the elements in different conductive pattern layers.

As shown in FIG. 18, the size of the second part 412*b* of the first power connection line PL12 in the second direction X is greater than the size of the second part 412*b* of the initialization connection line INT22 in the second direction X, and is greater than the size of the second part 412*b* of the initialization connection line INT12 in the second direction X.

FIG. 19 shows the conductive member 82 and the conductive member 81 located in the second conductive pattern layer LY2, the conductive member 82 includes a first sublayer 821, a second sublayer 822, and a third sublayer 823. For example, the material of the first sub-layer 821 and the third sub-layer 823 includes Ti, and the material of the second sub-layer 822 includes Al. FIG. 19 also shows the gate insulating layer GI and the interlayer insulating layer ILD0.

For example, the thickness of the first sub-layer 821 and the thickness of the third sub-layer 823 are in the range of 800-1400 angstroms, but are not limited thereto. For example, the thickness of the conductive member 82 is in the range of 5800-7800 angstroms, but it is not limited thereto.

Figure 20:
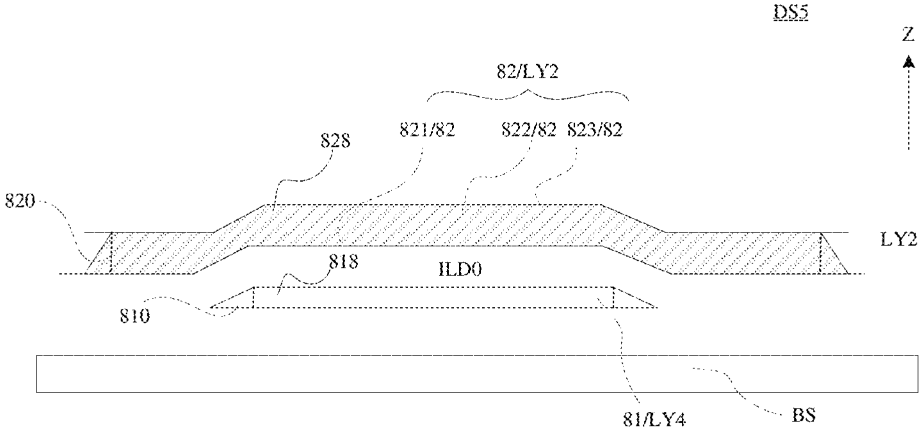
FIG. 20 is a schematic diagram of a display substrate provided by an embodiment of the present disclosure.

FIG. 20 is a schematic diagram of a display substrate provided by an embodiment of the present disclosure. FIG. 20 shows a display substrate DS5. As shown in FIG. 20, the orthographic projection of the conductive member 81 on the base substrate BS is overlapped with the orthographic projection of the conductive member 82 on the base substrate BS, and the orthographic projections of the two slope portions 820 of the conductive member 82 on the base substrate BS are respectively located outside the orthographic projections of the two slope portions 810 of the conductive member 81 on the base substrate BS. FIG. 20 shows the boundary between the main body portion and the slope portions of the conductive member by using dashed lines.

Figure 21:
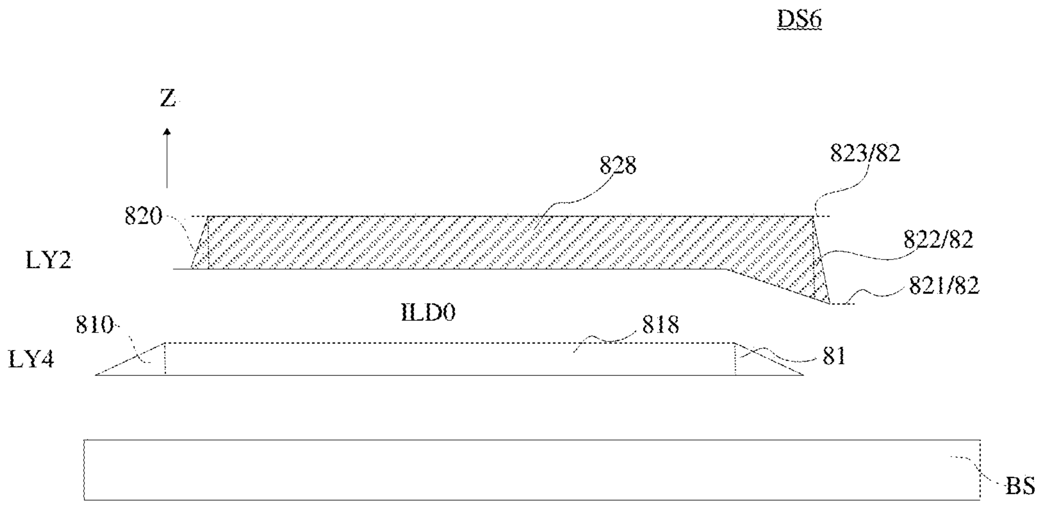
FIG. 21 is a schematic diagram of a display substrate provided by an embodiment of the present disclosure.

FIG. 21 is a schematic diagram of a display substrate provided by an embodiment of the present disclosure. FIG. 21 shows a display substrate DS6. As shown in FIG. 21, the orthographic projection of the conductive member 81 on the base substrate BS is overlapped with the orthographic projection of the conductive member 82 on the base substrate BS, and the orthographic projection of one slope portion 820 of the conductive member 82 on the base substrate BS is located between the orthographic projections of the two slope portions 810 of the conductive member 81 on the base substrate BS, and the orthographic projection of the other slope portion 820 of the conductive member 82 on the base substrate BS is located outside the orthographic projections of the two slope portions 810 of the conductive member 81 on the base substrate BS. FIG. 21 shows the boundary between the main body portion and the slope portions of the conductive member by using dashed lines.

Figure 22:
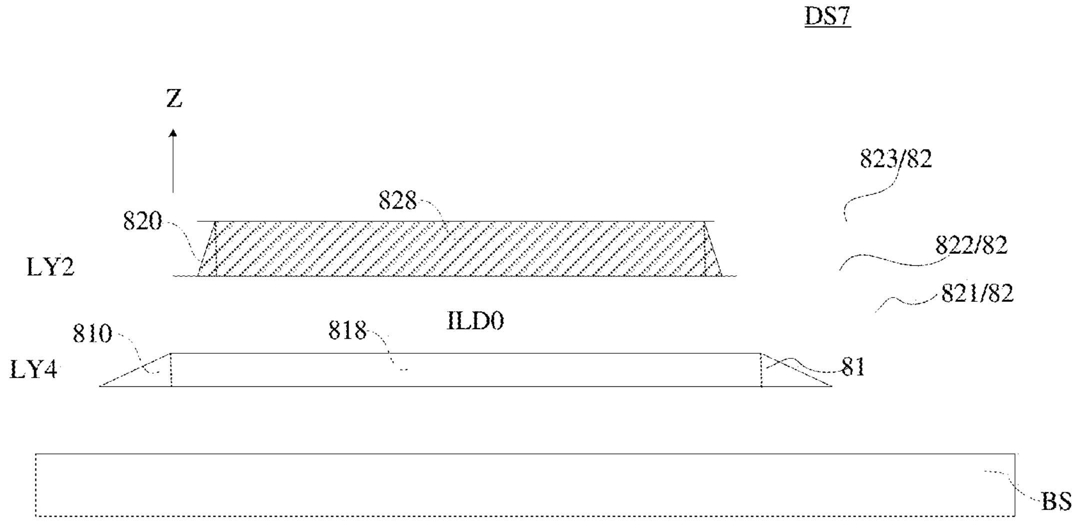
FIG. 22 is a schematic diagram of a display substrate provided by an embodiment of the present disclosure.

FIG. 22 is a schematic diagram of a display substrate provided by an embodiment of the present disclosure. FIG. 22 shows a display substrate DS7. As shown in FIG. 22, the orthographic projection of the conductive member 81 on the base substrate BS is overlapped with the orthographic projection of the conductive member 82 on the base substrate BS, and the orthographic projections of the two slope portions 820 of the conductive member 82 on the base substrate BS are located between the orthographic projections of the two slope portions 810 of the conductive member 81 on the base substrate BS. FIG. 22 shows the boundary between the main body portion and the slope portions of the conductive member by using dashed lines.

The portion between the two slope portions is the main body portion. FIGS. 20 to 22 illustrate the main body portion 818 of the conductive member 81 and the main body portion 828 of the conductive member 82.

In order to solve the problem of poor adhesion between the elements in the second conductive pattern layer LY2 and the passivation layer PVX, a method of offsetting the centerlines of the two elements overlapped in the direction perpendicular to the base substrate or reducing the line widths of the elements located in the second conductive pattern layer LY2 to be smaller than the line widths of the elements located in the third conductive pattern layer LY4 can be used. In the case that the first power line PL1 includes the conductive member 81 and the conductive member 82, due to the requirement for a large voltage on the first power line PL1, the line width of the conductive member 82 can be made greater than the line width of the conductive member 81, and the boundary of the first sublayer 821 at one side can be made not to exceed the boundary of the upper surface of the conductive member 81. That is, the structure shown in FIG. 22 is adopted.

Of course, the initialization line INT1 may include the conductive member 81 and the conductive member 82, and the initialization line INT2 may also include the conductive member 81 and the conductive member 82.

Figure 23:
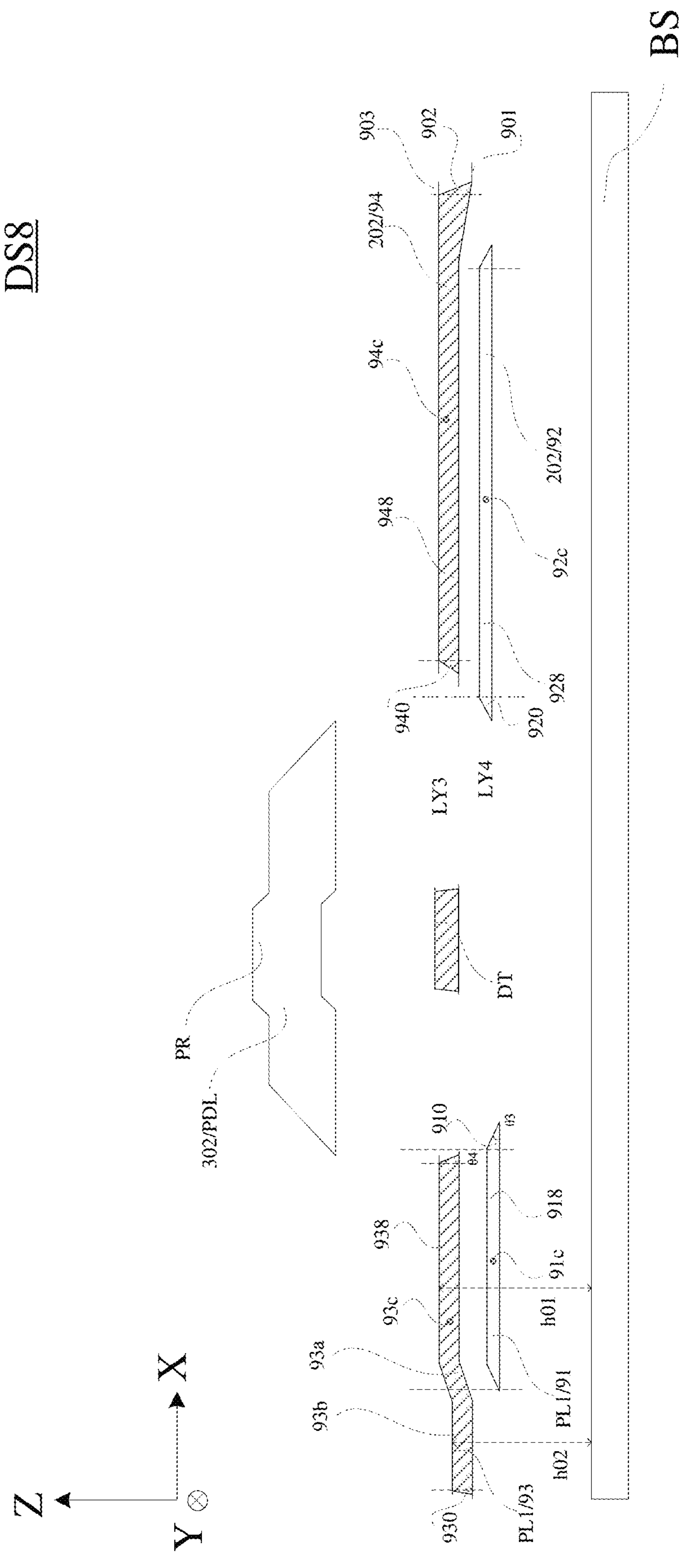
FIG. 23 is a schematic diagram of a display substrate provided by an embodiment of the present disclosure.

FIG. 23 is a schematic diagram of a display substrate provided by an embodiment of the present disclosure. FIG. 23 shows a display substrate DS8.

As shown in FIG. 23, the orthographic projection of the data line DT on the base substrate BS is overlapped with the orthographic projection of the second definition portion 302 of the pixel definition layer PDL on the base substrate BS, so that the second definition portion 302 has a protrusion PR, to facilitate the flow of ink into the openings in the pixel definition layer during inkjet printing.

For example, as shown in FIG. 23, the display substrate further includes a third conductive pattern layer LY4 and a second conductive pattern layer LY2, the data line DT includes a part located on the second conductive pattern layer LY2, and the third conductive pattern layer LY4 further includes a first conductive part 91 and a second conductive part 92, the second conductive pattern layer LY2 further includes a third conductive part 93 and a fourth conductive part 94; the first conductive part 91 and the third conductive part 93 are overlapped with each other in the direction perpendicular to the base substrate BS and are located at one side of the second definition portion 302, the second conductive part 92 and the fourth conductive part 94 are overlapped with each other in the direction perpendicular to the base substrate BS and are located at the other side of the second definition portion 302; the centerlines of the first conductive part 91 and the third conductive part 93 along the first direction Y are not coincident, and the centerlines of the second conductive part 92 and the fourth conductive part 94 along the first direction Y are not coincident. FIG. 23 shows the centerline 91*c* of the first conductive part 91, the centerline 92*c* of the second conductive part 92, the centerline 93*c* of the third conductive part 93, and the centerline 94*c* of the fourth conductive part 94.

For example, as shown in FIG. 23, the first conductive part 91 includes a main body portion 918 and slope portions 910 located at two sides of the main body portion 918, and the orthographic projection of one end of the third conductive part 93 close to the second definition portion 302 on the base substrate BS is within the orthographic projection of the main body portion 918 of the first conductive part 91 on the base substrate BS.

For example, as shown in FIG. 23, the third conductive part 93 includes a main body portion 938 and slope portions 930 located at two sides of the main body portion 938, and the slope angle θ4 of each slope portion 930 of the third conductive part 93 is greater than the slope angle θ3 of each slope portion 910 of the first conductive part 91.

For example, as shown in FIG. 23, the main body portion 938 of the third conductive part 93 includes a first main body portion 93*a* and a second main body portion 93*b*. The orthographic projection of the first main body portion 93*a* on the base substrate BS is overlapped with the orthographic projection of the first conductive part 91 on the base substrate BS, the orthographic projection of the second main body portion 93*b* on the base substrate BS is not overlapped with the orthographic projection of the first conductive part 91 on the base substrate BS. The maximum distance h02 between the surface of the second main body portion 93*b* facing away from the base substrate BS and the base substrate BS is smaller than the maximum distance h01 between the surface of the first body portion 93*a* facing away from the base substrate BS and the base substrate BS.

For example, as shown in FIG. 23, at least one of the third conductive part 93 and the fourth conductive part 94 includes a first sublayer 901, a second sublayer 902, and a third sublayer 903. The first sublayer 901, the second sublayer 902, and the third sublayer 903 are arranged in a stacked manner, wherein the first sublayer 901 is closer to the base substrate BS than the third sublayer 903, and the second sublayer 902 is retracted inwardly relative to the first sublayer 901 and the third sublayer 903.

As shown in FIG. 23, the part (the third conductive part 93) of the first power line PL1 located in the second conductive pattern layer LY2 is designed to be offset leftwards with respect to the first conductive part 91, which can improve the flowing of the printing ink during inkjet printing, thereby reducing the ink climbing.

Figure 24:
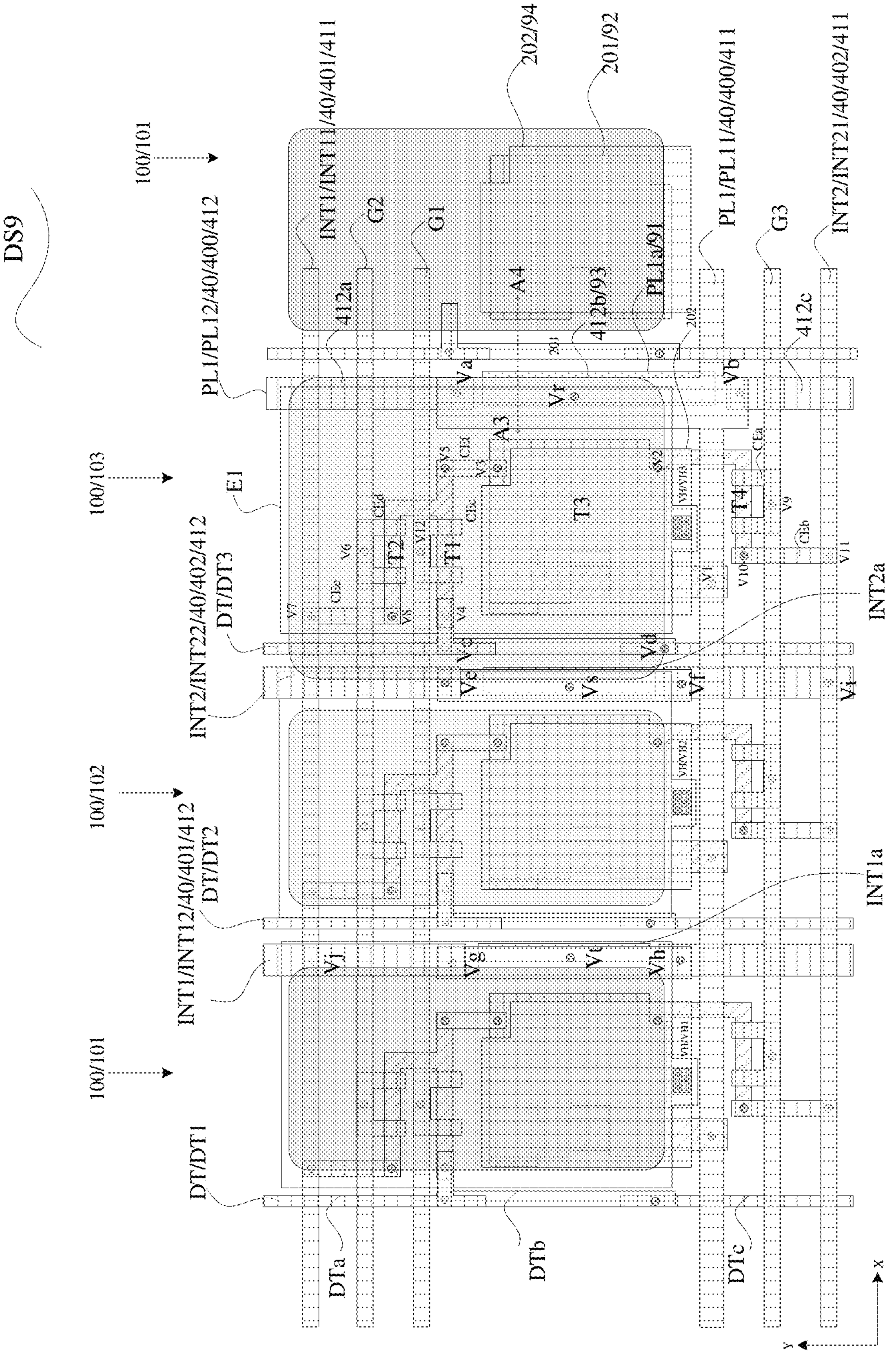
FIG. 24 is a schematic diagram of a display substrate provided by an embodiment of the present disclosure.
Figure 25:
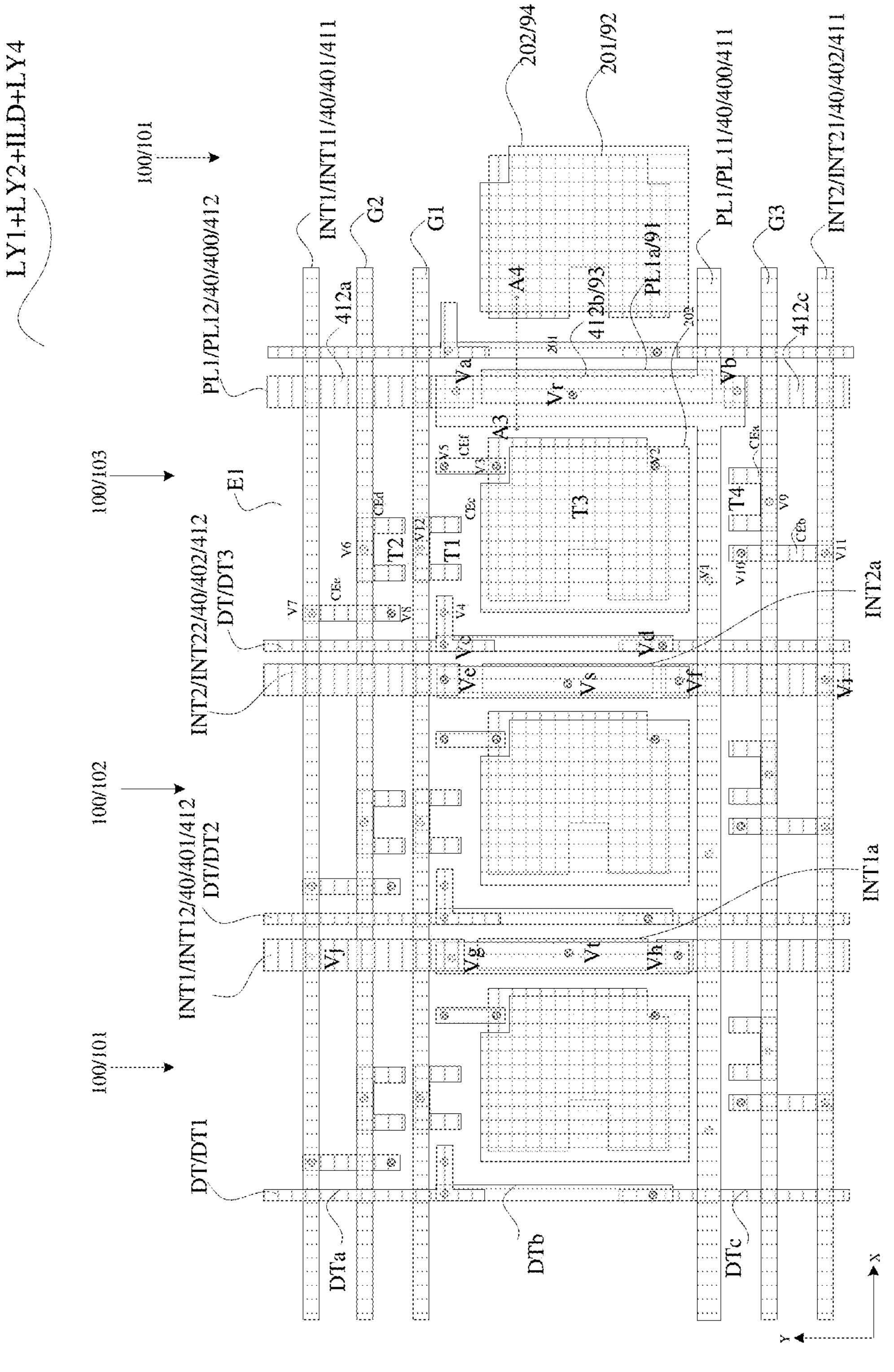
FIG. 25 is a plan view of part of film layers in FIG. 24.
Figure 26:
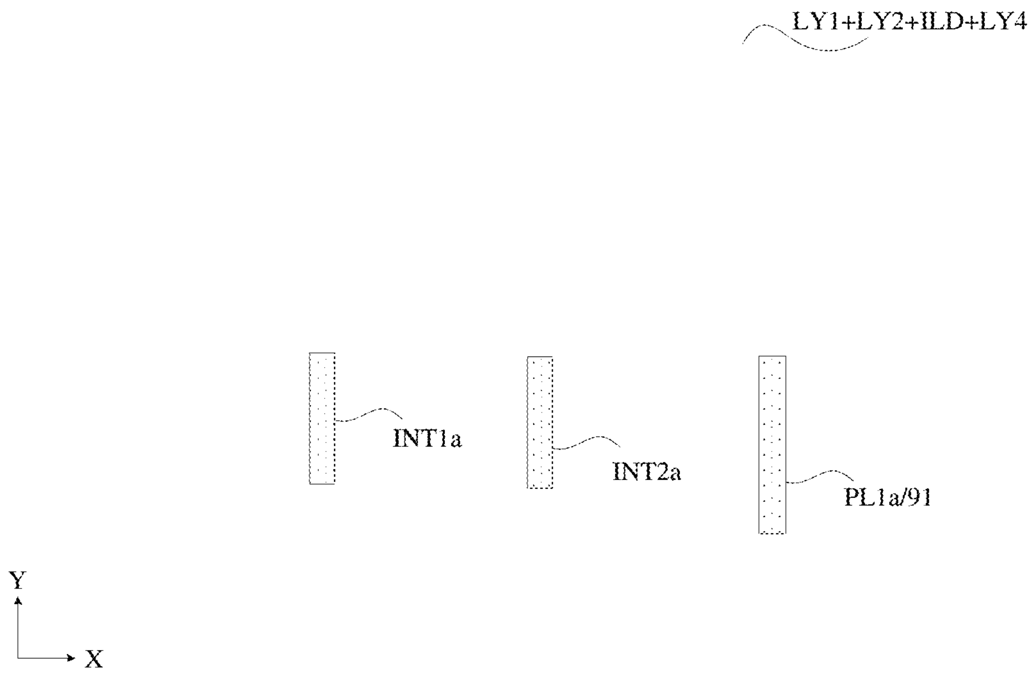
FIG. 26 is a plan view of a fourth conductive pattern layer in FIG. 24.

FIG. 24 is a schematic diagram of a display substrate provided by an embodiment of the present disclosure. FIG. 24 shows a display substrate DS9. FIG. 23 may be a cross-sectional view along line A3-A4 of FIG. 24. FIG. 25 is a plan view of part of the film layers in FIG. 24. FIG. 26 is a plan view of the third conductive pattern layer in FIG. 24.

As shown in FIGS. 24 to 26, the third conductive pattern layer LY4 includes a conductive member PL1*a*, a conductive member INT2*a*, and a conductive member INT1*a*. The conductive member PL1*a* may be the first conductive part 91.

As shown in FIG. 24 and FIG. 25, the second part 412*b* of the first power line PL1 is connected to the conductive member PL1*a* through the via hole Vr to reduce the resistance of the first power line PL1, and the second part 412*b* of the initialization line INT2 is connected to the conductive member INT2*a* through the via hole Vs to reduce the resistance of the initialization line INT2, and the second part 412*b* of the initialization line INT1 is connected to the conductive member INT1*a* through the via hole Vt to reduce the resistance of the initialization line INT1.

Figure 27:
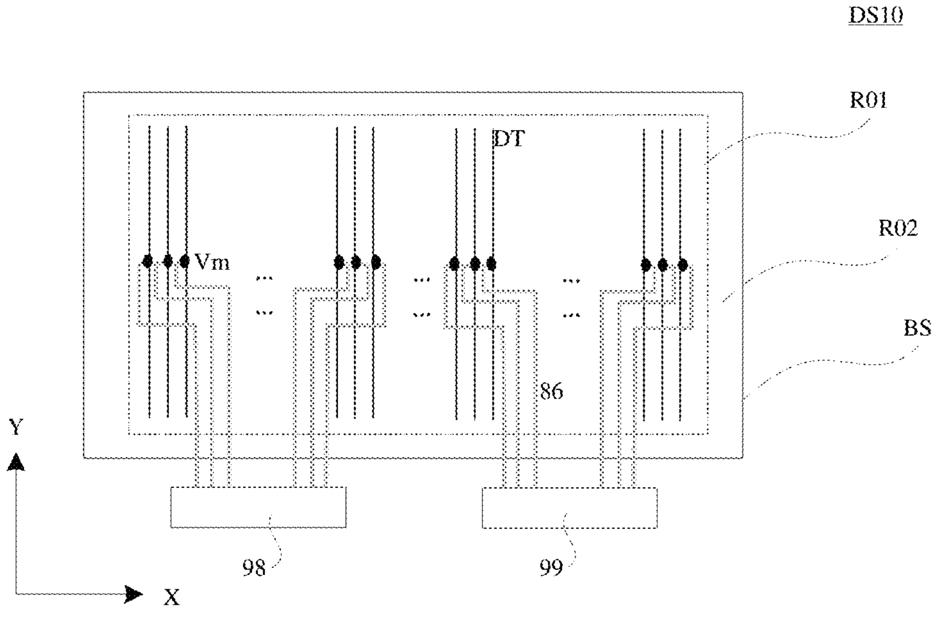
FIG. 27 is a schematic diagram of a display substrate provided by an embodiment of the present disclosure.

FIG. 27 is a schematic diagram of a display substrate provided by an embodiment of the present disclosure. FIG. 27 shows a display substrate DS10.

For example, as shown in FIG. 27, the display substrate DS10 further includes a plurality of fan-out lines 86, the base substrate BS includes a display area R01 and a peripheral area R02 located at at least one side of the display area R01, and the data line DT is connected to one of the plurality of fan-out lines 86, and the plurality fan-out lines 86 gradually converge in a direction from a position close to the connection point between the data line DT and the fan-out line 86 to a position away from the connection point between the data line DT and the fan-out line; the plurality of fan-out lines extend from the display area R01 to the peripheral area R02, the plurality of fan-out lines 86 are located at a layer different from that of the data lines DT, and the plurality of fan-out lines 86 are closer to the base substrate BS than a part of the data line DT. Referring to FIGS. 4 and 27, the plurality of fan-out lines 86 are closer to the base substrate BS than the second part 412*b* of the data line DT. The first part 412*a* and the third part 412*c* of the data line DT are closer to the base substrate BS than the plurality of fan-out lines 86.

For example, as shown in FIG. 27, the length of the portion of the fan-out line 86 located in the display area R01 is longer than the length of the portion of the fan-out line 86 located in the peripheral area R02. The display area is an area for image display. The peripheral area is a non-display area.

For example, the plurality of fan-out lines 86 may be located between the first conductive pattern layer LY1 and the second conductive pattern layer LY2. That is, it can be regarded as replacing the aforementioned patterns in the third conductive pattern layer LY4 with the plurality of fan-out lines 86 shown in FIG. 27. As shown in FIG. 27, the plurality of fan-out lines 86 gradually converge from top to bottom.

FIG. 27 also shows a chip 98 and a chip 99, and the chip 98 and the chip 99 may be Chip On Flex (or Chip On Film, COF). The data line DT is connected to the chip through the fan-out line 86.

As shown in FIG. 27, one data line DT is connected to one fan-out line 86 through a via hole Vm, and the via hole Vm penetrates the insulating layer between the data line DT and the fan-out line 86. For example, the via hole Vm penetrates the interlayer insulating layer ILD0.

For example, the display substrate satisfies the following formula: $1/k=T'(CW-DV+DW)/KW+e^{F4(DH/PH)}$, where T' is a coefficient, T' is greater than or equal to 20 and smaller than 70, and F4 is a coefficient, F4 is greater than 6 and smaller than 30, where DH is the thickness of the data line DT, and PH is the thickness of the planarization layer PLN. Furthermore, for example, F4 is greater than 10 and smaller than 30.

For example, the thickness DH of the data line DT is 0.5 to 2.5 microns. In some embodiments, the thickness DH of the data line DT is 0.5 micron, 0.7 micron, 0.9 micron, 1.1 microns, 1.3 microns, 1.5 microns, 1.7 microns, 1.9 microns, or 2.1 microns.

For example, the first sub-pixel 101 satisfies $1/k1=T'(CW-DV+DW)/KW+e^{Fa(DH/PH)}$.

The second sub-pixel 102 satisfies $1/k2=T'(CW-DV+DW)/KW+e^{Fb(DH/PH)}$.

The third sub-pixel 103 satisfies $1/k3=T'(CW-DV+DW)/KW+e^{Fc(DH/PH)}$.

For example, $20 \leq T \leq 50$, $Fa<27$, $Fb<26$, $Fc<23$.

For example, $20 \leq T' \leq 30$, $Fa<27$, $Fb<26$, $Fc<23$.

For example, in some embodiments, T'=20.

For example, 20≤T<50, 10<Fa<24. Furthermore, for example, 20≤T<40. In some embodiments, T'=20.

For example, 20≤T<50, 10<Fb<23. In some embodiments, T'=20.

For example, 20≤T'≤50, 8<Fc<19. In some embodiments, T'=20.

In common inkjet printing products, the thickness of the planarization layer PLN is greater than the thickness of the evaporated products. However, the display substrate provided by the embodiments of the present disclosure can decrease the thickness of the planarization layer through the design of the backplane. As a result, the width of the via hole VH is reduced to significantly alleviate the color cast.

For example, in an embodiment of the present disclosure, the thickness of the planarization layer is 3-7 microns. Optionally, the thickness of the planarization layer is 3 microns, 3.2 microns, 3.4 microns, 3.6 microns, 3.8 microns, 4 microns, 4.2 microns, 4.4 microns, 4.6 microns, 4.8 microns, 5 microns, 5.2 microns, 5.4 microns, 5.6 microns, 5.8 microns, 6 microns, 6.2 microns, 6.4 microns, 6.6 microns, 6.8 microns, or 7 microns.

Referring to FIG. 5, generally, the thicker the planarization layer is, the better the planarizing effect of the light-emitting functional layer will be; however, since the via hole VH has an offset in the second direction X (horizontal direction), when the thickness of the planarization layer increases, the depth of the hole VH increases, the diameter of the via hole VH will increase accordingly, which will be unfavorable for the alleviation of color cast. Therefore, the thickness of the planarization layer is designed to be smaller than or equal to 7 microns. After adjusting and designing the wire routing of the second conductive pattern layer, in order to further increase the planarizing effect, the minimum thickness of the planarization layer is 3 microns, so that values of both of U02 and U01 of the first sub-pixel 101, the second sub-pixel 102, and the third sub-pixel 103 at 45-degree viewing angle and 60-degree viewing angle are smaller than 0.025.

For example, the insulating layer ISL shown in FIG. 5 may include an inorganic material layer and an organic material layer, or include an organic material layer and an organic material layer. The via hole in the insulating layer ISL is not limited to be fabricated in a single process. In order to reduce the diameter of the via hole, it may be formed by fabricating nested-holes for multiple times to facilitate the flatness of the light-emitting functional layer and reduce the color cast. The ratio of the diameter of the uppermost via hole to the width of the opening of the sub-pixel is smaller than 0.3. Furthermore, for example, the ratio of the diameter of the uppermost via hole to the width of the opening of the sub-pixel is 0.22, 0.23, 0.24, 0.25, 0.26, 0.27, 0.28, or 0.29. The width of the opening of the sub-pixel may refer to the maximum size of the opening of the sub-pixel in the second direction X.

For example, 0.09<DH/PH<0.16, 20≤T'≤25.

For example, 0.17<DH/PH<0.38, 25≤T'≤30.

Referring to FIG. 4, FIG. 5, FIG. 8, FIG. 9A to FIG. 11, FIG. 15A to FIG. 16, and FIG. 18, some embodiments of the present disclosure provide a display substrate, including: a base substrate BS and a plurality of sub-pixels 100 on the base substrate BS, wherein the sub-pixels include a plurality of first sub-pixels 101 (R) and a plurality of second sub-pixels 102 (G), the plurality of sub-pixels 100 are arranged along the first direction Y or along the second direction X, the first direction Y intersects with the second direction X; an active semiconductor layer LY0 located at one side of the base substrate BS; a first conductive pattern layer LY1 located at a side of the active semiconductor layer LY0 away from the base substrate BS; a second conductive pattern layer LY2 located at a side of the first conductive pattern layer LY1 away from the base substrate BS; an insulating layer ISL1 located at a side of the second conductive pattern layer LY2 away from the base substrate BS; and an insulating layer ISL2 located at a side of the insulating layer ISL1 away from the base substrate BS. The second conductive pattern layer includes a plurality of conductive elements, and the conductive elements include a first conductive element corresponding to the first sub-pixel 101 and a second conductive element corresponding to the second sub-pixel 102; the second insulating layer includes a plurality of openings P0 configured to define the effective light-emitting areas of the sub-pixels, and the openings P0 include a first opening P01 corresponding to the first sub-pixel 101 and a second opening P02 corresponding to the second sub-pixel 102, the areas of the first opening P01 and the second opening P02 are different. The first sub-pixel 101 satisfies the following relationship: $\Delta U1=|U2-U1|<k1\times|X2-X1|/KW1$, where k1 is a coefficient, $0.009\le k1\le 0.02$, X1 is the minimum distance between the first edge CL1 of the first conductive element of the first sub-pixel 101 and the first edge KL1 of the opening P0 corresponding to the first sub-pixel 101 in the second direction X; X2 is the minimum distance between the second edge CL2 of the first conductive element of the first sub-pixel 101 and the second edge KL2 of the opening P0 corresponding to the first sub-pixel 101 in the second direction X, KW1 is the maximum size of the opening P0 corresponding to the first sub-pixel 101 in the second direction X, U1 is the coordinate distance between the chromaticity coordinate point at the first viewing angle and the chromaticity coordinate point at 0-degree viewing angle of the first sub-pixel 101, U2 is the coordinate distance between the chromaticity coordinate point at the second viewing angle and the chromaticity coordinate point at 0-degree viewing angle of the first sub-pixel 101, and ΔU1 is the absolute value of a difference between U2 and U1. The second sub-pixel 102 satisfies the following relationship: $\Delta U2=/U4-U3|<k2\times|X4-X3|/KW2$, where k2 is a coefficient, $0.004\le k2\le 0.02$, and X3 is the minimum distance between the first edge CL1 of the second conductive element of the second sub-pixel 102 and the first edge KL1 of the opening P0 corresponding to the second sub-pixel 102 in the second direction X; X4 is the minimum distance between the second edge CL2 of the second conductive element of the second sub-pixel 102 and the second edge KL2 of the opening P0 corresponding to the second sub-pixel 102 in the second direction X; KW2 is the maximum size of the opening P0 corresponding to the second sub-pixel 102 in the second direction X, U3 is the coordinate distance between the chromaticity coordinate point at the first viewing angle and the chromaticity coordinate point at 0-degree viewing angle of the second sub-pixel 102, U4 is the coordinate distance between the chromaticity coordinate point at the second viewing angle and the chromaticity coordinate point at 0-degree viewing angle of the second sub-pixel 102, and ΔU2 is the absolute value of a difference between U4 and U3; $0.1<k2/k1<10$.

Referring to FIG. 4, FIG. 5, FIG. 8, FIG. 9A to FIG. 11, FIG. 15A to FIG. 16, and FIG. 18, some embodiments of the present disclosure provide a display substrate, including: a base substrate BS and a plurality of sub-pixels 100 on the base substrate BS, wherein the sub-pixels include a plurality of first sub-pixels 101 (R) and a plurality of second sub-pixels 102 (G), wherein the first sub-pixel 101 includes a first pixel circuit **100*a*1, the first pixel circuit 100*a*1 includes a first conductive element, the second sub-pixel 102 includes a second pixel circuit 100*a*2, the second pixel circuit 100*a*2 includes a second conductive element, the plurality of sub-pixels 100 are arranged along the first direction Y or along the second direction X, the first direction Y intersects with the second direction X; and a pixel definition layer PDL including a plurality of openings P0 configured to expose at least a part of the first electrodes E1, wherein the openings P0 are configured to define the light-emitting areas of the sub-pixels, the openings P0 include a first opening P01 corresponding to the first sub-pixel 101 and a second opening P02 corresponding to the second sub-pixel 102, the first opening P01 and the second opening P02 have different areas. The first sub-pixel 101 satisfies the following relationship: $\Delta U1=|U2-U1|<k1\times|X2-X1|/KW1$, where k1 is a coefficient, $0.009\leq k1<0.02$, and X1 is the minimum distance between the first edge CL1 of the first conductive element of the first sub-pixel 101 and the first edge KL1 of the opening P0 corresponding to the first sub-pixel 101 in the second direction X; X2 is the minimum distance between the second edge CL2 of the first conductive element of the first sub-pixel 101 and the second edge KL2 of the opening P0 corresponding to the first sub-pixel 101 in the second direction X, KW1 is the maximum size of the opening P0 corresponding to the first sub-pixel 101 in the second direction X, U1 is the coordinate distance between the chromaticity coordinate point at the first viewing angle and the chromaticity coordinate point at 0-degree viewing angle of the first sub-pixel 101, U2 is the coordinate distance between the chromaticity coordinate point at the second viewing angle and the chromaticity coordinate point at 0-degree viewing angle of the first sub-pixel 101, and ΔU1 is the absolute value of a difference between U2 and U1. The second sub-pixel 102 satisfies the following relationship: $\Delta U2=|U4-U3|<k2\times|X4-X3|/KW2$, where k2 is a coefficient, $0.004\leq k2\leq 0.02$, X3 is the minimum distance between the first edge CL1 of the second conductive element of the second sub-pixel 102 and the first edge KL1 of the opening P0 corresponding to the second sub-pixel 102 in the second direction X; X4 is the minimum distance between the second edge CL2 of the second conductive element of the second sub-pixel 102 and the second edge KL2 of the opening P0 corresponding to the second sub-pixel 102 in the second direction X; KW2 is the maximum size of the opening P0 corresponding to the second sub-pixel 102 in the second direction X; U3 is the coordinate distance between the chromaticity coordinate point at the first viewing angle and the chromaticity coordinate point at 0-degree viewing angle of the second sub-pixel 102, U4 is the coordinate distance between the chromaticity coordinate point at the second viewing angle and the chromaticity coordinate point at 0-degree viewing angle of the second sub-pixel 102**, and ΔU2 is the absolute value of a difference between U4 and U3; $0.1<k2/k1<10$.

For example, in some embodiments, $0.1<k2/k1<1$. For example, In some other embodiments, $1<k2/k1<10$. For example, In some other embodiments, $3<k2/k1<8$. For example, in some embodiments, $k2/k1=1$.

For example, the conductive elements mentioned above, the first conductive element corresponding to the first sub-pixel 101, and the second conductive element corresponding to the second sub-pixel 102 all refer to the second electrode plate 202 of the storage capacitor. Referring to FIG. 5, the insulating layer ISL1 refers to the planarization layer PLN, and the insulating layer ISL2 refers to the pixel definition layer PDL.

FIG. 4 shows that the pixel circuit **100*a* includes a first pixel circuit 100*a*1, a second pixel circuit 100*a*2, and a third pixel circuit 100*a*3**.

For example, the gate line G1 may be referred to as a first gate line, the gate line G2 may be referred to as a second gate line, the gate line G3 may be referred to as a third gate line, the reset transistor T2 may be referred to as a first reset transistor, and the reset transistor T4 may be referred to as a second reset transistor. In this case, the display substrate further includes: a data line, a first gate line, a second gate line, a third gate line, a first power line, a first initialization line, and a second initialization line, wherein the data line is configured to provide a data voltage to the pixel circuit, the first gate line is configured to provide a scan signal to the pixel circuit, the second gate line is configured to provide a first reset control signal to the pixel circuit, and the third gate line is configured to provide a second reset control signal to the pixel circuit, the first power line is configured to provide a first voltage signal to the pixel circuit, the first initialization line is configured to provide a first initialization signal to the pixel circuit, and the second initialization line is configured to provide a second initialization signal to the pixel circuit. The pixel circuit further includes a data writing transistor, a first reset transistor, and a second reset transistor, the first electrode of the data writing transistor is connected to the data line, the gate of the data writing transistor is connected to the first gate line, and the second electrode of the data writing transistor is connected to the gate of the driving transistor; the first electrode of the first reset transistor is connected to the first initialization line, the second electrode of the first reset transistor is connected to the gate of the driving transistor, and the gate of the first reset transistor is connected to the second gate line; the first electrode of the second reset transistor is connected to the second initialization line, the second electrode of the second reset transistor is connected to the first electrode of the light-emitting element, and the gate of the second reset transistor is connected to the third gate line; the first power line includes a first power signal line extending along the second direction and a first power connection line extending along the first direction, and the first power signal line is connected to the first power connection line; the first initialization line includes a first initialization signal line extending along the second direction and a first initialization connection line extending along the first direction, the first initialization signal line is connected to the first initialization connection line; the second initialization line includes a second initialization signal line extending along the second direction and a second initialization connection line extending along the first direction, the second initialization signal line is connected to the second initialization connection line; an orthographic projection of at least one of the first power connection line, the first initialization connection line, and the second initialization connection line on the base substrate is overlapped with an orthographic projection of an opening of the sub-pixel on the base substrate.

For example, the active semiconductor layer of each transistor may include a source region, a drain region, and a channel between the source region and the drain region. For example, the channel has semiconductor characteristics; the source region and the drain region are located at two sides of the channel and can be doped with impurities, so as to have conductivity and to be used as the first electrode and the second electrode of the transistor, respectively. One of the first electrode and the second electrode of the transistor is a source electrode, and the other one of the first electrode and the second electrode of the transistor is a drain electrode.

For example, the material of forming the semiconductor layer (semiconductor pattern) of the active semiconductor layer may include oxide semiconductor, organic semiconductor or amorphous silicon, polysilicon, etc., for example, the oxide semiconductor includes metal oxide semiconductor (such as indium gallium zinc oxide (IGZO)), the polysilicon includes low-temperature polysilicon or high-temperature polysilicon, etc., which are not limited in the embodiments of the present disclosure. It should be noted that the above-mentioned source region and drain region may be regions doped with n-type impurities or p-type impurities, which is not limited in the embodiments of the present disclosure.

For example, the base substrate BS, the buffer layer BL, the barrier layer BR, the gate insulating layer G1, the interlayer insulating layer ILD, the planarization layer PLN, and the pixel definition layer PDL are all made of insulating materials. For example, the base substrate BS includes flexible materials, such as polyimide, but it is not limited thereto. At least one of the buffer layer BF, the barrier layer BR, the gate insulating layer G1 and the interlayer insulating layer ILD is made of an inorganic insulating material or an organic insulating material. For example, inorganic insulating materials include silicon oxide, silicon nitride, silicon oxynitride, etc., and organic insulating materials include resins, but they are not limited thereto. For example, the pixel definition layer PDL and the planarization layer PLN can be made of organic materials, for example, the organic materials include resins, but are not limited thereto.

For example, both the first conductive pattern layer LY1 and the second conductive pattern layer LY2 are made of metal materials, and specific materials can be determined according to requirements. For example, the materials of the first conductive pattern layer LY1 all include molybdenum (Mo). The materials of the second conductive pattern layer LY2 include titanium (Ti) and aluminum (Al), and a three-layered stacked structure of Ti/Al/Ti can be used, but it is not limited thereto.

For example, the material of the first electrode E1 of the light-emitting element includes a conductive material, for example, including at least one of silver (Ag) and indium tin oxide (ITO), but it is not limited thereto. For example, the first electrode E1 of the light-emitting element is a three-layered stacked structure of ITO/Ag/ITO, but is not limited thereto.

In some other embodiments, the material of the first electrode E1 of the light-emitting element includes aluminum (Al) and tungsten oxide (WOx), for example, the first electrode E1 includes a stack of an aluminum layer and a tungsten oxide layer, and the aluminum layer is closer to the base substrate than the tungsten oxide layer.

For example, the material of the second electrode E2 of the light-emitting element includes a conductive material, for example, silver (Ag), but it is not limited thereto.

In the embodiments of the present disclosure, patterns and via holes of each single layer can be formed by a patterning process. For example, forming a specific pattern includes forming a film, forming a photoresist pattern on the film, and patterning the film by using the photoresist pattern as a mask to form the specific pattern. The first conductive pattern layer LY1, the second conductive pattern layer LY2, the first electrode layer LY3, the third conductive pattern layer LY4, and the via holes in the insulating layer can all be formed by this method. For the active semiconductor layer LY0, a semiconductor pattern can be formed firstly, an insulating layer is formed on the semiconductor pattern, a first conductive pattern layer LY1 is formed on the insulating layer, and the semiconductor pattern is doped by using the first conductive pattern layer LY1 as a mask to form the active semiconductor layer LY0 including a channel and source and drain regions at two sides of the channel.

It should be noted that the layout of the sub-pixels on the display panel provided by the embodiments of the present disclosure is not limited to that shown in FIG. 5, and can be varied on the basis of FIG. 5 to form other layout diagrams. The above is described with reference to the case where the sub-pixel includes a pixel circuit of 4T1C by way of example, but the embodiments of the present disclosure are not limited thereto. For example, each sub-pixel 101 may also include other numbers of transistors or other numbers of capacitors, and the pixel circuit operates under the control of the data signal transmitted through the data line, the gate scanning signal transmitted through the gate line, and the light emission control signal provided by the light emission control signal line, so as to drive the light-emitting elements to emit light to achieve display and other operations.

It should be noted that the embodiments of the present disclosure do not limit the amounts of thin film transistors and capacitors included in the pixel circuit.

Referring to FIG. 4 and FIG. 8, in the layout diagram of the display substrate provided by the embodiment of the present disclosure, the connection position of the connection electrode CEf and the first electrode plate 201 of the storage capacitor 20 is located at a corner of the first electrode plate 201, and the connection position of the connection electrode CEf and the first electrode plate 201 can be adjusted to other positions, so that the ratio of, the distance between the central axis (longitudinal central axis) of the connection electrode CEf extending along the first direction Y and the central axis (longitudinal central axis) of the opening of the pixel definition layer extending along the first direction Y, to the size of the opening of the pixel definition layer in the second direction X, is smaller than 0.3.

In some other embodiments, an opening may also be provided in the first electrode plate 201, so that the via hole V3 is located in the opening of the first electrode plate 201, and the opening arranged in the first electrode plate 201 facilitates the connection between the connection electrode CEf and the first electrode plate 201 of the storage capacitor 20.

The display substrate provided by the embodiments of the present disclosure may adopt other suitable layout diagrams, and the wiring manner is not limited to those shown in the diagram.

At least one embodiment of the present disclosure provides a display device, including any one of the above display substrates. The display device can be a large-sized display device, and at least one film layer in the light-emitting functional layer is produced by using an inkjet printing process.

For example, the display device may be an organic light-emitting diode display device. The display device can be any product or component with a display function, such as a TV, a digital camera, a mobile phone, a watch, a tablet computer, a notebook computer, a navigator, etc., which include an organic light-emitting diode display device.

The above are merely specific implementations of the present disclosure, but the scope of protection of the present disclosure is not limited thereto. Those skilled in the art can easily conceive of changes or substitutions within the technical scope of the present disclosure, which shall fall in the scope of the present disclosure. Therefore, the scope of protection of the present disclosure should be determined by the claims.

The invention claimed is:

1. A display substrate, comprising: a base substrate and a plurality of sub-pixels arranged on the base substrate, wherein the plurality of sub-pixels comprise a first sub-pixel, a second sub-pixel, and a third sub-pixel arranged in sequence along a second direction, and each of the plurality of sub-pixels comprises:

a pixel circuit comprising a storage capacitor, wherein the storage capacitor comprises a first electrode plate and a second electrode plate, the first electrode plate is closer to the base substrate than the second electrode plate; and a light-emitting element comprising a first electrode, a second electrode, and a light-emitting functional layer between the first electrode and the second electrode, wherein the pixel circuit is configured to drive the light-emitting element;

the display substrate further comprises a pixel definition layer, the plurality of sub-pixels comprise a plurality of openings each configured to expose at least a portion of the first electrode, each of the plurality of openings is configured to define a light-emitting area of the sub-pixel, wherein an orthographic projection of the opening on the base substrate is overlapped with an orthographic projection of the second electrode plate on the base substrate, the second electrode plate comprises a first edge extending along a first direction and a second edge extending along the first direction, and the opening comprises a first edge extending along the first direction and a second edge extending along the first direction, the first edge of the second electrode plate is closer to the first edge of the opening than the second edge of the second electrode plate, and the second edge of the second electrode plate is closer to the second edge of the opening than the first edge of the second electrode plate, the plurality of sub-pixels satisfy the following formula:

$$\Delta U = |U02 - U01| \leq k \times |Xb - Xa|/KW,$$

where k is a color cast influence coefficient, $0.009 \leq k \leq 0.03$, $\Delta U < 0.0020$, Xa is a minimum distance between the first edge of the second electrode plate and the first edge of the opening in the second direction, Xb is a minimum distance between the second edge of the second electrode plate and the second edge of the opening in the second direction, the first direction intersects with the second direction; KW is a maximum size of the opening in the second direction, and U01 is a coordinate distance between a chromaticity coordinate point at a first viewing angle and a chromaticity coordinate point at 0-degree viewing angle, U02 is a coordinate distance between a chromaticity coordinate point at a second viewing angle and the chromaticity coordinate point at 0-degree viewing angle, ΔU is an absolute value of a difference between U02 and U01, wherein the chromaticity coordinate point at 0-degree viewing angle is a chromaticity coordinate point at a normal line where a center of the display substrate is located, and the first viewing angle and the second viewing angle are respectively arranged at two opposite sides of the normal line and have a same included angle with respect to the normal line, the display substrate further comprises:

an insulating layer and a via hole penetrating the insulating layer, wherein in each of the plurality of sub-pixels, the first electrode of the light-emitting element is electrically connected to the pixel circuit through the via hole; and a signal line, configured to provide a signal to the pixel circuit, wherein the following formula is satisfied:

$$1/k = F1(CW/KW) - F2(DV/KW) + F3(DW/KW),$$

where F1 is a capacitance influence coefficient, F2 is a via hole offset influence coefficient, F3 is a signal line influence coefficient, CW is a maximum size of the second electrode plate of the storage capacitor in the second direction, CW/KW is a ratio of the storage capacitor to the opening, DV is a distance between a symmetry axis of the via hole extending along the first direction and a symmetry axis of the opening closest to the via hole, the symmetry axis of the opening extending along the first direction, DW is a line width of the signal line.

2. The display substrate according to claim 1, wherein a distance between a symmetry axis of the via hole extending along the first direction and a symmetry axis of the opening closest to the via hole is smaller than 8 microns, wherein the symmetry axis of the opening extends along the first direction, and a diameter of the via hole is 8-17 microns.

3. The display substrate according to claim 1, wherein the following formula is satisfied:

$1/T = k \times (CW - DV + DW)/KW$, 1/T is an influence coefficient of color cast alleviation, the first sub-pixel satisfies $1/T1 = k1 \times (CW - DV + DW)/KW$, the second sub-pixel satisfies $1/T2 = k2 \times (CW - DV + DW)/KW$, the third sub-pixel satisfies $1/T3 = k3 \times (CW - DV + DW)/KW$, wherein $1/T1 < 0.019$, $1/T2 < 0.019$, and $1/T3 < 0.019$.

4. The display substrate according to claim 3, wherein $$1/T1 < 0.009,\ 1/T2 < 0.014, \text{ and } 1/T3 < 0.019, \text{ or}$$

$$1/T1 < 0.008,\ 1/T2 < 0.003, \text{ and } 1/T3 < 0.016.$$

5. The display substrate according to claim 3, wherein $0.2 < Tx/Ty < 6$, where Tx is one of T1, T2, and T3, and Ty is one of T1, T2, and T3.

6. The display substrate according to claim 3, wherein the first sub-pixel satisfies $1/T11 = k11 \times (CW - DV + DW)/KW$ at an O viewing angle and a −O viewing angle;

the first sub-pixel satisfies $1/T12 = k12 \times (CW - DV + DW)/KW$ at a P viewing angle and a −P viewing angle;

$$1/T11 < 0.009,\ 1/T12 < 0.008.$$

7. The display substrate according to claim 6, wherein |1/T12−1/T11|<0.001.

8. The display substrate according to claim 3, wherein the second sub-pixel satisfies 1/T21=k21×(CW−DV+DW)/KW at an O viewing angle and a −O viewing angle;

the second sub-pixel satisfies 1/T22=k22×(CW−DV+DW)/KW at a P viewing angle and a −P viewing angle;

$$1/T21 < 0.014,\ 1/T22 < 0.004.$$

9. The display substrate according to claim 8, wherein |1/T22−1/T21|<0.010.

10. The display substrate according to claim 8, wherein 1/T21<0.009, 1/T22<0.003.

11. The display substrate according to claim 3, wherein the third sub-pixel satisfies 1/T31=k31×(CW−DV+DW)/KW at an O viewing angle and a −O viewing angle;

the third sub-pixel satisfies 1/T32=k32×(CW−DV+DW)/KW at a P viewing angle and a −P viewing angle;

$$1/T31 < 0.016,\ 1/T32 < 0.019.$$

12. The display substrate according to claim 11, wherein |1/T32−1/T31|<0.003.

13. The display substrate according to claim 11, wherein 1/T31<0.012, 1/T32<0.014.

14. The display substrate according to claim 1, further comprising: a data line, wherein the data line is configured to provide a data voltage to the pixel circuit, the signal line comprises a first signal line and a signal connection line, the first signal line extends along the second direction, the signal connection line extends along the first direction, the signal connection line is electrically connected to the first signal line, an orthographic projection of at least one of the signal connection line and the data line on the base substrate is overlapped with an orthographic projection of the opening of at least one sub-pixel of the plurality of sub-pixels on the base substrate and the signal connection line comprises at least one of a portion of a first power line extending along the first direction and a portion of an initialization line extending along the first direction.

15. The display substrate according to claim 14, wherein the signal line further comprises: a second signal line, wherein the second signal line is configured to provide a voltage signal to the pixel circuit, and the second signal line extends along the second direction, an orthographic projection of the second signal line on the base substrate is overlapped with the orthographic projection of the opening of at least one sub-pixel of the plurality of sub-pixels on the base substrate, and the second signal line comprises at least one of a portion of a gate line extending along the second direction and a portion of an initialization signal line extending along the second direction.

16. The display substrate according to claim 14, wherein the insulating layer comprises a passivation layer and a planarization layer, and wherein the following formula is satisfied:

$$1/k = T'(CW - DV + DW)/KW + e^{F4(DH/PH)},$$

where T' is a coefficient, and T' is greater than and equal to 20 and smaller than 70, F4 is a coefficient, and F4 is greater than 6 and smaller than 30, where DH is a thickness of the data line, and PH is a thickness of the planarization layer.

17. The display substrate according to claim 16, wherein the first sub-pixel satisfies $1/k1=T'(CW-DV+DW)/KW+e^{Fa(DH/PH)}$, the second sub-pixel satisfies $1/k2=T'(CW-DV+DW)/KW+e^{Fb(DH/PH)}$, the third sub-pixel satisfies $1/k3=T'(CW-DV+DW)/KW+e^{Fc(DH/PH)}$, $$20 \le T' \le 30,\ Fa < 27,\ Fb < 26,\ Fc < 23.$$

18. The display substrate according to claim 17, wherein at least one of the followings is satisfied:

$$T' = 20,\ 10 < Fa < 24;$$

$$T' = 20,\ 10 < Fb < 23; \text{ and}$$

$$T' = 20,\ 8 < Fc < 19.$$

19. The display substrate according to claim 16, wherein $$0.09 < DH/PH < 0.16,\ 20 \le T' \le 25, \text{ or}$$

$$0.17 < DH/PH < 0.38,\ 25 \le T' \le 30.$$

20. A display device, comprising the display substrate according to claim 1.

* * * * *